(12) United States Patent
Veloskey

(10) Patent No.: US 10,798,834 B2
(45) Date of Patent: Oct. 6, 2020

(54) COMMUNICATIONS INTERFACE SYSTEM FOR LANDSCAPE CONTROL SYSTEMS

(71) Applicant: Hunter Industries, Inc., San Marcos, CA (US)

(72) Inventor: Thomas E. Veloskey, San Marcos, CA (US)

(73) Assignee: Hunter Industries, Inc., San Marcos, CA (US)

( * ) Notice: Subject to any disclaimer, the term of this patent is extended or adjusted under 35 U.S.C. 154(b) by 0 days.

(21) Appl. No.: 16/504,171

(22) Filed: Jul. 5, 2019

(65) Prior Publication Data

US 2019/0335595 A1   Oct. 31, 2019

Related U.S. Application Data

(63) Continuation of application No. 16/025,939, filed on Jul. 2, 2018, now abandoned, which is a continuation of application No. 15/435,093, filed on Feb. 16, 2017, now Pat. No. 10,015,894, which is a continuation of application No. 14/471,929, filed on Aug. 28, 2014, now Pat. No. 9,577,415.

(51) Int. Cl.
| | |
|---|---|
| *H05K 7/00* | (2006.01) |
| *H05K 5/00* | (2006.01) |
| *H02G 3/14* | (2006.01) |
| *H02B 1/06* | (2006.01) |
| *H02G 3/10* | (2006.01) |
| *A01G 25/16* | (2006.01) |

(52) U.S. Cl.
CPC ........... *H05K 5/0026* (2013.01); *H02B 1/066* (2013.01); *H02G 3/14* (2013.01); *H05K 5/0017* (2013.01); *A01G 25/16* (2013.01); *H02G 3/10* (2013.01)

(58) Field of Classification Search
USPC ....... 361/747, 728–732, 752, 796, 800, 801, 361/803, 759; 174/100
See application file for complete search history.

(56) References Cited

U.S. PATENT DOCUMENTS

| | | |
|---|---|---|
| 4,704,604 A | 11/1987 | Fuhs |
| 5,444,611 A | 8/1995 | Woytowitz et al. |
| 5,862,468 A | 1/1999 | Kim |
| 5,868,316 A | 2/1999 | Scott |
| 5,956,248 A | 9/1999 | Williams et al. |
| 5,979,482 A | 11/1999 | Scott |
| 5,979,863 A | 11/1999 | Lousberg |
| 5,996,608 A | 12/1999 | Hunter et al. |
| 6,158,278 A | 12/2000 | Klinefelter |
| 6,164,645 A | 12/2000 | Weiss |
| 6,443,783 B1 | 9/2002 | Beadle |
| 6,497,592 B1 | 12/2002 | Beadle |
| 6,570,109 B2 | 5/2003 | Klinefelter et al. |

(Continued)

*Primary Examiner* — Hung S. Bui
(74) *Attorney, Agent, or Firm* — Knobbe Martens Olson & Bear, LLP

(57) ABSTRACT

A communications interface system includes a housing and one or more removable components. The removable components can include one or more removable communications module configured to facilitate communication between the interface system and one or more other communications or control systems. A facepack can be removably coupled with the housing. The facepack can include one or more displays and/or user input structures.

33 Claims, 72 Drawing Sheets

(56) References Cited

U.S. PATENT DOCUMENTS

| | | | |
|---|---|---|---|
| 6,625,425 B1 * | 9/2003 | Hughes | H01M 2/1066 455/351 |
| 6,682,161 B2 | 1/2004 | Yun | |
| 6,721,630 B1 | 4/2004 | Woytowitz | |
| 6,772,050 B2 | 8/2004 | Williams et al. | |
| 6,791,844 B2 | 9/2004 | Tobishima et al. | |
| 6,842,667 B2 | 1/2005 | Beutler et al. | |
| 6,977,351 B1 | 12/2005 | Woytowitz | |
| 7,069,115 B1 | 6/2006 | Woytowitz | |
| 7,181,319 B1 | 2/2007 | Woytowitz | |
| 7,225,057 B2 | 5/2007 | Froman et al. | |
| 7,225,058 B1 | 5/2007 | Porter | |
| 7,243,005 B1 | 7/2007 | Beutler et al. | |
| 7,245,991 B1 | 7/2007 | Woytowitz | |
| 7,248,945 B2 | 7/2007 | Woytowitz | |
| 7,257,465 B2 | 8/2007 | Perez et al. | |
| 7,267,613 B2 | 9/2007 | Cole | |
| 7,289,886 B1 | 10/2007 | Woytowitz | |
| 7,328,089 B2 | 2/2008 | Curren | |
| 7,387,572 B2 | 6/2008 | Hanchar | |
| 7,398,139 B1 | 7/2008 | Woytowitz | |
| 7,412,303 B1 | 8/2008 | Porter et al. | |
| D580,373 S | 11/2008 | Stange et al. | |
| 7,457,678 B2 | 11/2008 | Porter | |
| 7,457,687 B1 | 11/2008 | Porter | |
| D581,880 S | 12/2008 | Neitzel | |
| 7,503,346 B1 | 3/2009 | Clark | |
| D603,347 S | 11/2009 | Sacks | |
| 7,613,546 B2 | 11/2009 | Nelson | |
| 7,613,547 B1 | 11/2009 | Woytowitz et al. | |
| D607,759 S | 1/2010 | Woytowitz et al. | |
| D607,847 S | 1/2010 | Elliott et al. | |
| D608,301 S | 1/2010 | Clark | |
| 7,665,713 B1 | 2/2010 | Clark | |
| D612,813 S | 3/2010 | Paul | |
| D613,255 S | 4/2010 | Paul | |
| 7,762,627 B2 | 7/2010 | Chang | |
| D621,974 S | 8/2010 | Grajcar | |
| 7,772,726 B1 | 8/2010 | Porter et al. | |
| 7,806,382 B1 | 10/2010 | Palumbo et al. | |
| 7,844,367 B2 | 11/2010 | Nickerson et al. | |
| 7,891,370 B1 | 2/2011 | Stange | |
| 7,899,581 B1 | 3/2011 | Woytowitz | |
| 7,916,455 B2 | 3/2011 | Yoshida et al. | |
| D638,914 S | 5/2011 | Schmuckle | |
| 7,953,517 B1 | 5/2011 | Porter et al. | |
| D643,093 S | 8/2011 | Schmuckle et al. | |
| 8,014,904 B1 | 9/2011 | Woytowitz | |
| D653,219 S | 1/2012 | Woytowitz et al. | |
| 8,271,144 B2 | 9/2012 | Kah | |
| 8,275,309 B2 | 9/2012 | Woytowitz | |
| D668,231 S | 10/2012 | Paul et al. | |
| 8,278,845 B1 | 10/2012 | Woytowitz | |
| 8,297,314 B2 | 10/2012 | Clark et al. | |
| 8,371,325 B1 | 2/2013 | Grizzle | |
| D680,501 S | 4/2013 | Elliott et al. | |
| 8,498,099 B1 | 7/2013 | Schmuckle | |
| 8,509,683 B2 | 8/2013 | Woytowitz | |
| 8,534,867 B1 | 9/2013 | Beadle | |
| 8,600,569 B2 | 12/2013 | Woytowitz et al. | |
| 8,606,415 B1 | 12/2013 | Woytowitz et al. | |
| 8,660,705 B2 | 2/2014 | Woytowitz et al. | |
| 8,700,222 B1 | 4/2014 | Woytowitz et al. | |
| 8,710,770 B2 | 4/2014 | Woytowitz | |
| 8,793,024 B1 | 7/2014 | Woytowitz et al. | |
| 8,838,021 B2 | 9/2014 | Woytowitz | |
| 8,867,194 B2 | 10/2014 | Woytowitz et al. | |
| 8,924,032 B2 | 12/2014 | Woytowitz et al. | |
| 8,977,400 B1 | 3/2015 | Porter et al. | |
| 9,081,376 B2 | 7/2015 | Woytowitz | |
| 9,295,170 B1 | 3/2016 | Woytowitz et al. | |
| 9,301,461 B2 | 4/2016 | Woytowitz et al. | |
| 9,307,620 B2 | 4/2016 | Woytowitz | |
| 9,345,155 B1 | 5/2016 | Schmuckle | |
| 9,577,415 B1 | 2/2017 | Velosky | |
| 2001/0026264 A1 * | 10/2001 | Rosenberg | G06F 3/03545 345/156 |
| 2005/0055106 A1 | 3/2005 | Beutler et al. | |
| 2005/0231458 A1 | 10/2005 | Miki | |
| 2007/0156290 A1 | 7/2007 | Froman et al. | |
| 2007/0208462 A1 | 9/2007 | Kah | |
| 2008/0058964 A1 | 3/2008 | Nickerson et al. | |
| 2010/0030476 A1 | 2/2010 | Woytowitz et al. | |
| 2010/0084985 A1 | 4/2010 | Woytowitz | |
| 2011/0297757 A1 | 12/2011 | Schmuckle | |
| 2012/0274219 A1 | 11/2012 | Woytowitz et al. | |
| 2013/0116837 A1 | 5/2013 | Malaugh et al. | |
| 2013/0134891 A1 | 5/2013 | Woytowitz | |
| 2013/0249429 A1 | 9/2013 | Woytowitz et al. | |

* cited by examiner

COMMUNICATIONS INTERFACE SYSTEM FOR LANDSCAPE CONTROL SYSTEMS

CROSS-REFERENCE TO RELATED APPLICATION

This application is a continuation of U.S. application Ser. No. 16/025,939, filed Jul. 2, 2018, and entitled "COMMUNICATIONS INTERFACE SYSTEM FOR LANDSCAPE CONTROL SYSTEMS," which is a continuation of U.S. application Ser. No. 15/435,093, filed Feb. 16, 2017, and entitled "COMMUNICATIONS INTERFACE SYSTEM FOR LANDSCAPE CONTROL SYSTEMS," which is a continuation of U.S. application Ser. No. 14/471,929, filed Aug. 28, 2014, and entitled "COMMUNICATIONS INTERFACE SYSTEM FOR LANDSCAPE CONTROL SYSTEMS," which issued on Feb. 21, 2017 as U.S. Pat. No. 9,577,415. The entire contents of the above applications are hereby incorporated by reference and made a part of this specification. Any and all priority claims identified in the Application Data Sheet, or any correction thereto, are hereby incorporated by reference under 37 CFR 1.57.

BACKGROUND

Technical Field

The present disclosure relates to communications systems for landscape control systems. Landscape control systems can be used as part of irrigation systems and/or lighting systems, among other applications.

Description of the Related Art

Many parts of the world lack sufficient rainfall at different times of the year to maintain the health of turf and landscaping. Further, many venues utilize indoor and/or outdoor lighting systems requiring control systems. Some typical landscape control systems comprise programmable controllers that turn irrigation valves and/or light fixtures ON and OFF.

SUMMARY OF THE INVENTION

In accordance with the present disclosure, a communications module for a landscape control communications system can include a housing. The housing can include a first end, a second end, and a plurality of sides between the first end and the second end. The communications module can include a communication unit on or in the housing. The communication unit can be configured to send data to or receive data from an external data source. In some cases, the communications module includes a first locking member at a first side of the plurality of sides. The first locking member can be configured to releasably engage with a portion of a communications interface system. In some cases, the communications module includes a second locking member at a second side of the plurality of sides. The second locking member can have a released position and a locking position to connect the communications module to a communications interface system. In some embodiments, the second locking member is biased to the locking position. The communications module can include a release member positioned on the housing. The release member can be configured to transition the second locking member between the released position and the locking position. In some cases, the release member comprises a lever hingedly connected to a surface of the housing. The lever can be configured to transition the second locking member to the released configuration when the lever is rotated with respect to the housing.

In some embodiments, the communications module includes a circuit board within the housing. In some cases, the communications module includes a grounding member at the first side of the housing. The grounding member can be connected to the circuit board. In some cases the grounding member is a metallic plate extending from the first side of the housing between a top side of the housing and the first locking member. In some embodiments, the release member comprises a cam which moves the second locking member to the released position when the release member is rotated away from the housing. In some cases, the release member comprises a hinged connection end and a free end, wherein the free end is biased toward the housing. In some embodiments, the communications module includes an electrical connector on the base configured to releasably connect with an electrical connector in a communications interface system. In some cases, a portion of the second locking member extends out from the housing when the second locking member is in the locking position. In some embodiments, the second locking member comprises a bent portion, a locking arm extending from the bent portion, and a latch extending from the locking arm, wherein the latch protrudes from the housing when the second locking member is in the locking position and wherein the bent portion biases the latch toward the locking position.

According to some variants, a communications interface system for a landscape control system can include an outer housing having a housing volume. In some cases, the communications interface system has a removable communications module. The removable communications module can include a module housing having a first end, a second end, and a plurality of surfaces between the first end and the second end. In some cases, the removable communications module includes a communication unit on or in the housing and configured to send data to or receive data from an external data source. The removable communications module can include a latch mechanism configured to transition between a locking configuration and a released configuration, at least a portion of the latch mechanism extending from a surface of the module housing when the latch mechanism is in the locking configuration. In some embodiments, communications interface system includes a first retaining structure in the housing volume capable of releasably mating with the communications module. In some cases, the communications interface system has a second retaining structure spaced from the first retaining structure in the housing volume and capable of releasably mating with the latch mechanism.

In some embodiments, the communications interface system includes a lock wall separating a first portion of the housing volume from a second portion of the housing volume, wherein the second retaining structure comprises an aperture or indentation in the lock wall. In some cases, the communications interface system includes an electrical connector in the housing volume capable of releasably mating with an electrical connector on the communications module. In some cases, the communications interface system includes a second lock wall, wherein the first retaining structure comprises an aperture in the second lock wall. The communications module can include a protrusion extending from one of the surfaces of the module housing and configured to releasably couple with the aperture in the second lock wall. In some cases, communications interface system includes a grounding rod positioned on a side of the second lock wall opposite the first lock wall, the grounding rod contacting a grounding member of the communications module when the protrusion is coupled with the aperture in the second lock wall. The removable communications module can have a release lever capable of transitioning the latch mechanism between the locking configuration and the released configuration, wherein transitioning the latch mechanism to the released configuration when the latch mechanism is mated with the second retention structure un-mates the latch mechanism from the second retention structure. In some cases, the latch mechanism is biased to the locking configuration and the release lever includes a cam configured to transition the latch mechanism to the released configuration. In some embodiments, the communications interface system includes a lock wall separating a first portion of the housing volume from a second portion of the housing volume, wherein the second retaining structure comprises an aperture or indentation in the lock wall, wherein the release lever is hingedly attached to a top surface of the communications module, wherein rotation of the release lever away from the top of the communications module transitions the latch mechanism to the released state, wherein further rotation of the release lever away from the top of the communications module brings the release lever into contact with a shoulder of the lock wall, and wherein still further rotation of the release lever moves the second end of the communications module away from the lock wall.

According to some variants, a communications interface system for a landscape control system includes an outer housing having a housing volume. In some embodiments, the communications interface system includes a back plate mounted to the outer housing at least partially within the housing volume and comprising a first lock wall and a second lock wall. In some cases, the communications interface system includes a removable communications module. The removable communications module can include a module housing having a first end, a second end, and a plurality of surfaces between the first end and the second end. In some embodiments, the removable communications module includes a communication unit on or in the housing and configured to send data to or receive data from an external data source. In some cases, the removable communications module includes a latch mechanism. The communications interface system can include a first retaining structure on or in the first lock wall and capable of releasably mating with the communications module. In some cases, the communications interface system includes a second retaining structure on or in the second lock wall and capable of releasably mating with the latch mechanism.

In some embodiments, the communications module comprises a protrusion extending from a first surface of the plurality of surfaces of the module housing and configured to releasably mate with the first retaining structure. In some cases, the latch mechanism includes a latch which extends from a second surface of the plurality of surfaces of the module housing. In some embodiments, the communications module further comprises a circuit within the module housing and a grounding plate connected to the circuit. In some cases, the communications interface system includes a grounding rod positioned on a side of the first lock wall opposite the first lock wall, wherein the grounding plate contacts the grounding rod and is biased toward the grounding rod when the communications module is coupled with the back plate.

According to some variants, a retention structure for a landscaping control unit can include a coupling interface. The coupling interface can be positioned in a housing of the landscape control unit. In some embodiments, the coupling interface is configured to couple with the removable component. In some embodiments, the retention structure includes a coupling indicator. The coupling indicator can be positioned on a side of the coupling interface opposite the removable component when a removable component is coupled with the coupling interface. In some embodiments, the coupling indicator is capable of providing a visual signal to indicate complete coupling between the coupling interface and the removable component.

In some embodiments, the retention structure comprises an aperture or a slot. In some cases, the coupling indicator comprises an indicator arm. The indicator arm can have a free end and a fixed end attached to the housing. In some embodiments, the free end of the indicator arm is deflected away from the coupling interface when the coupling interface is coupled with the removable component. In some embodiments, the retention structure includes indicator window through a wall of the landscape control unit through which the indicator arm can be viewed from outside of the landscaping control unit. In some cases, the indicator arm includes at least one surface feature. The surface feature can be hidden from view through the indicator window from outside the landscaping control unit when the removable component is not fully coupled with the coupling interface. In some embodiments, the surface feature is viewable through the indicator window from outside of the landscaping control unit when the removable component is fully coupled with the coupling interface. In some cases, the at least one surface feature comprises a surface having a color different from a color of the surfaces of the indicator arm adjacent to the at least one surface feature. In some embodiments, the at least one surface feature is a light emitter. In some cases, the wall through which the indicator window is positioned is substantially parallel to a direction of deflection of the free end of the indicator arm when the free end is deflected away from a coupling surface when the coupling interface is coupled with the removal component. In some embodiments, the retention structure further comprises a lock wall in the housing. The coupling interface can be positioned on or in the lock wall.

According to some variants, a communications interface system for a landscape control system can include a housing. The housing can have a lock wall. In some embodiments, the communications interface system includes a removable component. The removable component can include a coupling structure capable of removably coupling with the lock wall. In some cases, the communications interface system includes a coupling indicator. The coupling indicator can be capable of providing a visual indicator when the removable component is completely coupled with the lock wall. In some embodiments, the coupling indicator comprises a resilient bar capable of deflecting away from the lock wall and the removable component is fully coupled with the lock wall.

In some cases, the communications interface system further includes an aperture in the lock wall. The removable component can include a latch configured to releasably engage with the aperture in the lock wall. In some cases, the latch extends into the aperture when the removable component is fully coupled with the lock wall. In some embodiments, the latch deflects the resilient bar of the coupling indicator away from the lock wall when a removable component is fully coupled with a lock wall. In some cases, the latch does not deflect the resilient bar of the coupling indicator away from the lock wall when the removable component is not fully coupled with the lock wall. In some embodiments, the coupling indicator includes a protrusion which extends at least partially into the aperture when the latch is not engaged with the aperture in the lock wall. In some cases, the coupling indicator is mechanical and does not require electrical input to indicate when the removable component is fully coupled with the lock wall. In some embodiments, the resilient bar includes a surface marking. The lock wall can include a window through which the surface marking can be observed from outside of the housing when a removable component is fully coupled with the lock wall. In some cases, the communications interface system further includes a housing electrical connection positioned at least partially within the housing. In some cases, the removable component includes an electrical connection configured to electrically connect with the housing electrical connection with the removable component is fully coupled with the lock wall. In some cases, the resilient bar includes a surface feature that is not visible from outside the housing unless the removable component is fully coupled with the lock wall.

According to some variants, a communications interface system for an irrigation control system can include a housing. In some cases, the communications interface system includes a back plate. The back plate can be connected to the housing. In some cases, the back plate has a lock wall. In some embodiments, the communications interface system can include a removable component. The removable component can include a couplet structure capable of removably coupling with the lock wall. In some cases, the communication interface system includes a coupling indicator. The coupling indicator can be capable of providing a visual indicator when the removable component is completely coupled with the lock wall. In some embodiments, the coupling indicator comprises a resilient bar capable of deflecting away from the removable component when the removable component is fully coupled with the lock wall.

In some cases, the resilient bar has a first end connected to one or more of the back plate in the housing. In some cases, the resilient bar has a second end positioned on a side of the lock wall opposite the removable component when the removable component is coupled with the lock wall. In some embodiments, the resilient bar includes a first bent portion between the first end and the second end. In some cases, a portion of the resilient bar between the first bent portion and the second end of the resilient bar is configured to deflect away from the removable component when a removable component is fully coupled with the lock wall. In some embodiments, the portion of the resilient bar between the first bend portion and the send end of the resilient bar is transverse to the lock wall. In some cases, the lock wall further comprises a window through which at least a portion of the resilient bar can be viewed from outside of the housing.

According to some variants, a facepack for a landscaping control unit can include a housing. The housing can have a first end and a second end. In some embodiments, the housing has an interior and a plurality of sides between the first end and the second end. In some cases, the facepack includes an electronic display on the front panel. The facepack can include at least one hinge pin. The at least one hinge pin can have a first end and a second end and can be positioned at least partially within the interior of the facepack. In some cases, the at least one hinge pin is capable of transitioning between an extended position and a retracted position. The at least one hinge pin can have a mating tip on the first end. The mating tip can have a polygonal cross section. In some cases, the mating tip extends out from the interior of the facepack when the at least one hinge pin is in the extended position. In some embodiments, the mating tip is configured to deflect into the interior of the facepack upon application of force upon the mating tip toward the interior of the facepack.

In some cases, the facepack further includes a biasing structure which biases the at least one hinge pin to the extended position. The biasing structure can be a spring. In some cases, the at least one hinge pin includes a slot through a length of the hinge pin between the mating tip and the second end of the at least one hinge pin. The slot can form a track along which the at least one hinge pin travels when transitioning between the extended position and the retracted position. In some cases, the at least one hinge pin includes a spring mounting post between the slot and the second end of the at least one hinge pin. In some embodiments, the facepack includes a retaining screw inserted into the slot. The biasing structure can be a spring with one end attached to the spring mounting post and the other end attached to the retaining screw. In some embodiments, the at least one hinge pin includes a lever between the mating tip and the second end of the at least one hinge pin. The lever can extend outward from the interior of the facepack. In some embodiments, application of force upon the lever in a direction away from the mating tip transitions the at least one hinge pin to the retracted position. In some embodiments, the mating tip has a square cross section. In some cases, the facepack includes an electrical connector on a back panel capable of electrically connecting with an electrical connector of a communications interface box.

According to some variants, a communications interface system for a landscape control system can include a housing defining a housing volume. The communications interface system can include a facepack. The facepack can be capable of removably and hingedly connecting to the housing. In some embodiments, the facepack has a first end and a second end. The facepack can include a plurality of sides between the first end and the second end. In some embodiments, the facepack includes a facepack body between the first end and the second end. In some cases, the facepack includes a facepack interior between the first end and the second end. The facepack can include an electronic display on a front side of the plurality of sides. In some embodiments, the facepack includes at least one hinge pin having a first end and a second end. The at least one hinge pin is positioned at least partially within the facepack interior. The at least one hinge pin can have a mating tip on the first end. The mating tip can be tapered toward the first end of the at least one hinge pin. In some embodiments, the mating tip has a polygonal cross section. The mating tip can extend out from the facepack interior from a side surface of the plurality of surfaces of the facepack. In some embodiments, the communications interface system includes at least one flange. The flange can be capable of releasably mating with the at least one hinge pin of the facepack. In some embodiments, the at least one flange comprises a recess having a polygonal cross section. The recess can be configured to releasably receive the mating tip of the at least one hinge pin.

In some embodiments, the facepack can rotate between a first stable position and a second stable position when the facepack is connected to the housing. In some cases, the facepack is rotationally stable in both the first stable position and the second stable position. In some embodiments, the communications system includes a housing electrical connection in the housing volume. The facepack can include an electrical connection on the back side of the plurality of sides. In some embodiments, the electrical connection of the facepack is configured to electrically connect to the housing electrical connection. In some embodiments, the electrical connection on the back side of the facepack is electrically connected to the housing electrical connection when the facepack is in the first stable position. In some cases, the electrical connection on the back side of the facepack is electrically disconnected from the electrical connection in the housing volume when the facepack is in the second stable position. In some cases, the recess of the at least one flange includes a plurality of tapered surfaces. In some embodiments, the mating tip of the at least one hinge pin includes a plurality of tapered surfaces meeting at a plurality of edges. The plurality of tapered surfaces of the mating tip can be configured to fit flush with the tapered surfaces of the recess when the facepack is in the first stable position and when the facepack is in the second stable position. In some cases, rotation of the facepack away from the first stable position or away from the second stable position brings the plurality of edges into contact with the plurality of tapered surfaces of the recess of the at least one flange. Contact between the plurality of edges in the plurality of tapered surfaces of the recess of the at least one flange can deflect the mating tip away from the recess. In some cases, the at least one flange comprises a tapered entry surface that deflects the mating tip toward the facepack interior as the facepack is transition into connection with the housing. In some embodiments, the at least one flange includes two protrusions extending from the tapered surface and spaced apart from each other. The two protrusions can inhibit misalignment between the mating tip and the recess as the facepack is transitioned into connection with the housing. In some embodiments, rotation of the facepack past the second stable position with respect to the first stable position brings the second end of the facepack into contact with the housing. In some cases, further rotation of the facepack pushes the mating tip away from the recess of the at least one flange in a direction perpendicular to an axis of rotation of the facepack.

According to some variants, a communications interface system for a landscape control system can include a housing defining housing volume. The communications interface system can include a back plate. The back plate can be connected to the housing. In some cases, the back plate is positioned at least partially within the housing volume. The back plate can include a retention structure configured to releasably mate with one or more removable components. In some cases, the communications interface system includes a facepack. The facepack can be capable of removably and hingedly connecting to the housing. The facepack can have a first end and a second end. In some embodiments, the facepack has a facepack body. The facepack body can have a plurality of sides between the first end and the second end. In some cases, the facepack has a facepack interior between the first end and the second end. In some embodiments, the facepack has at least one hinge pin. The at least one hinge pin can have a first end and a second end. In some embodiments, the at least one hinge pin is positioned at least partially within the facepack interior. The at least one hinge pin can have a mating tip on the first end. In some embodiments, the mating tip is tapered toward the first end of the at least one hinge pin. In some cases, the mating tip has a polygonal cross section. The mating tip can extend out from the facepack interior from a side surface of the plurality of surfaces of the facepack. In some embodiments, the communications interface system includes at least one recess configured to receive the mating tip of the at least one hinge pin. The at least one recess can have a polygonal cross section. In some cases, the facepack has a first stable position and a second stable position when the facepack is connected to the housing. The facepack can obstruct access to at least one of the retention structures of the back plate from outside the housing volume when the facepack is in the first stable position.

In some embodiments, the facepack can rotate between the first stable position and the second stable position when the facepack is connected to the housing. The facepack can be rotationally stable in both the first stable position and the second stable position. In some cases, the housing includes a substantially planar base. The second end of the facepack can be positioned away from the base with respect to the first end of the facepack when the facepack is in the second stable position. In some embodiments, the communications interface includes a housing electrical connection on one or more of the housing in the back plate. The facepack can include an electrical connection on the back side of a plurality of sides of the facepack body. The electrical connection can be configured to releasably electrically connect with the housing electrical connection. In some embodiments, the electrical connection on the back side of the facepack body is connected to the housing electrical connection when the facepack is in the first stable position. In some cases, the electrical connection on the back side of the facepack body is not connected to the housing electrical connection when the facepack is in the second stable position.

BRIEF DESCRIPTION OF THE DRAWINGS

These and other features, aspects, and advantages are described below with reference to the drawings, which are intended to illustrate but not to limit the inventions. In the drawings, like reference characters denote corresponding features consistently throughout similar embodiments.

DETAILED DESCRIPTION OF THE
PREFERRED EMBODIMENT

Overview

Figure 1:
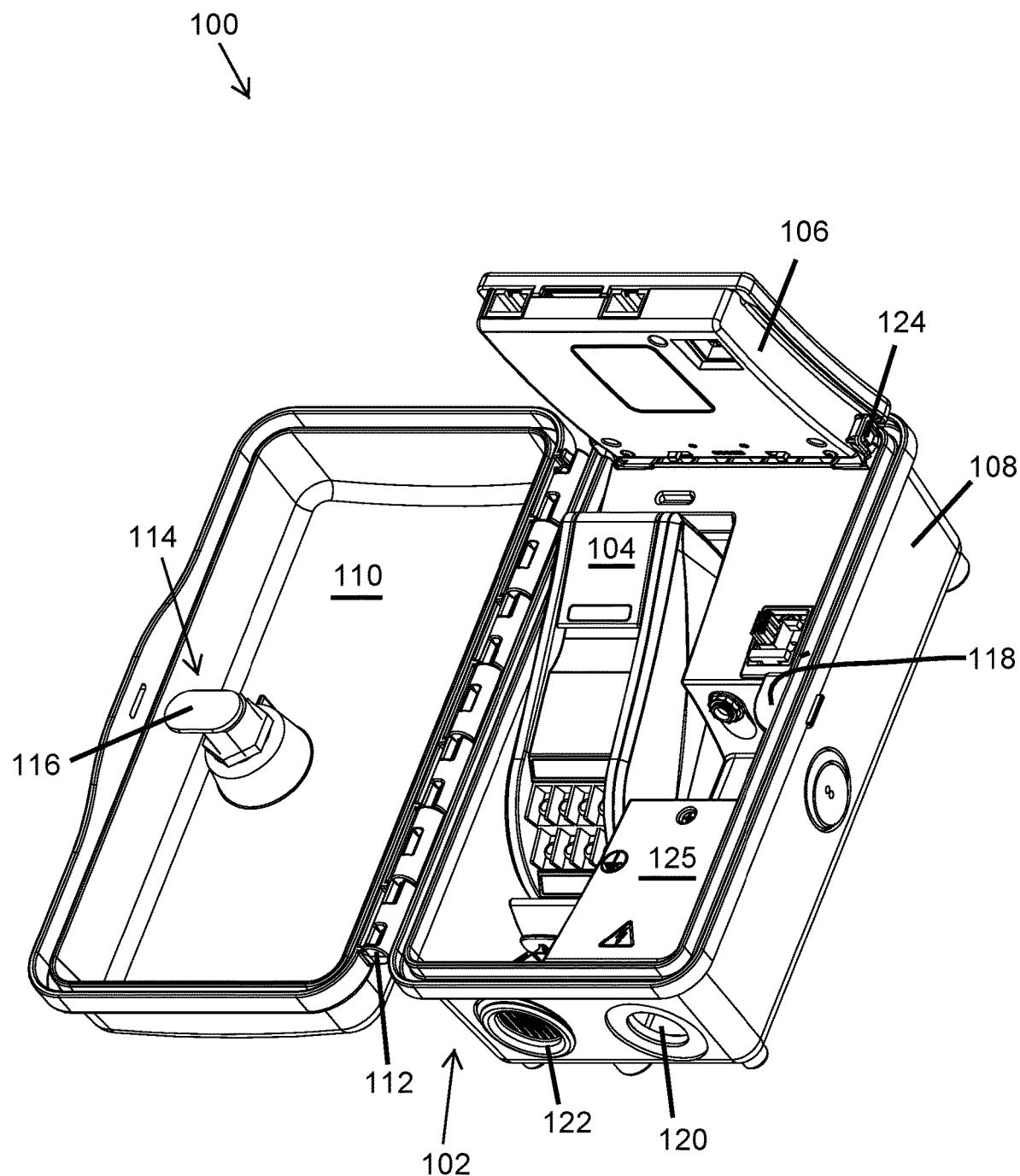
FIG. 1 illustrates a perspective view of an embodiment of a communications interface system with the facepack in a second stable position.
Figure 1A:
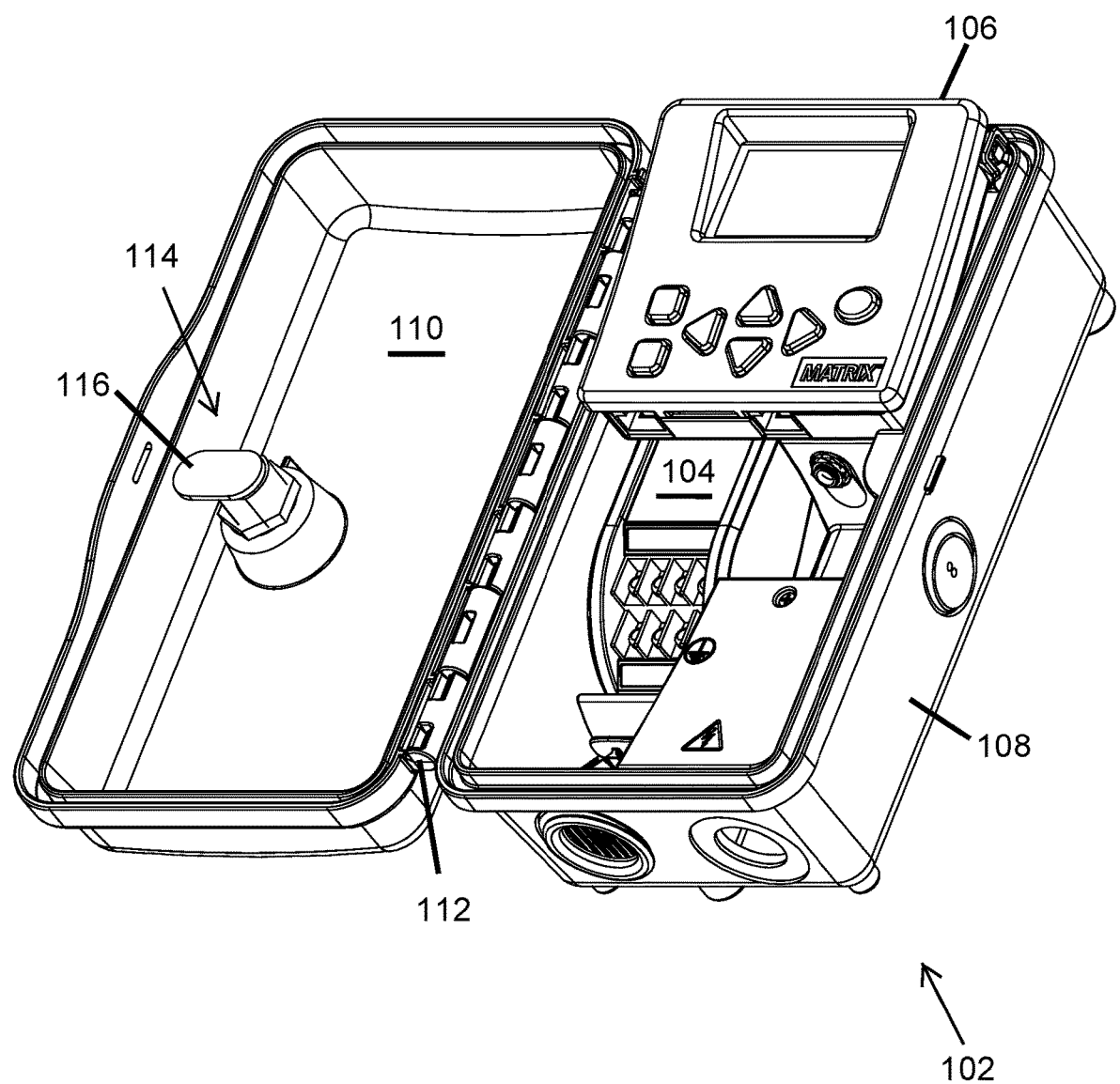
FIG. 1A illustrates a perspective view of the embodiment of FIG. 1 with the facepack in a first stable position.
Figure 1B:
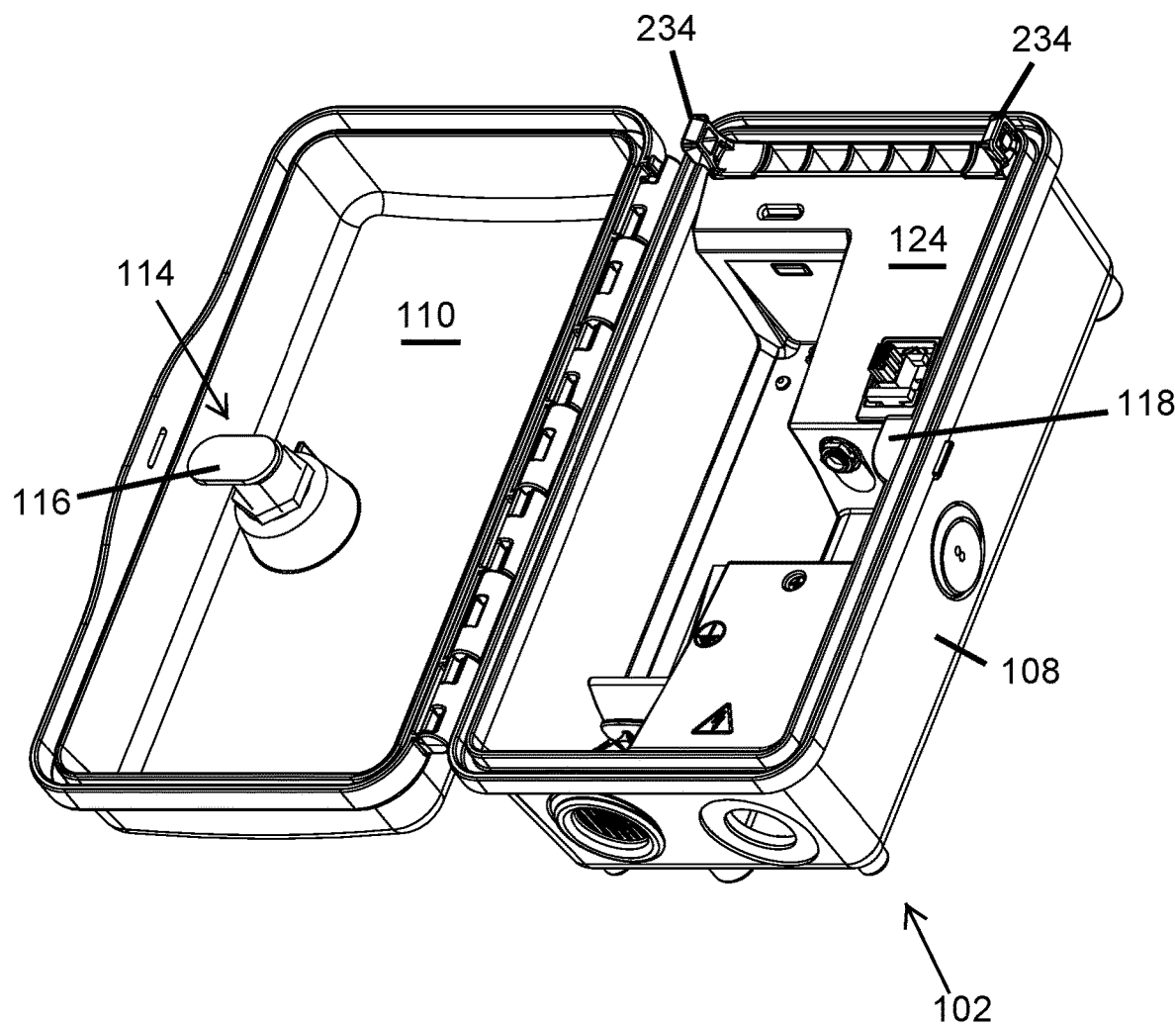
FIG. 1B illustrates a perspective view of the embodiment of FIG. 1 with the facepack and communication module removed.
Figure 1C:
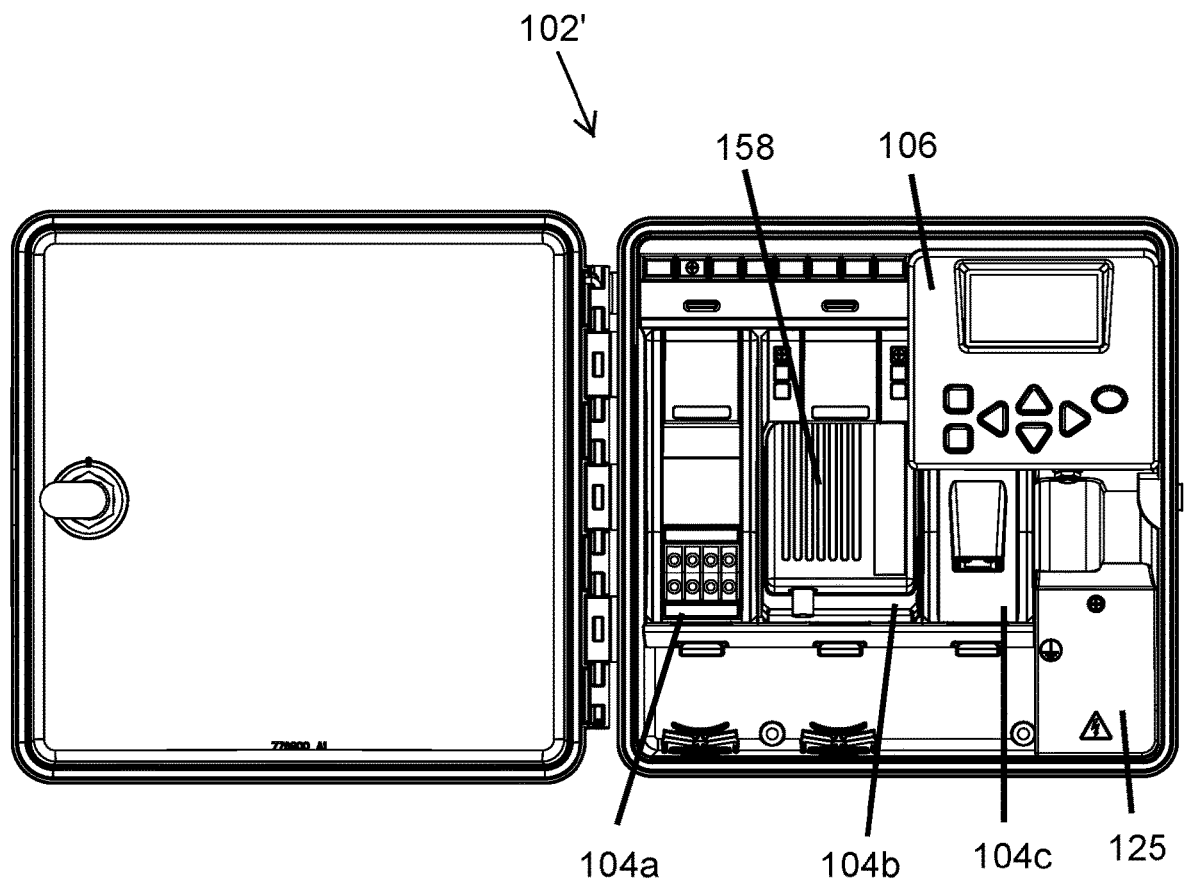
FIG. 1C illustrates a top plan view of another embodiment of a communications interface system.

In some cases, a landscape control system (e.g., a system for controlling irrigation and/or lighting) includes one or more communications interface systems 100. As illustrated in FIG. 1, the communications interface system 100 can include an enclosure or housing 102. The housing 102 can be weather resistant and/or weather impermeable. In some embodiments, the communications interface system 100 includes one or more removable components. For example, the communications interface system 100 can include one or more removable communications modules 104 and/or one or more facepacks 106. The communications modules 104 and facepacks 106 can be configured to removably couple with the housing 102. The housing 102 can be sized and/or shaped to receive one or more communications modules 104 and facepacks 106. For example, as illustrated in FIG. 1C, the housing 102' of the communications interface system 100' can include a plurality of communications modules 104 and/or other removable components. The widths of each of the plurality of removable components can be the same or variable.

Returning to FIG. 1, in some embodiments, the housing 102 includes a base 108. The base 108 can be attached to a lid 110 via, for example, a hinge 112 or other attachment structure. In some embodiments, the housing 102 includes one or more locks 114. The lock 114 can include a rotating arm 116. The housing 102 can include a locking flange 118 configured to interfere with the rotating arm 116 when the lock 114 is set to a locked position.

The housing 102 (e.g., the base 108 and/or the lid 110) can include one or more apertures 120 through one or more walls of the housing 102. The apertures 120 can be sized and/or shaped to permit passage of wires or other structures through the walls of the housing 102. In some embodiments, the housing 102 includes one or more plugs 122 positioned in apertures 120. The plugs 122 can be configured to releasably engage with the apertures 120 to close and/or seal the apertures 120. The plugs 122 are preferably of the type disclosed in U.S. patent application Ser. No. 14/264,511, filed on Apr. 29, 2014, and entitled PLUGGING DEVICE, the entire disclosure of which is hereby incorporated by reference and made part of the present disclosure.

Figure 2:
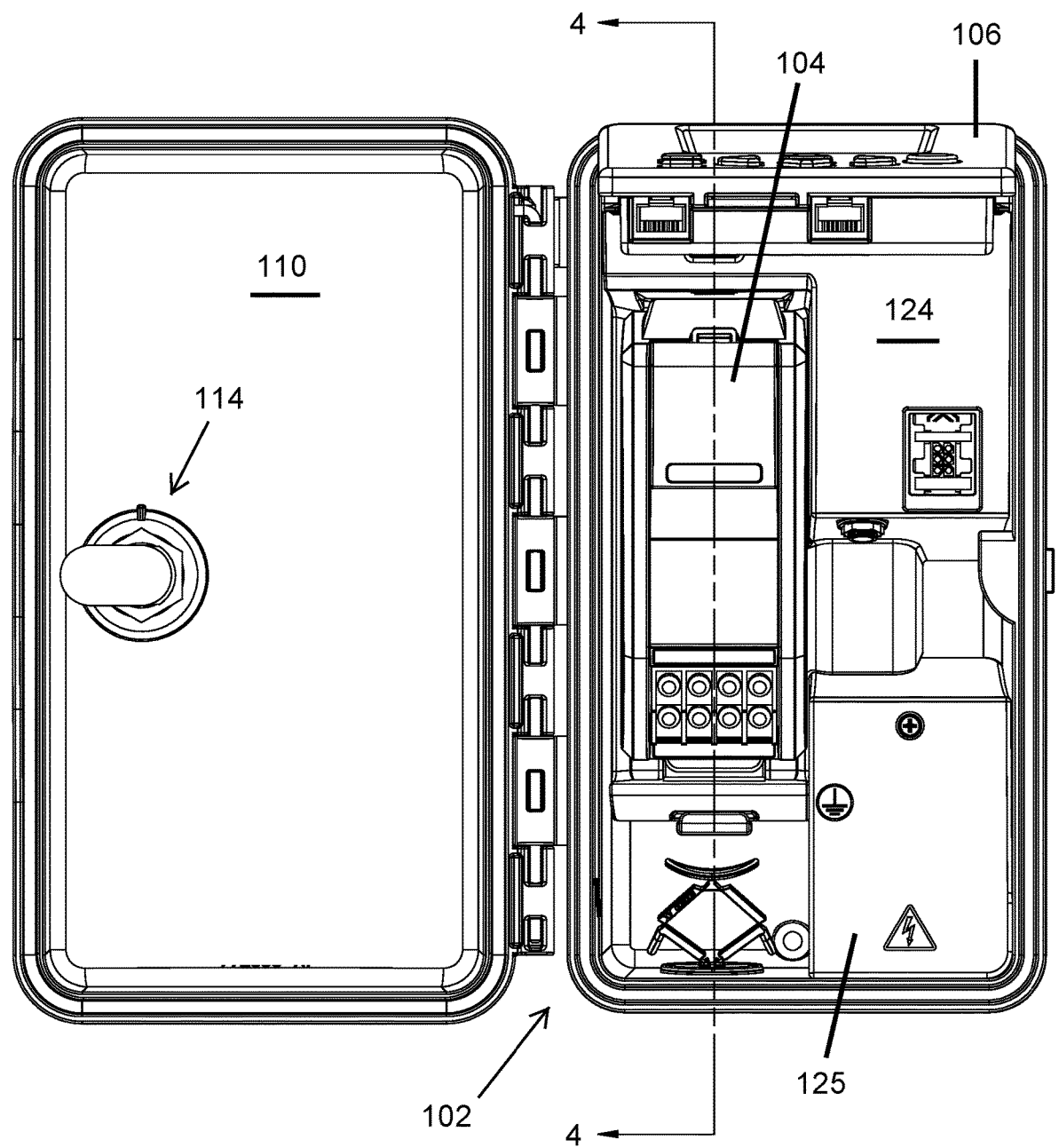
FIG. 2 is a top plan view of the system of FIG. 1.

In some cases, as illustrated in FIGS. 1-3, the housing 102 can include a back plate 124 attached to and positioned at least partially within the housing 102. In some embodiments, the back plate 124 is releasably attached to the housing 102 via one or more tabs, clips, detents, or other connecting structures. The housing 102 and/or the back plate 124 can include one or more retention structures. The retention structures can be configured to facilitate fixed or removable coupling between the housing 102 and the one or more removable components. For example, as discussed below, the back plate 124 or the housing 102 can include one or more indentations, apertures, or other structural features configured to releasably engage with portions of the one or more removable components.

Communications Modules

Figure 3A:
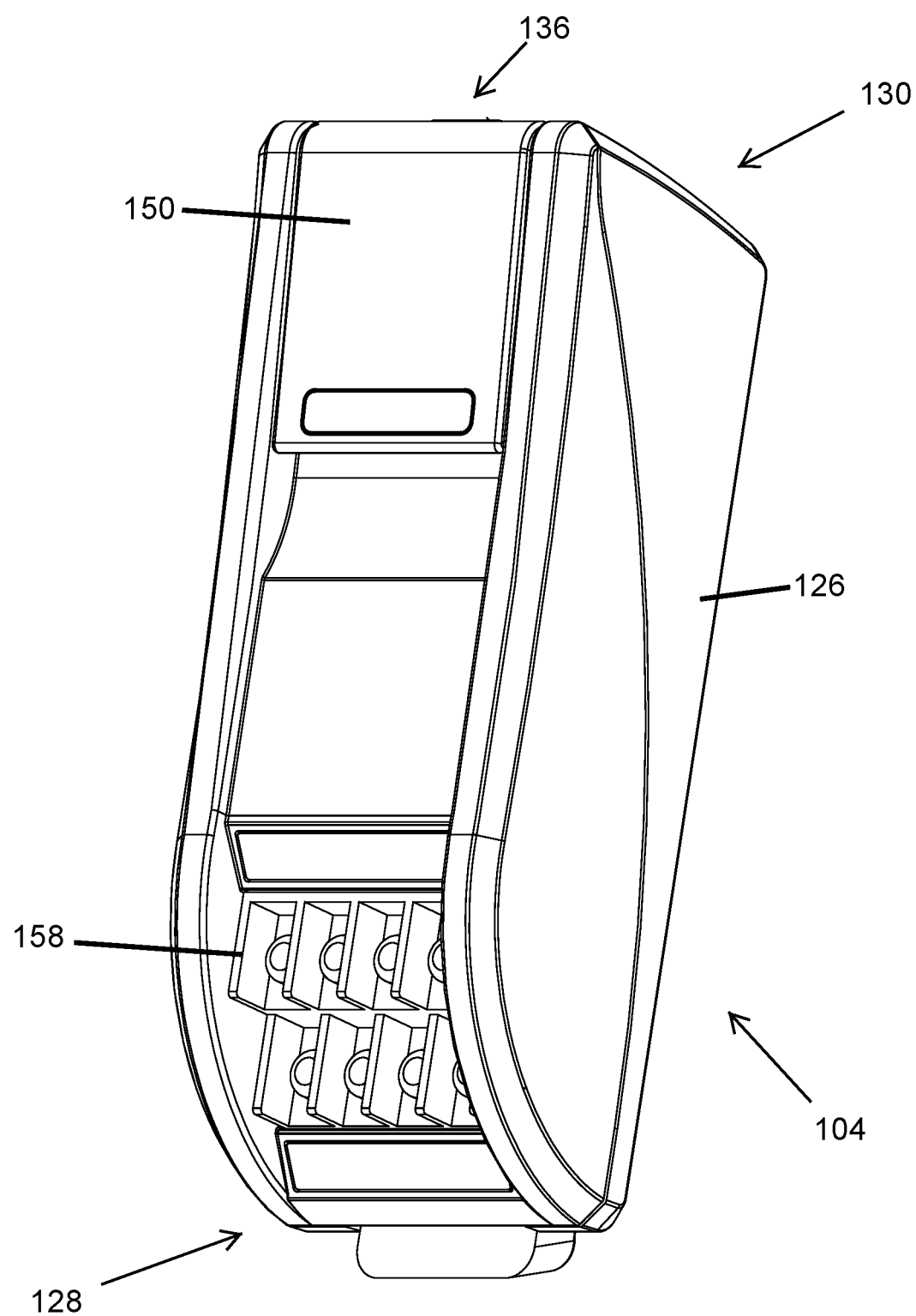
FIG. 3A is a perspective view of an embodiment of a communications module of FIG. 1

As discussed above, the communications interface system 100 can include one or more communications modules 104. Each of the communications modules 104 can be configured to releasably couple with the housing 102 and/or the back plate 124. As illustrated in FIG. 3A, the one or more communications modules 104 can include a module housing 126. The module housing 126 can have a first end 128 and a second end 130. The communications module 104 can include a communications unit 158 positioned on or in the housing 126 of the communications module 104. The communications unit 158 can be, for example, a cellular communications unit (domestic and/or international), an Ethernet communications unit, a phone modem unit, a hardwire interface unit, a UHF radio communication unit, a 900 MHz spread spectrum radio communications unit, an 868 MHz spread spectrum radio communications unit, and/or some other communications unit. The communications unit 158 may be a commercially available unit wherein the communications unit 158 is mounted to the communications module 104. For example, the communications unit 158 can be a UHF radio unit, as shown in communications module 104b. Alternatively, the communications circuitry may be constructed on the circuit board 170 of module 104, (see, e.g., FIG. 3B).

Figure 3B:
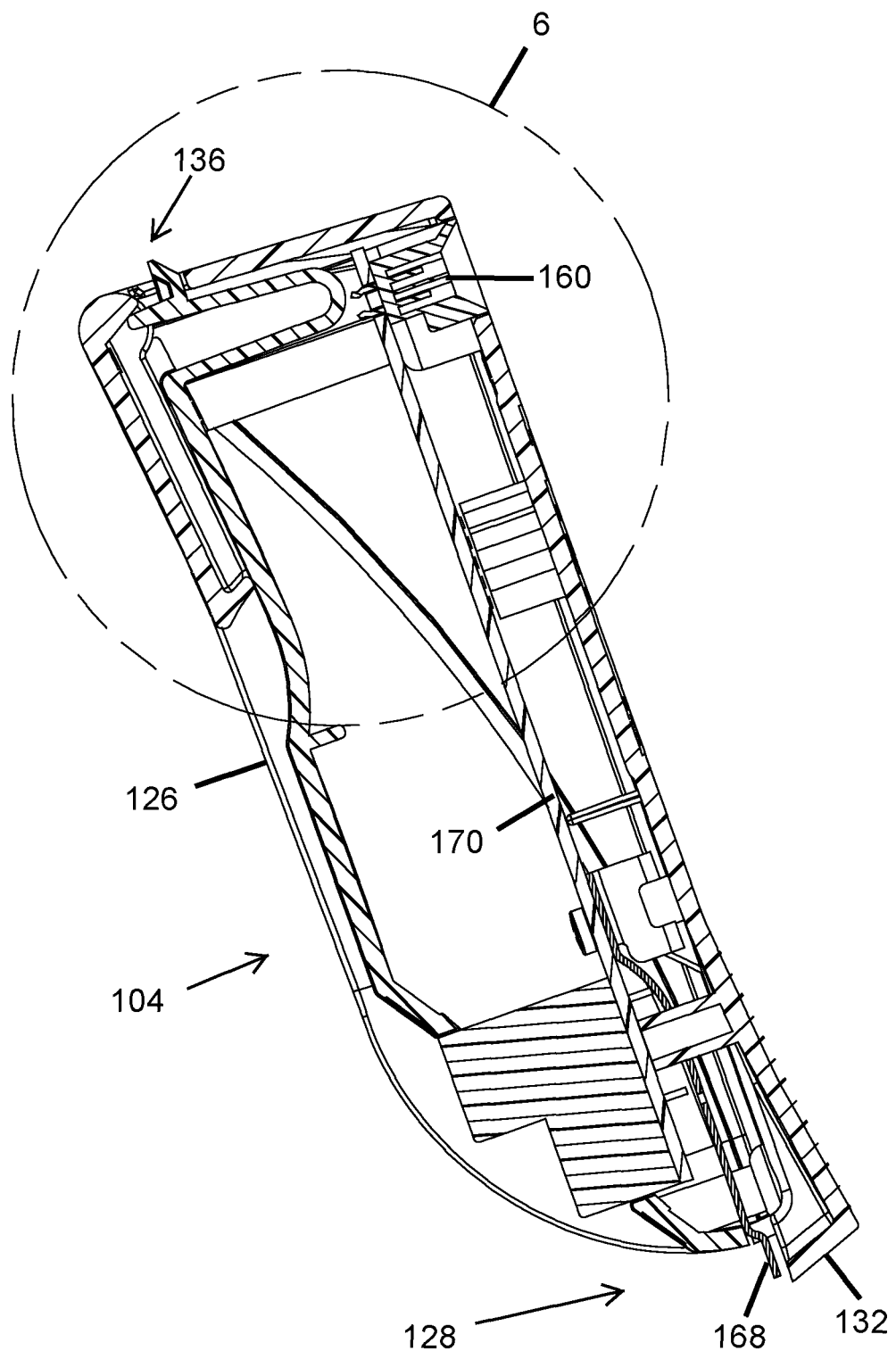
FIG. 3B is a cross-sectional view of the communications module of FIG. 1, taken along the cut plane 4-4 of FIG. 2.

As illustrated in FIG. 3B, the communications module 104 can include one or more module electrical connectors 160. The one or more module electrical connectors 160 can be configured to releasably electronically couple with one or more electrical connectors 162 in the housing 102 and/or on the back plate 124.

One or more locking members can be positioned on or in the housing 126 of the communications module 104. The locking members can be configured to help maintain the communications module 104 in position within the housing 102 when the communications module 104 is mated with the housing 102. In some embodiments, one or more of the locking members can comprise a protrusion or other surface structure on the module housing 126. For example, as illustrated in FIG. 3B, the communications module 104 can include a protrusion 132 on the first end 128 of the module housing 126. The protrusion 132 can be sized and/or shaped to interface with a retention structure (e.g., an aperture 134 in the back plate 124) of the back plate 124 and/or of the housing 102 when the communications module 104 is coupled with the back plate 124 or with the housing 102.

In some embodiments, the communications module 104 includes a latch mechanism 136. The latch mechanism 136 can be used to releasably connect the communications module 104 to a portion of the housing 102. In some embodiments, the latch mechanism 136 is positioned at or near the second end 130 of the module housing 126.

Figure 4:
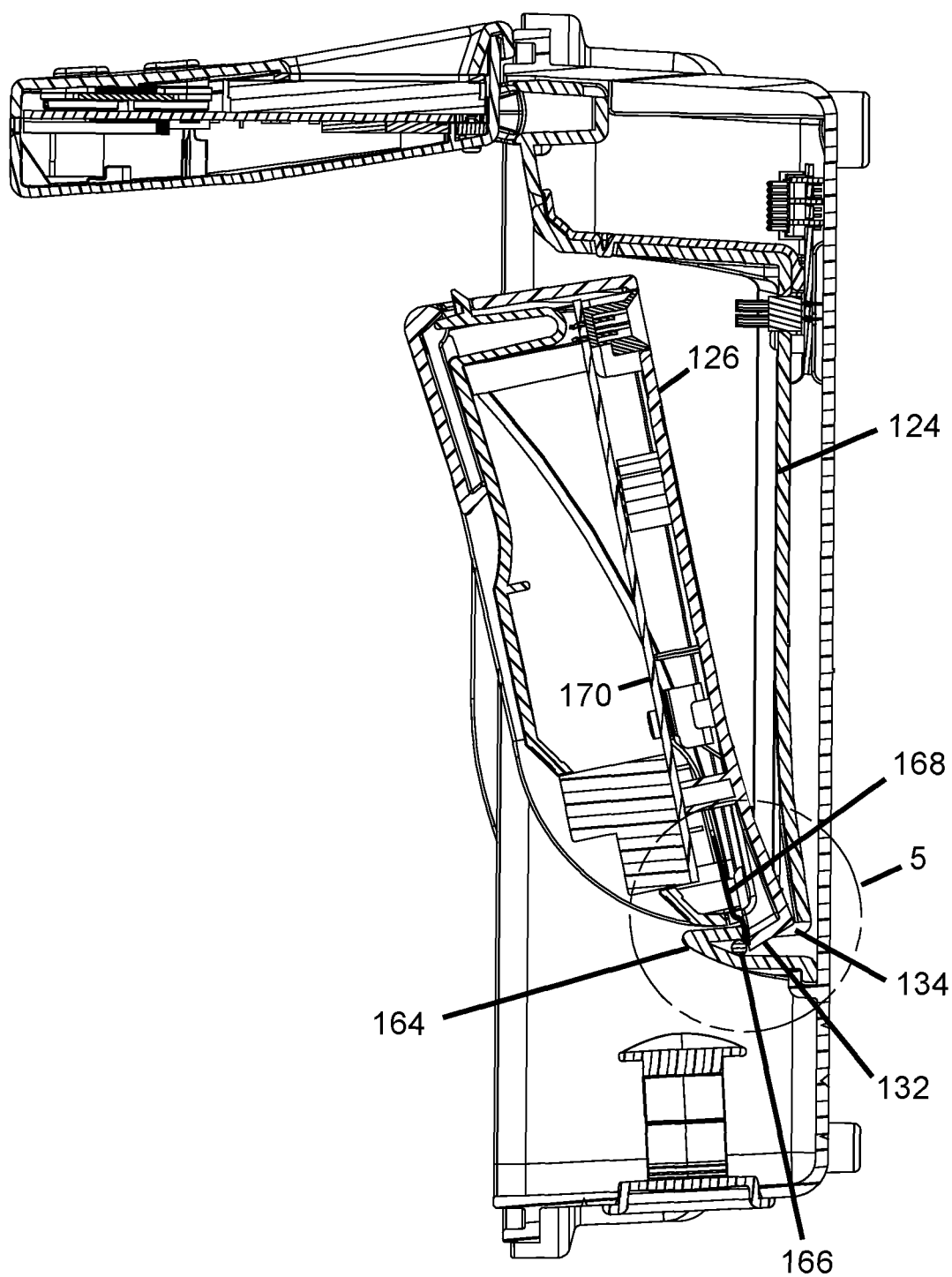
FIG. 4 is a cross-sectional view of the system of FIG. 1, taken along the cut plane 4-4 of FIG. 2, wherein communications module is partially mated with another portion of the system.

As illustrated in FIG. 4, the back plate 124 can include a first lock wall 164. The first lock wall 164 can include a retention feature. For example, the first lock wall 164 can include the aperture 134 or some other aperture, slot, indentation, detent, or other retention feature. The aperture 134 can be sized and shaped to releasably couple with a locking member (e.g., the protrusion 132) of the communications module 104.

In some embodiments, the communications interface system 100 includes a grounding member. For example, the housing 102 and/or the back plate 124 can include a grounding rod 166. The grounding rod 166 can be positioned on a side of the first lock wall 164 opposite the communications module 104 when the communications module 104 is coupled with the back plate 124 and/or with the housing 102. In some embodiments, the grounding rod 166 is conductively connected to a ground post (not shown) positioned adjacent to or behind the back plate 124 and/or behind the power hook up cover 125 (FIGS. 1-2).

Figure 5:
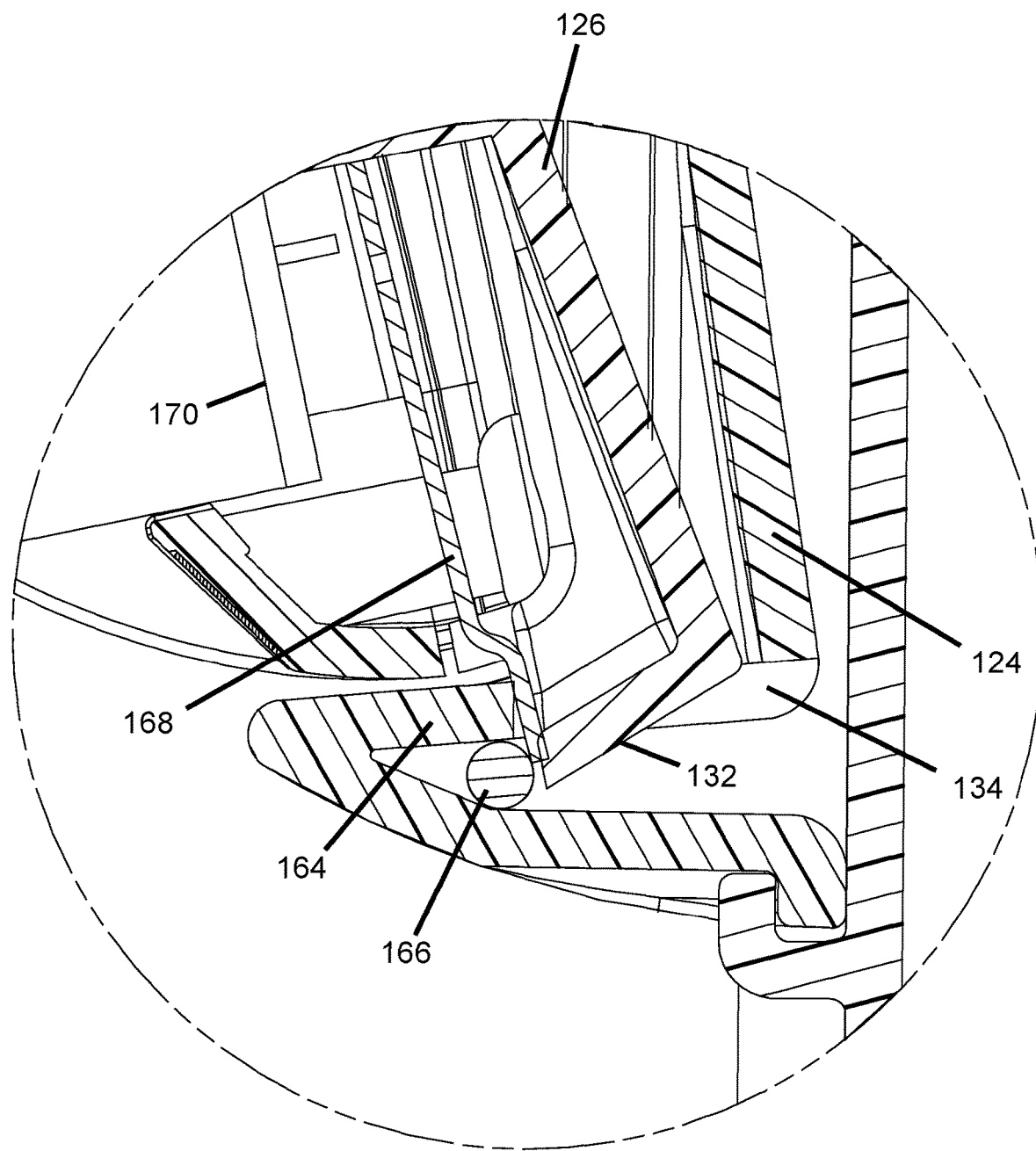
FIG. 5 is a cross-sectional view of the system of FIG. 1, taken in the window 5 of FIG. 4, wherein communications module is partially mated with another portion of the system.

As illustrated in FIGS. 4 and 5, the communications module 104 can include a grounding member. The grounding member can be a plate (e.g., the grounding plate 168). The grounding plate 168 can be constructed from a conductive and/or resilient material (e.g., a metal). In some embodiments, the grounding plate 168 is conductively connected to a circuit board 170 in or on the module housing 126. The grounding plate 168 can be formed as a conductive leaf spring that, as illustrated in FIG. 3B, is spaced from the protrusion 132 on the first end 128 of the module housing 126 when the communication module 104 is separated from the housing 102. Spacing the grounding plate 168 from the protrusion 132 can bias the grounding plate 168 away from the protrusion 132 when the protrusion 132 is inserted into the aperture 134. Biasing the grounding plate 168 away from the protrusion 132 can reduce the likelihood that the grounding plate 168 inadvertently disconnects from grounding rod 166 when the communications module 104 is coupled with the housing 102 and/or with the back plate 124. In some cases, the grounding plate 168 is positioned to contact the grounding rod 166 when the communications module 104 is in the intermediate coupling position illustrated in FIG. 4 (e.g., after the protrusion 132 is inserted into the aperture 134, but before the electrical connector 160 of the module housing 126 is connected to the electrical connector 162 of the housing 102 and/or of the back plate 124). In some such embodiments, the likelihood of ungrounded electrical connection between the communications module 104 and the housing 102 can be reduced or eliminated.

Figure 5A:
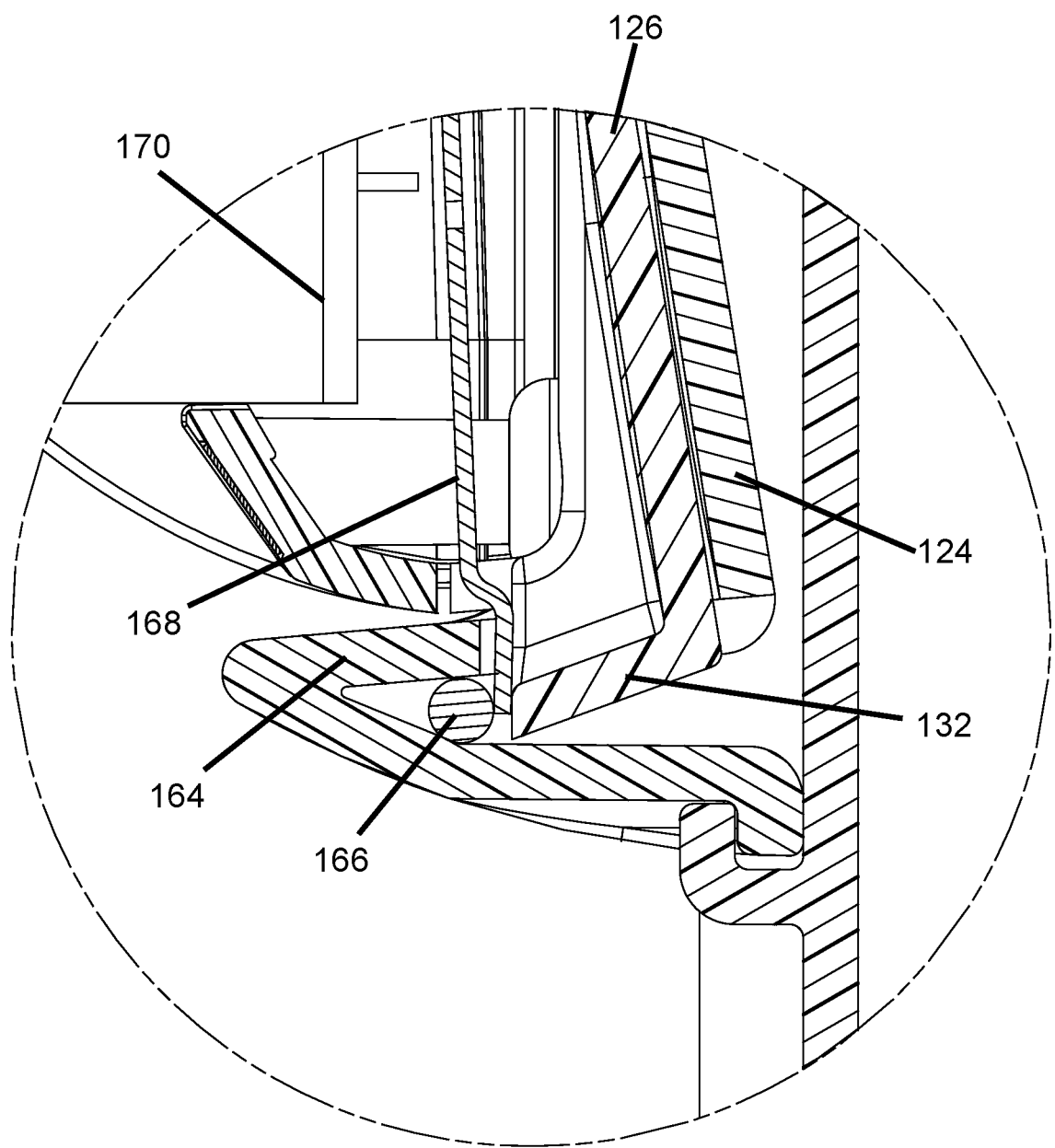
FIG. 5A is a close-up cross-sectional view of the system of FIG. 1, taken in the window 5 of FIG. 4 wherein the communications module is fully mated with another portion of the system.

In some embodiments, biasing the grounding plate 168 away from the protrusion 132 can help to secure the communications module 104 within the housing 102. For example, the bias of the grounding plate 168 can increase friction between the communications module 104 and the housing 102 and/or back plate 124 as illustrated in FIG. 5A. In some embodiments, the grounding plate 168 functions to increase friction between the communications module 104 and the housing 102/back plate 124 without grounding any portion of the communications module 104. For example, the grounding plate 168 can be non-conductive (e.g., constructed from an insulator or other non-conductive material or material having a low electrical conductivity). In some cases, the grounding rod 166 can be positioned such that it does not contact the grounding plate 168.

Figure 6:
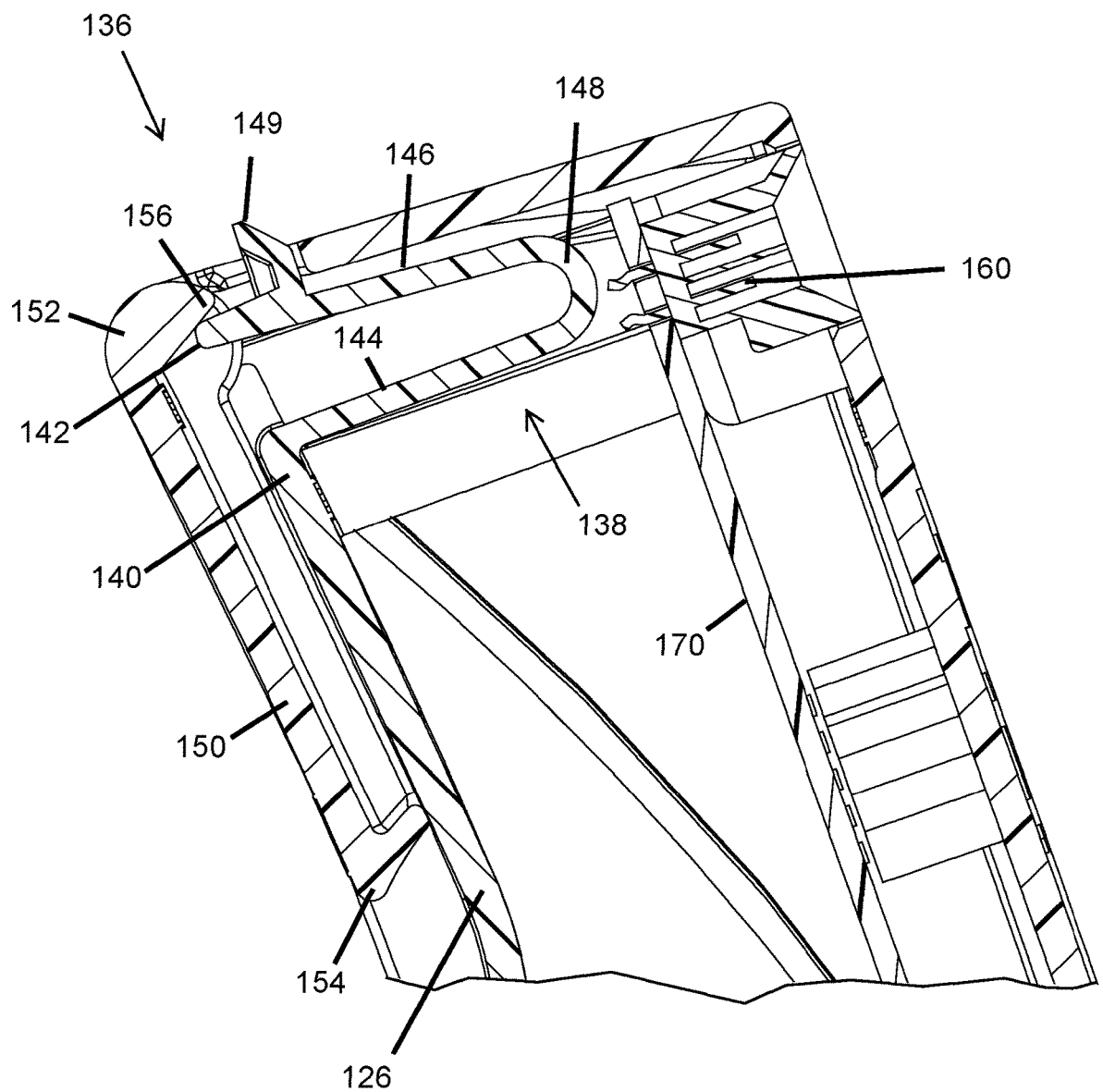
FIG. 6 is a close-up cross-sectional view of the system of FIG. 1, taken in the window 6 of FIG. 3B.

As illustrated in FIG. 6, the latch mechanism 136 can include a latch arm 138. The latch arm 138 can have a fixed end 140 (e.g., with respect to the module housing 126) and a free or mobile end 142. In some embodiments, the latch arm 138 is integral with a portion of the module housing 126. In some cases, the latch arm 138 is attached to a portion of the module housing 126. The latch arm 138 can include a first arm portion 144 extending from the fixed end 140 and a second arm portion 146 connected to the first arm portion 144 via a bend 148. In some cases, the second arm portion 146 may be flexible. In some cases, the bend 148 may be flexible. In some embodiments, the free end 142 of the latch arm 138 is biased away from the fixed end 140 when the latch mechanism 136 is installed on or in the communications module 104. For example, the latch arm 138 can be housed at least partially within the module housing 126 in a compressed state such that the second arm portion 146 is bent toward the first arm portion 144 about the bend 148. In some cases, one or more structural components of the communications module 104 interfere with movement of the free end 142 and/or of the second arm portion 146 away from the fixed end 140 when the latch arm 138 is housed in the module housing 126. The latch arm 138 (e.g., the second arm portion 146) can include a latch protrusion 149. The latch protrusion 149 can extend outward from the module housing 126 when the latch mechanism 136 is in a locked position, as illustrated in FIG. 6. In some embodiments, as discussed below, the latch protrusion 149 releasably engages with a retention structure of the housing 102 and/or of the back plate 124 when the communications module 104 is coupled with the housing 102.

Figure 9:
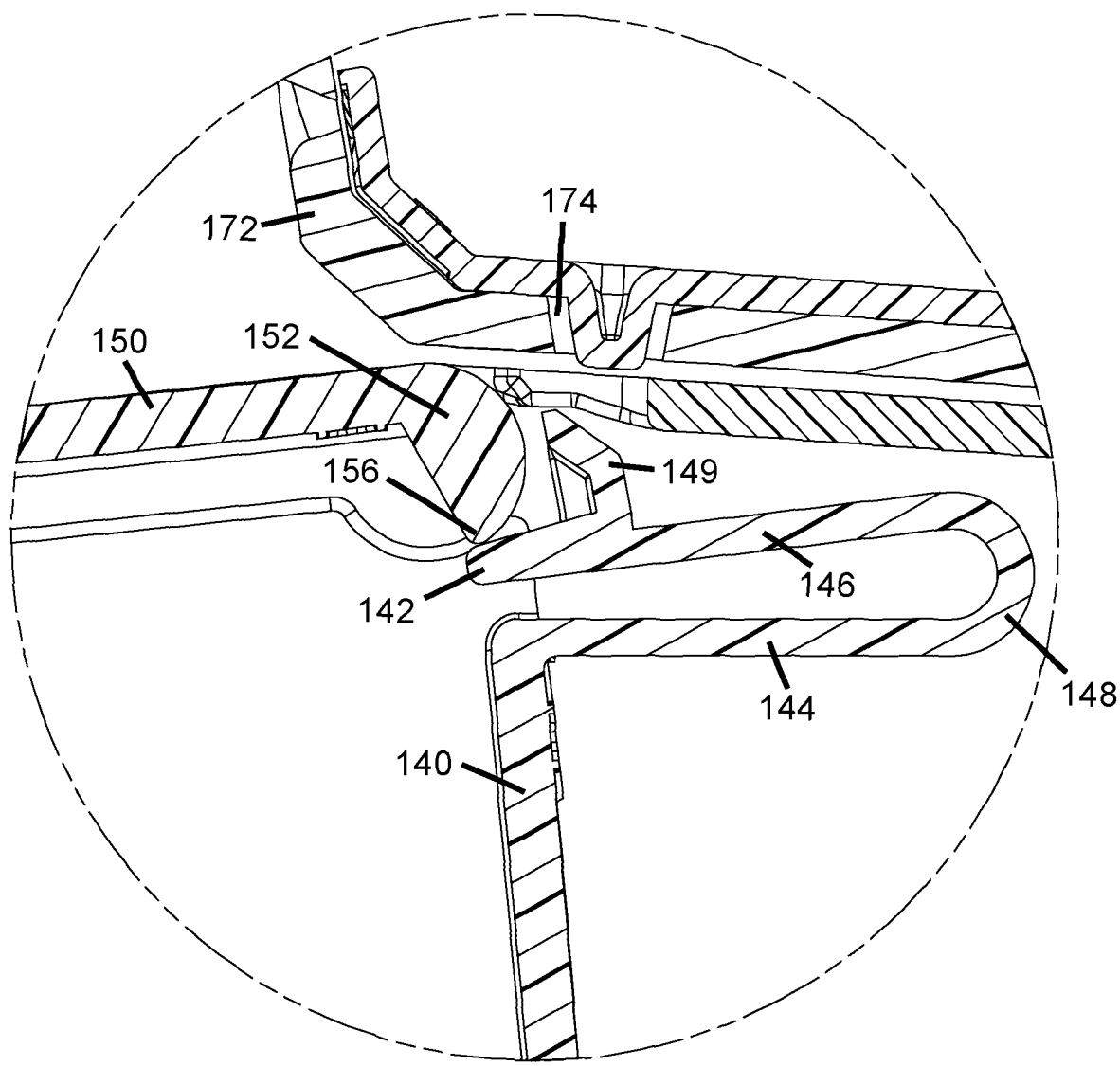
FIG. 9 is a close-up cross-sectional view of the release mechanism of FIG. 8, wherein a lever of the release mechanism is rotated to a second position.

In some embodiments, the communications module 104 includes one or more release members. The one or more release members can be used to release the communications module 104 form the housing 102. In some cases, the one or more release members can be configured to transition one or more of the locking members between a locked configuration and a released configuration. For example, the communications module 104 can include a lever 150 configured to transition the latch mechanism 136 between a locking position (e.g., as seen in FIGS. 3A, 3B, and 6) and a released position (e.g., as seen in FIG. 9). The lever 150 can have a hinged end 152 and a free end 154. The lever 150 can include a cam 156. In some embodiments, the cam 156 is positioned on or near the hinged end 152 of the lever 150. The cam 156 can be configured to move the latch mechanism 136 from the locking position to the released position when the free end 154 of the lever 150 is rotated about the hinged end 152 (e.g., when the free end 154 is moved away from the module housing 126). For example, the cam 156 can move the free end 142 of the latch arm 138 toward an interior of the module housing 126 when the lever 150 is rotated.

Figure 7:
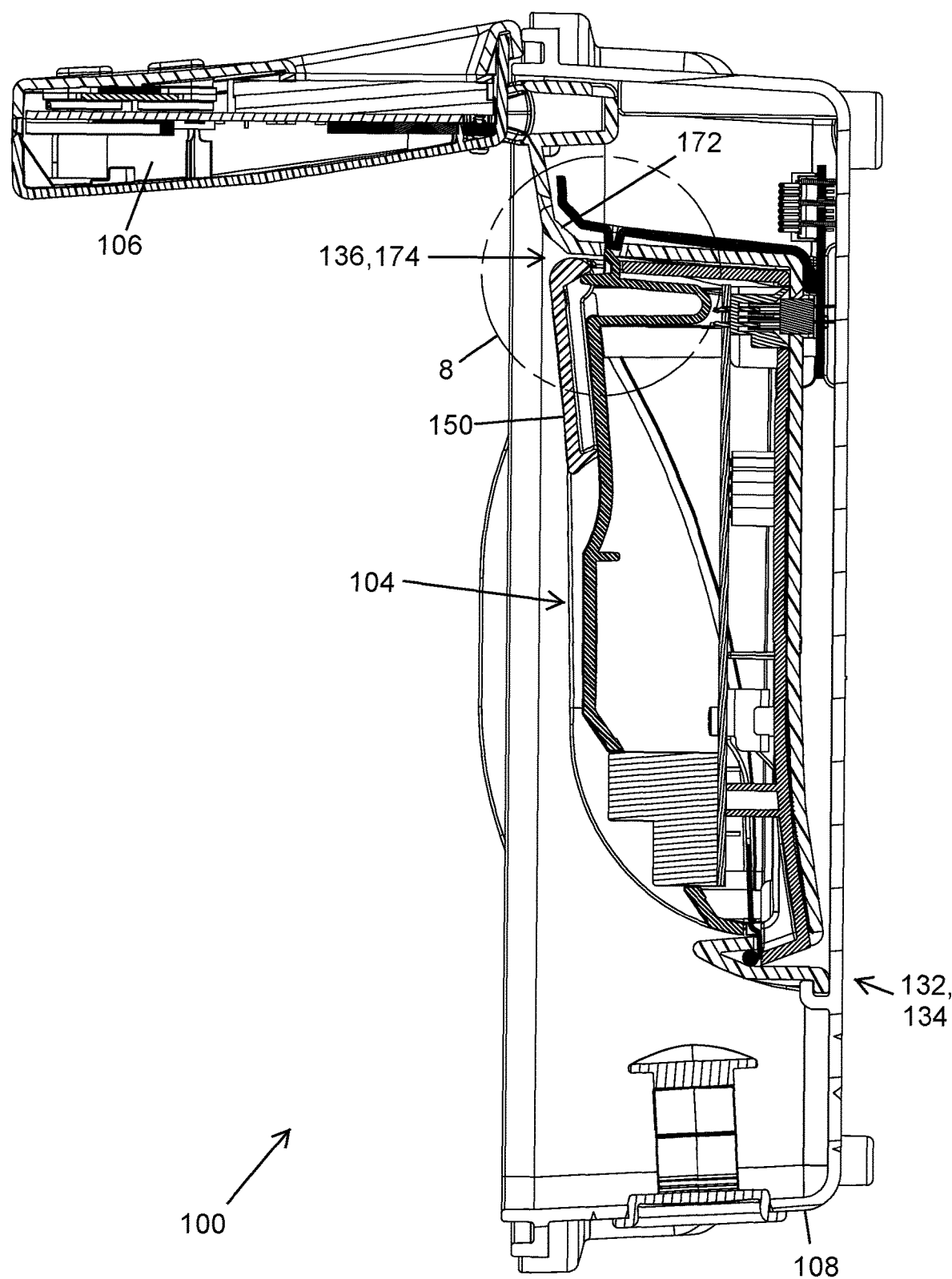
FIG. 7 is a cross-sectional view of the system of FIG. 1, taken along the cut plane 4-4 of FIG. 2, wherein communications module is fully mated with another portion of the system.

In some embodiments, as illustrated in FIG. 7, the back plate 124 includes a second lock wall 172. The second lock wall 172 can be spaced from the first lock wall 164. For example, the second lock wall 172 can be spaced from the first lock wall 164 at a distance similar to or the same as the distance between the first and second end 128, 130 of the module housing 126. The second lock wall 172 can include a retention structure. For example, the second lock wall 172 can include an aperture 174, slot, indentation, detent, or other retention feature configured to receive a portion of the communications module 104. In some embodiments, the second lock wall 172 extends above (e.g., away from the electrical connector 162 with respect to) the aperture 174 or other retention feature but does not extend below the aperture 174 or other retention feature. For example, the second lock wall 172 can be positioned entirely above the aperture 174 or other retention feature while the space below the aperture 174 or other retention feature does not include a wall.

Figure 8:
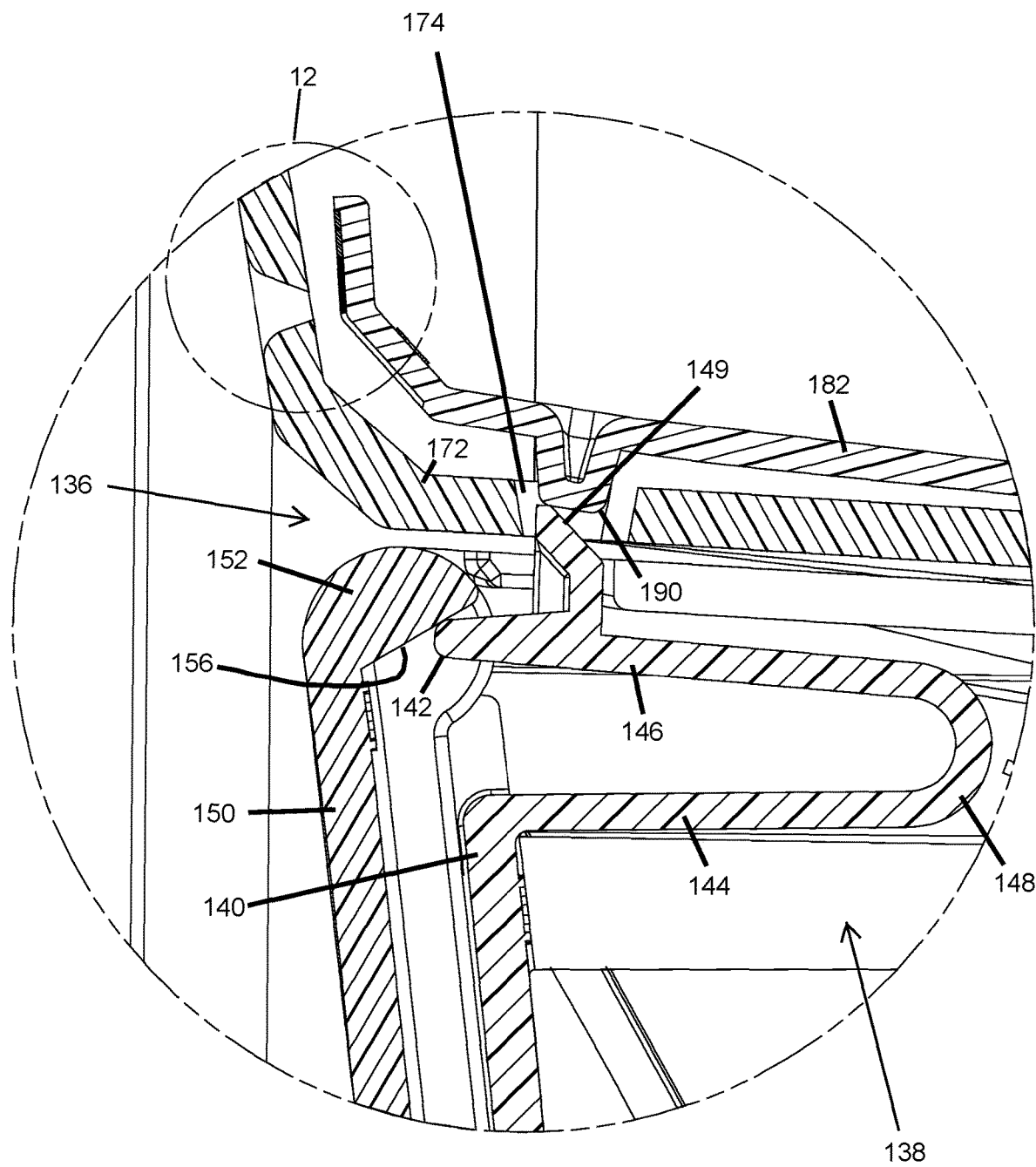
FIG. 8 is a close-up cross-sectional view of a release mechanism of the system of FIG. 1, taken in the window 8 of FIG. 7.

As illustrated in FIGS. 7 and 8, the latch mechanism 136 can releasably couple with the aperture 174 in the second lock wall 172 when the communications module 104 is fully coupled with the housing 102 and/or with the back plate 124. For example, the second lock wall 172 can deflect the latch protrusion 149 toward an interior of the module housing 126 as the communications module 104 transitions from the intermediate position of FIG. 4 to the fully coupled position of FIG. 7. The latch protrusion 149 can be biased to deflect into the aperture 174 after the latch protrusion 149 passes an upper portion of the lock wall 172 (e.g., a portion of the lock wall 172 on the side of the aperture 174 opposite the base 108 of the housing 102). Interaction between the latch protrusion 149 and the lock wall 172 when the latch protrusion 149 is positioned at least partially within the aperture 174 can inhibit or prevent inadvertent decoupling of the latch mechanism 136 from the housing 102 and/or from the back plate 124.

As illustrated in FIG. 9, the latch mechanism 136 can be decoupled from the second lock wall 172. For example, the lever 150 can be rotated about its hinged end 152 to rotate the cam 156. Rotation of the cam 156 can push the free end 142 of the latch arm 138 toward an interior of the module housing 126 and/or away from the second lock wall 172. Movement of the free end 142 of the latch arm 138 away from the second lock wall 172 can remove the latch protrusion 149 from the aperture 174 of the second lock wall 172. Removal of the latch protrusion 149 from the aperture 174 can enable a user of the communications interface system 100 to remove the communications module 104 from the housing 102.

Figure 10:
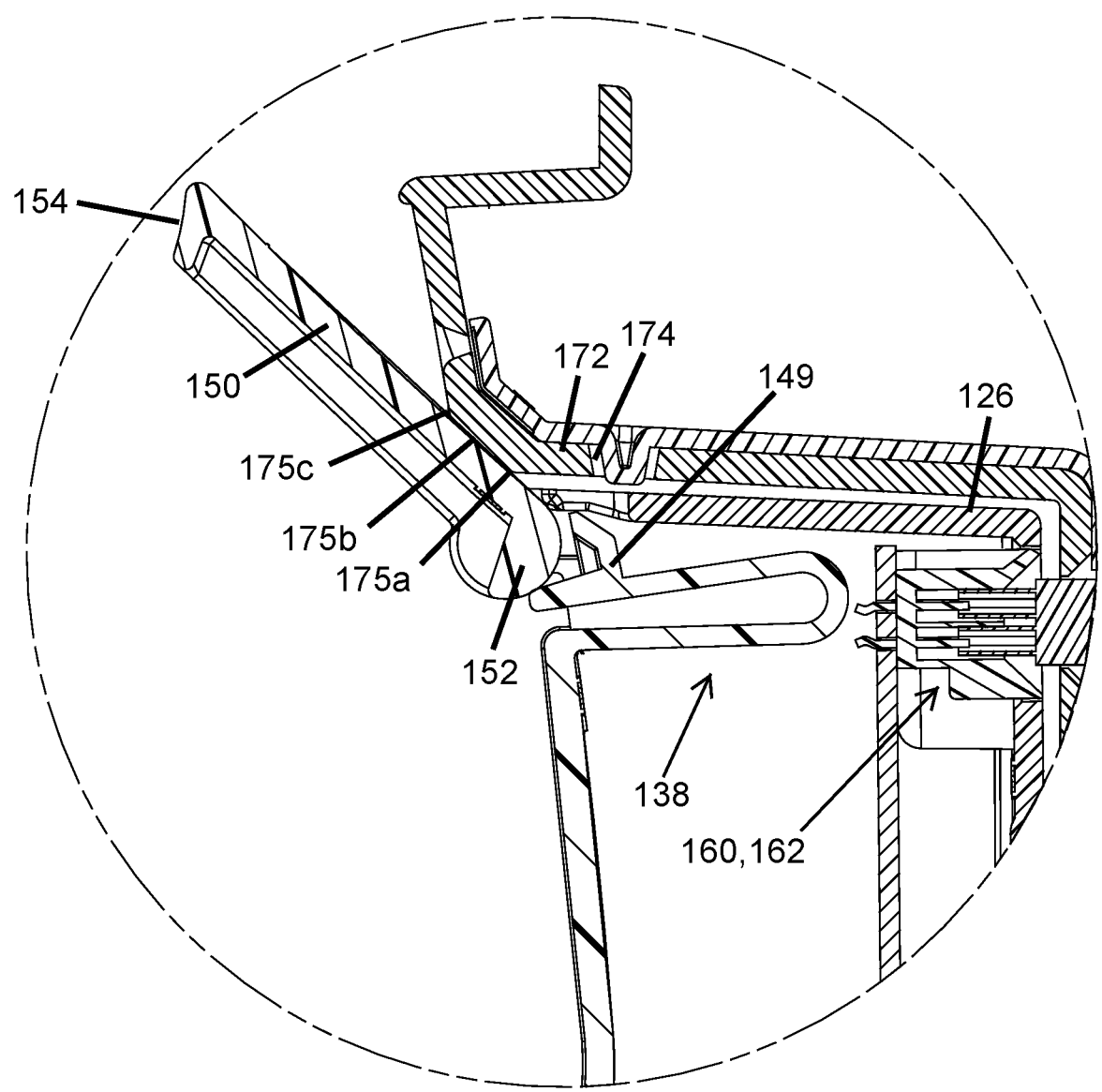
FIG. 10 is a close-up cross-sectional view of the release mechanism of FIG. 8, wherein a lever of the release mechanism is rotated to a third position.
Figure 11:
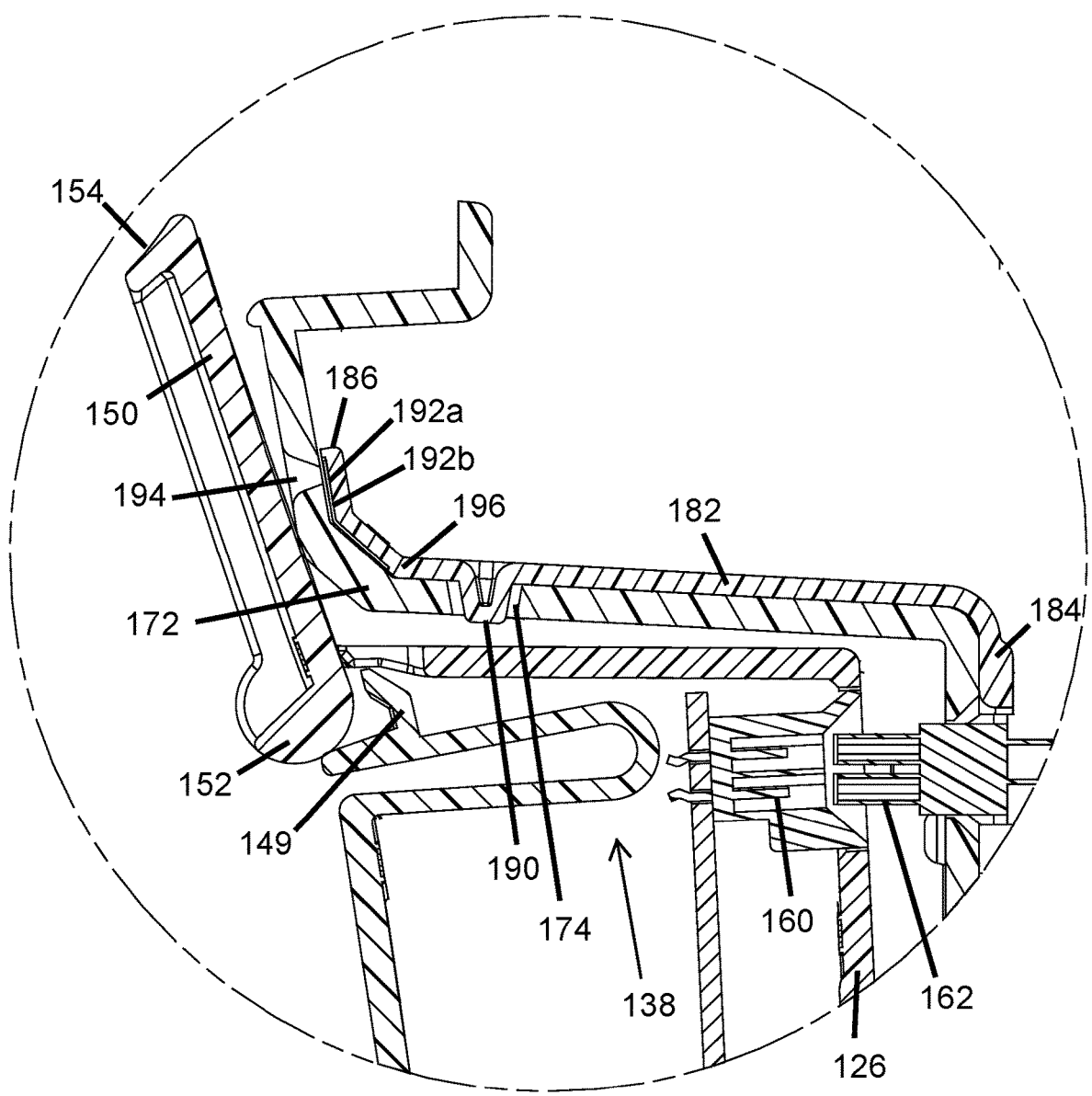
FIG. 11 is a close-up cross-sectional view of the release mechanism of FIG. 8, wherein a lever of the release mechanism is rotated to a fourth position.

As illustrated in FIGS. 10 and 11, continued rotation of the lever 150 away from the module housing 126 (e.g., clockwise in FIG. 10) prior to removal of the communications module 104 from the housing 102 can bring the lever into contact with the second lock wall 172 and/or with another portion of the housing 102 and/or the back plate 124. The portion of the housing 102 and/or back plate 124 which the lever 150 contacts can serve as a fulcrum about which the module 104 can be lifted away from the housing 102 and/or from the back plate 120. For example, further rotation of the lever 150 away from the module housing 126 after contact with the housing 102 and/or the back plate 124 can move the module housing 126 away from the back plate 124 and/or the housing 102.

In some cases, rotation of the lever 150 can cause the lever 150 to come into contact with a first bend, corner, or radiused portion 175a of the second lock wall 172. Still further rotation of the lever 150 away from the module housing 126 can bring the lever 150 into contact with a flat section 175b of the lock wall 172 and/or of the back plate 124. As illustrated in FIG. 10, rotation of the lever 150 beyond contact with the first radiused portion 175a of the lock wall 172 can move the module housing 126 away from the back plate 124. Still further rotation of the lever 150 can bring the lever 150 into contact with a second bend, corner, or radiused portion 175c of the second lock wall 172. As illustrated in FIG. 11, the second radiused portion 175c can act as a fulcrum for the lever 150 to lift the module housing 126 away from the back plate 124 and/or from the housing 102 as the lever 150 is further rotated away from an upper surface of the module housing 126. Movement of the module housing 126 away from the back plate 124 and/or from the housing 102 can disconnect the electrical connector 160 on the module housing 126 from the electrical connector 162 of the housing 102. Disconnection of the electrical connector 160 from the electrical connector 162 can reduce the force required to lift the communications module 104 away from the housing 102 to remove the communications module 104 from the housing 102. In some embodiments, movement of the module housing 126 away from the back plate 124 and/or from the housing 102 can facilitate disconnection between portions of the module housing 126 and the housing 102/back plate 124 which are friction fit or tightly fit with each other.

Coupling Indicator

Figure 12:
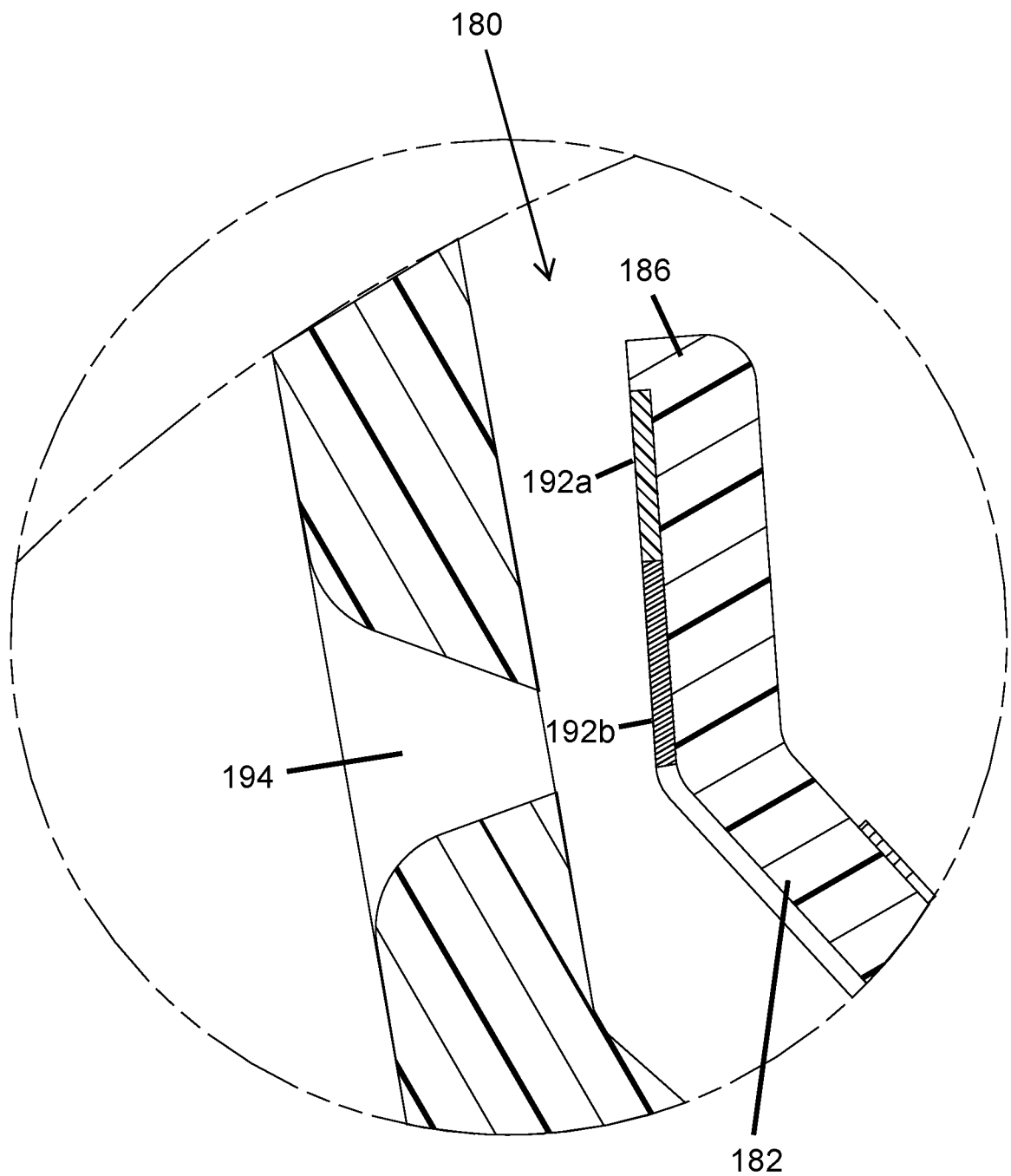
FIG. 12 is a close-up cross-sectional view of a coupling indicator of the system of FIG. 1, taken in the window 12 of FIG. 8.

As illustrated, for example, in FIGS. 11 and 12, the communications interface system 100 can include a coupling indicator 180. The coupling indicator 180 can be configured to provide visual and/or audible signals to indicate connection and/or disconnection between the communications module 104 and the housing 102 or back plate 124. In some embodiments, the coupling indicator 180 can provide a signal indicating full connection between the electrical connector 160 of the module housing 126 and the electrical connector 162 of the housing 102. In some cases, the coupling indicator 180 provides a signal indicating insertion of the latch protrusion 149 into a retention structure of the housing 102 and/or back plate 124 (e.g., the aperture 174).

The coupling indicator 180 can comprise an indicator arm 182. The indicator arm 182 can have a fixed end 184 fixed to the housing 102 and/or to the back plate 124. A free end 186 of the indicator arm 182 can be positioned on a side of the second retention member (e.g., the aperture 174) opposite the communications module 104 when the communications module 104 is connected to the housing 102. In some cases, the free end 186 of the indicator arm 182 is biased toward the aperture 174.

As illustrated in FIGS. 8 and 12, insertion of the latch protrusion 149 into the aperture 174 can deflect the indicator arm 182 away from the aperture 174. For example, the latch protrusion 149 can contact the indicator arm 182 to push the indicator arm 182 away from the aperture. In some cases, the indicator arm includes an indicator protrusion 190 extending toward and/or into the aperture 174. In some such cases, the latch protrusion 149 can contact and push the indicator protrusion 190 out from and away from the aperture 174 when the latch protrusion 149 is inserted into the aperture 174 when the communications module 104 is coupled with the housing 102.

Referring back to FIGS. 11 and 12, the coupling indicator 180 can include one or more surface features 192a, 192b. The surface features 192a, 192b can be positioned on the indicator arm 182 at or near the free end 186 of the indicator arm 182. In some embodiments, the surface features 192a, 192b comprises colored surfaces, roughened surfaces, light emitting features, and/or words or other images on the surface of the indicator arm 182. The housing 102 and/or back plate 124 can include a window 194 through which the surface features 192a, 192b can be viewed from outside of the housing 102.

In some embodiments, the coupling indicator 180 is sized and positioned such that a first surface feature 192a is shown through the window 194 when the communications module 104 is disconnected from the housing 102. The first surface feature 192a can comprise a red surface color or label. In some embodiments, the indicator arm 182 includes a second surface feature 192b that is visible through the window 194 when the indicator arm 182 is deflected away from the aperture 174 (e.g., when the latch protrusion 149 is fully inserted into the aperture 174). The second surface feature 192 can comprise a green surface color or label. In some cases, a user of the communications interface system 100 can confirm full insertion of the communications module 104 into the housing 102 (e.g., full connection) when the second surface feature 192b is viewed through the window 194.

The indicator bar 182 can include a bend 196. In some embodiments, the one or more surface features 192a, 192b are positioned on the indicator bar 182 between the bend 196 and the free end 186 of the indicator bar 182. In some embodiments, the portion of the indicator bar 182 on which the surface features 192a, 192b are located is transverse to or perpendicular to the portion of the indicator bar 182 which is contacted by the latch protrusion 149 when the communications module 104 is connected to the housing 102. In some such embodiments, the surface features 192a, 192b can be viewed from a viewing angle transverse to or perpendicular to the direction of deflection of the indicator bar 182 when the communications module 104 is connected to the housing 102. For example, the indicator bar 182 can be deflected away from the second lock wall 172 (e.g., up and down in FIG. 11) when the communications module 104 is connected to the housing 102 while the surface features 192a, 192b are viewed from the left (e.g., from a point closer to the top of FIG. 11).

In some cases, the coupling indicator 180 is configured to indicate connection between the communications module 104 (or other component onto which the coupling indicator 180 is installed) and the housing 102/back plate 124 only when the communications module is fully mechanically connected, not when partial mechanical connection is established. For example, the coupling indicator 180 can be calibrated to indicate connection between the communications module 104 and the housing 102 only when the latch protrusion 149 is fully inserted into the aperture 174 or other retention feature. In some cases, the coupling indicator 180 will not indicate full mechanical connection, even if electrical connection between the module electrical connector 160 and the electrical connector 162 is established.

Facepack

The communications interface system 100 can include one or more facepacks 106. Each facepack 106 can include one or more user input features (e.g., buttons, knobs, touchscreens, etc.) to facilitate user control of the interface system 100 or other landscape features. In some embodiments, the facepacks 106 are removable from the housing 102. In some cases, the facepacks 106 cover and/or protect other components within the housing 102 when the facepacks 106 are installed in or on the housing 102. FIGS. 69-76 illustrate various views of an embodiment of a facepack. Buttons, wired electrical ports and an SD slot, among other features are shown in broken lines to illustrate that they may or may not be present and that their position, orientation, shape, style, number, etc. can be different according to the different embodiments.

Figure 13:
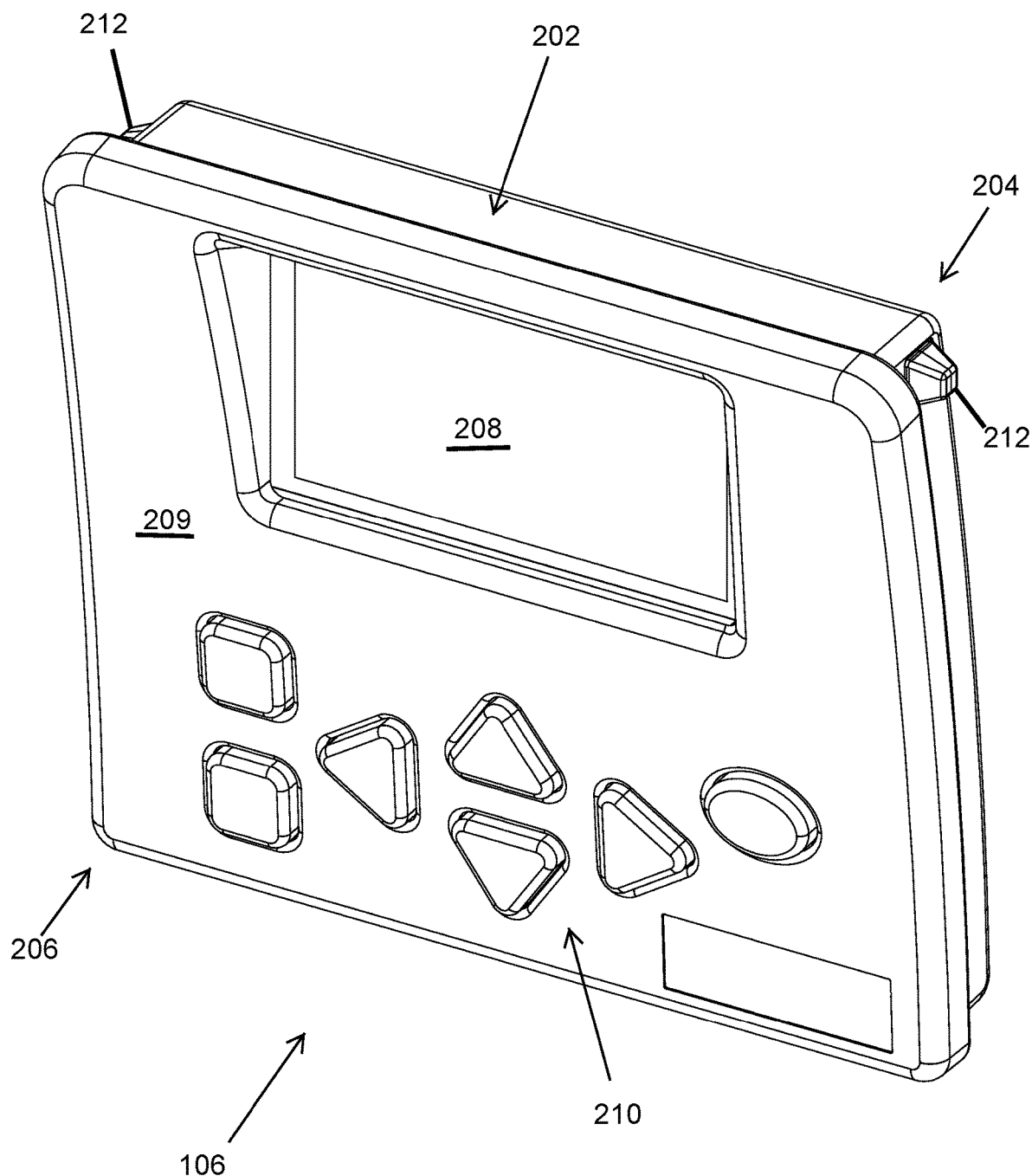
FIG. 13 is a perspective view of a facepack.

As illustrated in FIG. 13, the facepack 106 can include a facepack housing 202. One or more micro controllers and/or other electronic components (not shown) can be housed within the facepack housing 202. The facepack housing 202 can have a first end 204 and a second end 206. In some embodiments, the facepack 106 has a display 208 on a front side 209 of the facepack 106. The display 208 can be, for example, an LCD screen, an LED screen, a capacitive touch screen, a conductive touch screen, and/or any other appropriate display. The front side 209 of the facepack 106 can include one or more input members 210 (e.g., buttons, knobs, or other input structures). In some embodiments, the display 208 is configured to operate as an input member. In some embodiments, the facepack 106 includes one or more connector ports (not shown) on the front side 209, a back side 224, the first end 204, the second end 206, and/or the lateral sides of the facepack housing 202. The one or more connector ports can facilitate direct connection between the facepack 106 and one or more landscape hardware components.

Hinge Pins

The facepack 106 or other removable module (e.g., communication module 104) can include one or more hinge pins 212. The hinge pins 212 can facilitate rotation of the facepack 106 between two or more positions when the facepack 106 is connected to the housing 102 and/or to the back plate 124. In some embodiments, the facepack 106 includes one hinge pin 212 on each lateral side of the facepack 106. In some embodiments, the hinge pins 212 are positioned near the first end 204 of the facepack housing 202. For example, the hinge pins 212 can be positioned on the lateral sides of the facepack 106 less than 40%, less than 35%, less than 25%, less than 20%, less than 10%, and/or less than 5% of the distance between the first end 204 of the facepack 106 and the second end 206 of the facepack 106.

Figure 14:
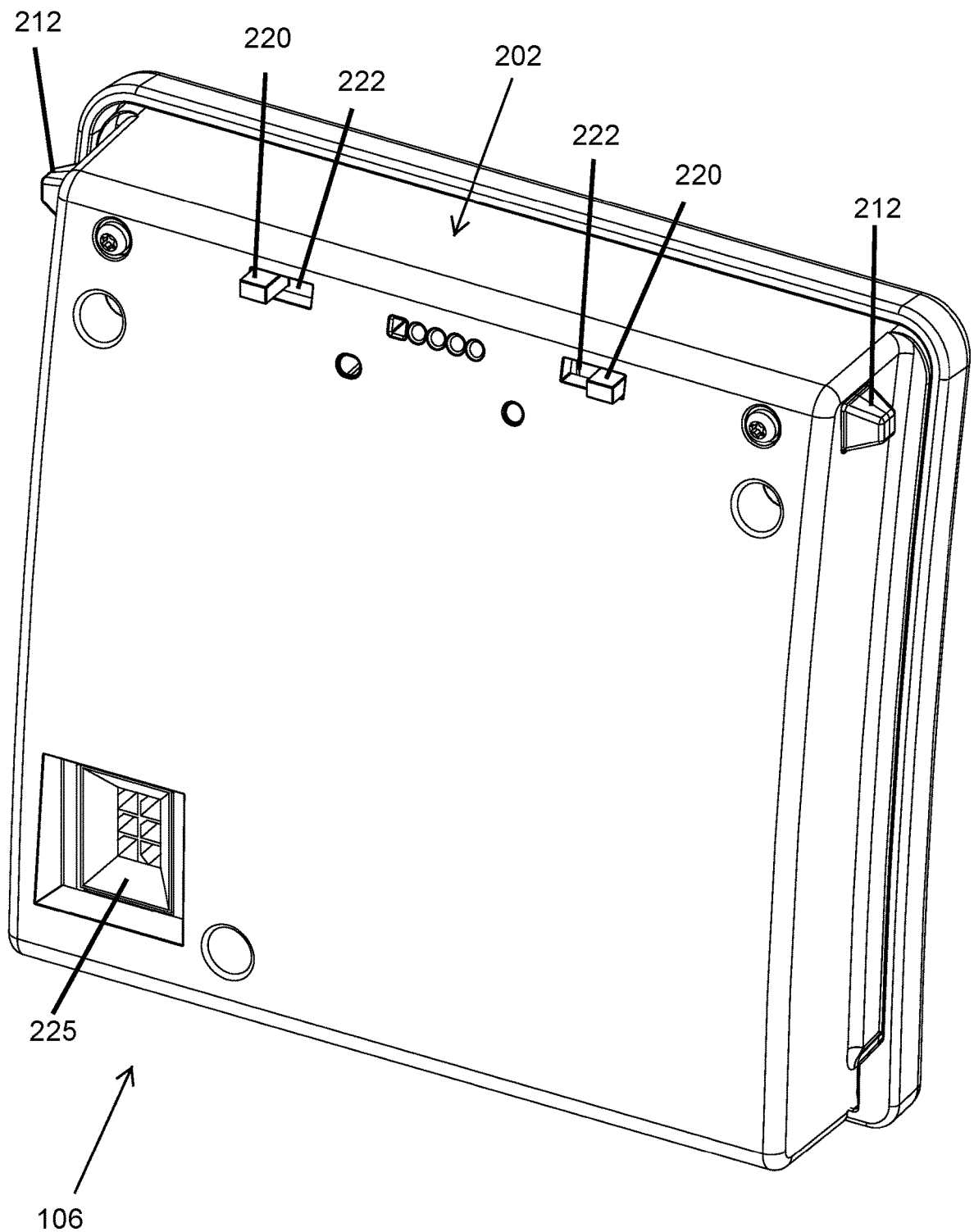
FIG. 14 is a rear perspective view of the facepack of FIG. 13.
Figure 15:
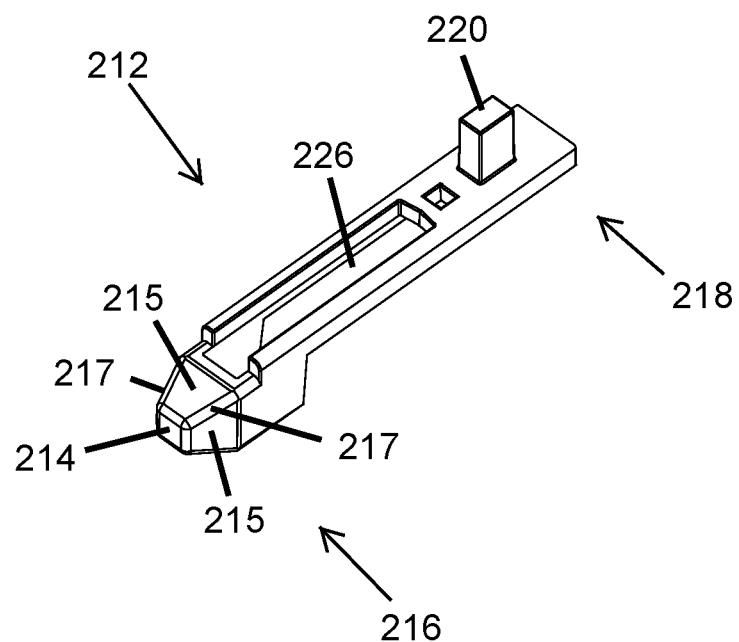
FIG. 15 is a top perspective view of a hinge pin of the facepack of FIG. 13.
Figure 16:
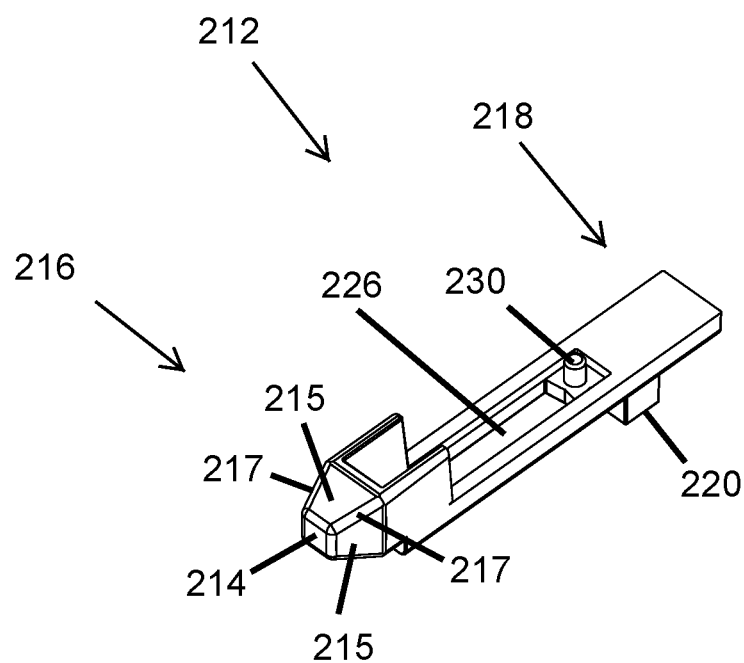
FIG. 16 is a bottom perspective view of the hinge pin of FIG. 15.

As illustrated in FIGS. 14-16, the hinge pins 212 can include a mating tip 214. The mating tip 214 can have a polygonal cross-section. In some embodiments, the mating tip 214 is tapered. The hinge pins 212 can include a first end 216 and a second end 218. The mating tip 214 can be on the first end 216 of the hinge pin. The mating tip 214 can have a plurality of tapered mating tip surfaces 215. The plurality of mating tip surfaces 215 can be joined to each other at a plurality of edges 217 or corners. The edges 217 are positioned further from a centerline of the mating tip 214 (e.g., a centerline passing through the first and second ends 216, 218 of the hinge pins 212) than the mating tip surfaces 215. The hinge pins 212 can be positioned at least partially within the housing 202.

In some embodiments, the hinge pins 212 include a slot 226 extending through at least a portion of the hinge pins 212 between the first and second ends 216, 218. The slot 226 can be sized and shaped to receive a spring 228 (e.g., a tension spring or a compression spring) or other biasing structure. In some embodiments, the hinge pins 212 include a spring mounting post 230 or other spring-retaining structure.

Figure 18:
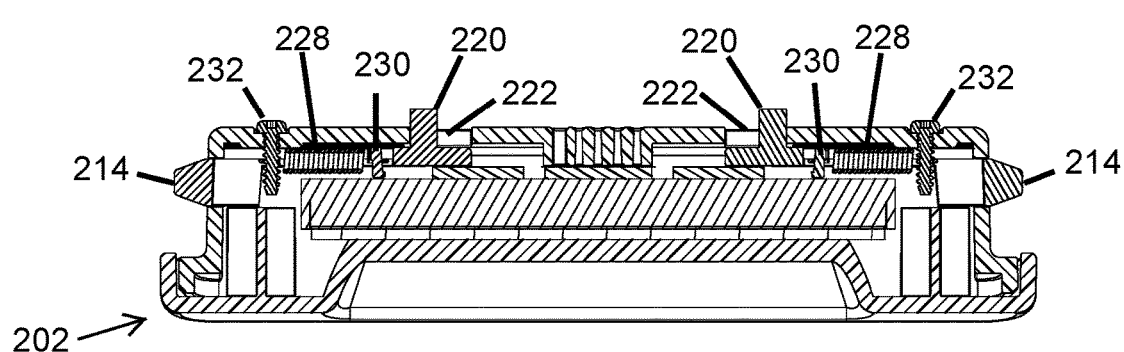
FIG. 18 is a cross-sectional view of the facepack of FIG. 13, taken along the cut plane 18-18 of FIG. 17.
Figure 19:
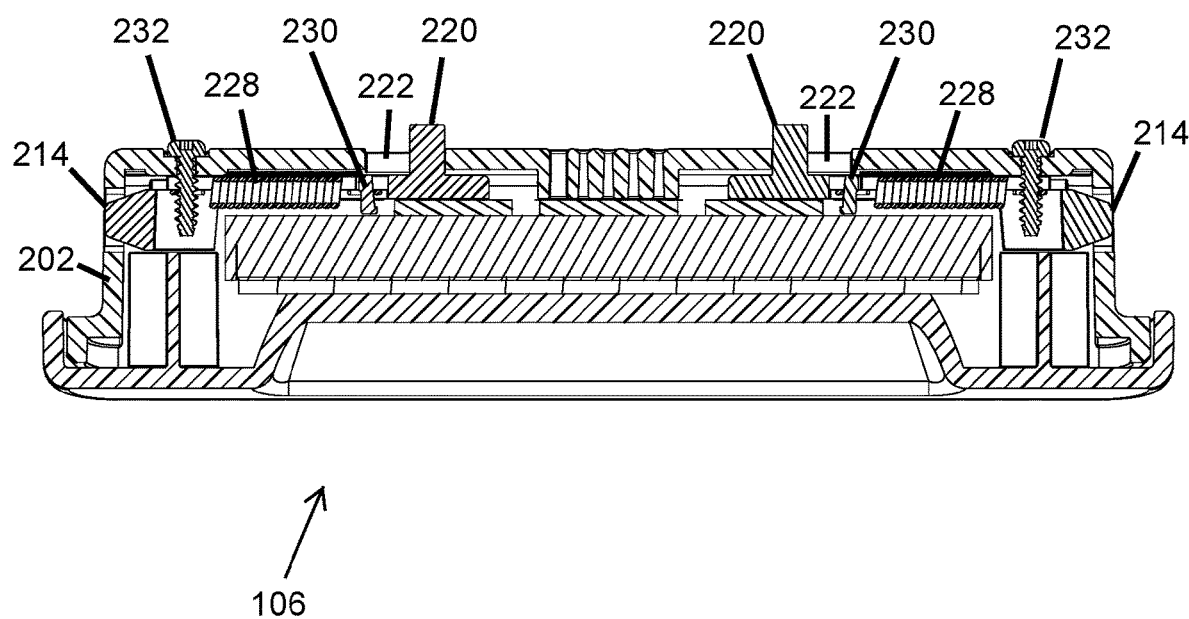
FIG. 19 is a cross-sectional view of the facepack of FIG. 13, taken along the cut plane 18-18 of FIG. 17, wherein the hinge pins are in a second position.

As illustrated in FIGS. 18 and 19, the spring 228 can be attached to the spring mounting post 230 when the hinge pins 212 are installed in the facepack housing 202. In some cases, another portion of the spring 228 can be attached to a spring retention screw 232. For example, a spring retention screw 232 can be inserted through the facepack housing 202 (e.g., through the back side 224) and spaced apart from the spring retention post 230. In some embodiments, the spring retention screw 232 is positioned between the spring retention post 230 and the mating tip 214 of the hinge pin 212. Tension in the spring 228 can pull the spring retention post 230 toward the spring retention screw 232. The mating tip 214 can be configured to transition between an extended position (FIG. 14) and a retracted position (FIG. 19). The pulling/biasing force provided by the spring 228 on the spring retention post 230 can bias the mating tip 214 to the extended position. In some embodiments, the mating tip 214 moves into the facepack housing 202 or at least partially into the facepack housing 202 when transitioning to the retracted position and the mating tip 214 extends out from the facepack housing 202 when in the extended position.

Figure 17:
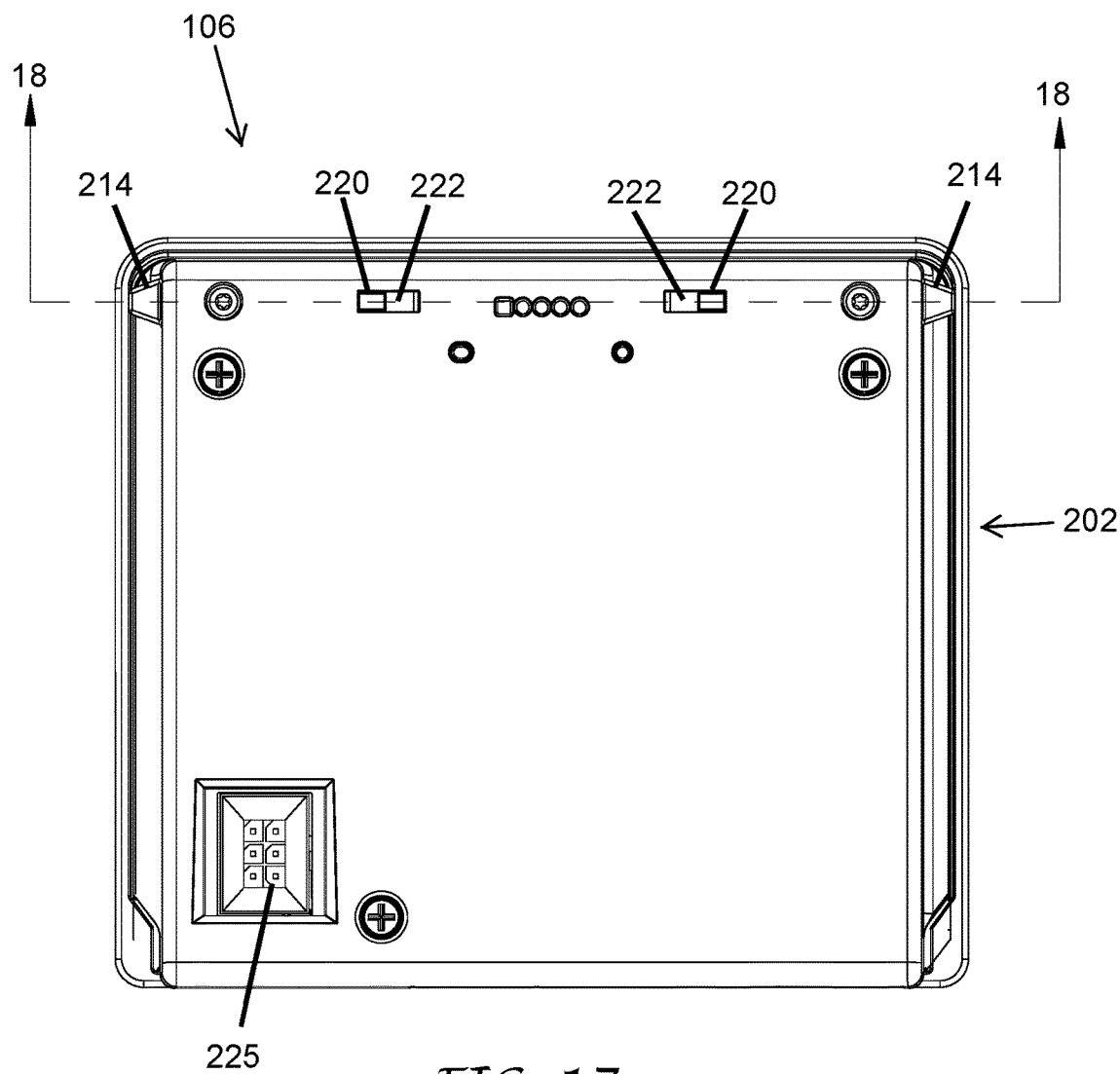
FIG. 17 is a rear plan view of the facepack of FIG. 13.

In some embodiments, the hinge pins 212 include a protrusion 220 or other user input structure. As illustrated in FIGS. 17-19, the protrusion 220 can be sized and positioned to be accessible by a user of the facepack 106 from outside of the facepack housing 202. For example, the protrusion 220 can extend through a slot 222 on a back side 224 of the facepack 106. In some embodiments, application of force upon the protrusions 220 in a direction opposite the biasing force of the spring 228 can transition the hinge pins 212 from the extended position to the retracted position.

Figure 20:
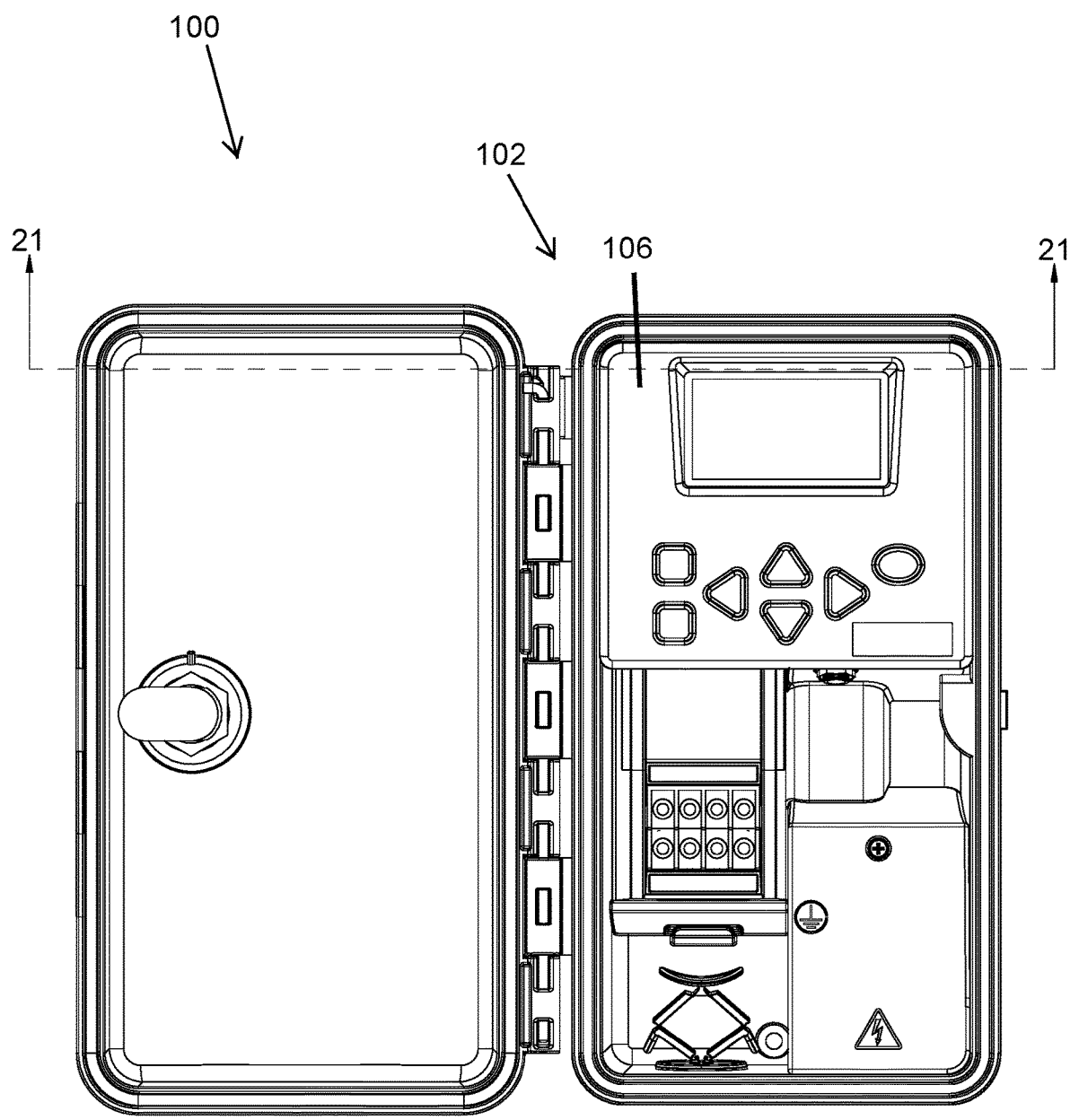
FIG. 20 is a top plan view of the system of FIG. 1.
Figure 21:
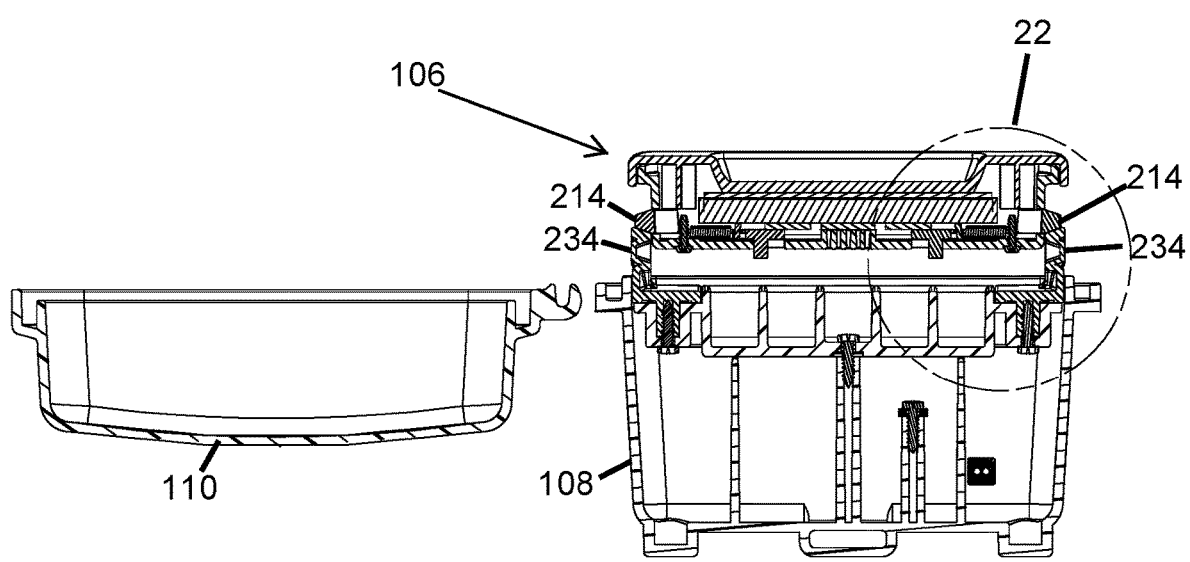
FIG. 21 is a cross-sectional view of the system of FIG. 1, taken along the cut plane 21-21 of FIG. 20.
Figure 21A:
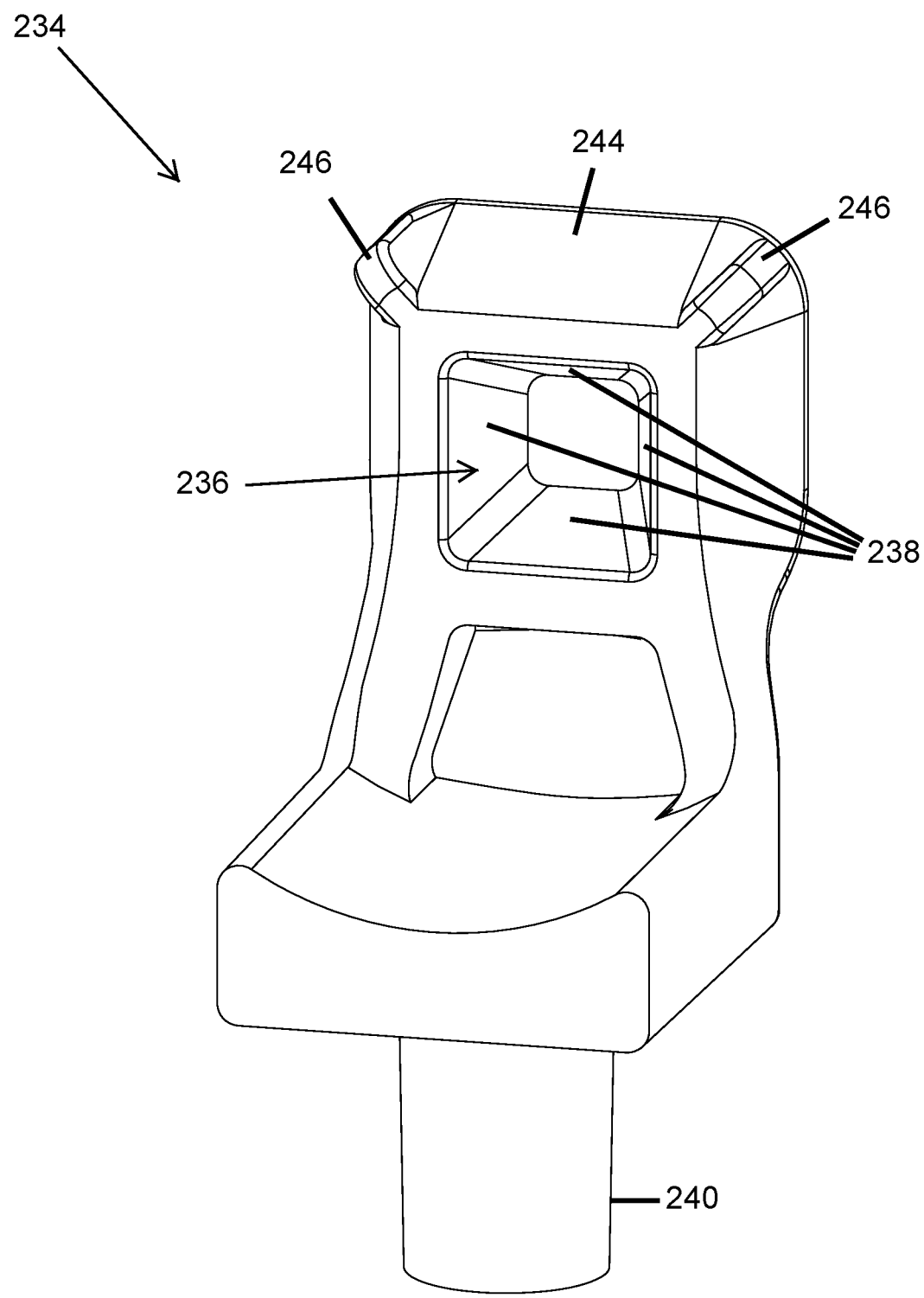
FIG. 21A is a perspective view of a flange of the system of FIG. 1.
Figure 22:
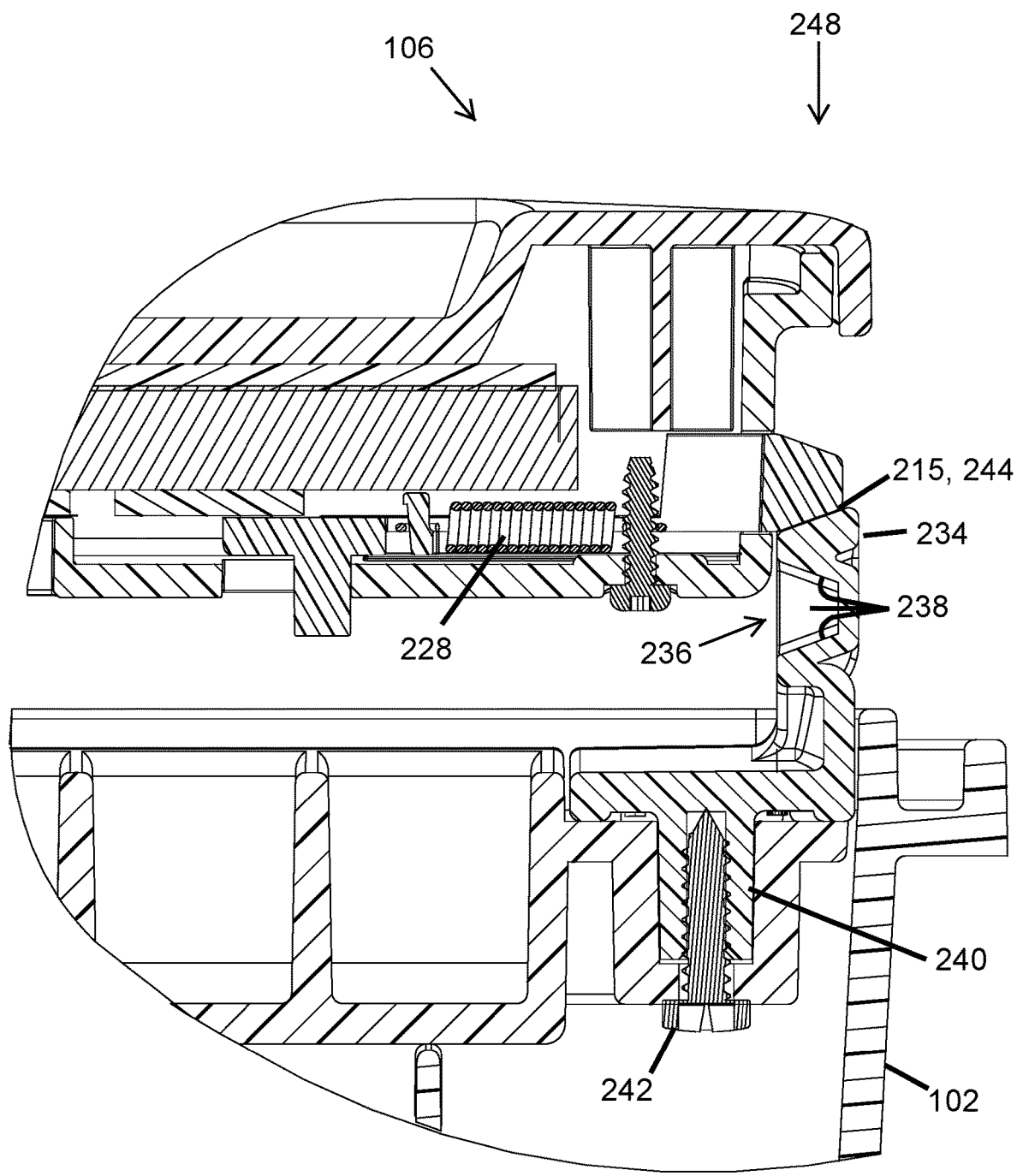
FIG. 22 is a close-up cross-sectional view of the system of FIG. 1, taken within the window 22 of FIG. 21.

As illustrated in FIGS. 20-22, the housing 102 and/or the back plate 124 can include one or more pin-receiving structures, such as one or more pin-receiving flanges 234. In some cases, the communications module 104 includes one or more pin-receiving flanges 234. The flanges 234 can be configured to rotatably and removably receive the one or more hinge pins 112 of the facepack 106. For example, the flanges 234 can include a recess 236 having a polygonal cross-section. The polygonal cross-section of the recess 236 can be configured to match or substantially match the polygonal cross-section of the mating tip 214. In some embodiments, the recesses 236 can each include a plurality of tapered mating surfaces 238. For example, when the polygonal cross-section of the recess 236 is a square, the recess 236 can include four tapered mating surfaces 238.

In some embodiments, the flanges 234 include a sloped guidance surface 244. The guidance surface 244 can have a slope that matches or substantially matches the tapered slope of the tapered mating tip surfaces 215. In some cases, the flanges 234 include one or more alignment structures configured to reduce the likelihood of misalignment between the mating tips 214 of the hinge pins 212 and the flanges 234 as the mating tips 214 are coupled with the recesses 236. For example, the flanges can include protrusions 246 (e.g., two protrusions) extending from the guidance surface 244. The protrusions 246 can align the mating tips 214 with the recesses 236 as the mating tips 214 are transitioned into the recesses 236.

The flanges 234 can extend from the back plate 124 and/or from the housing 102. In some embodiments, the flanges 234 include a connection member such as a connection post 240. The connection post 240 can be configured to frictionally couple with an aperture or indentation in the housing 102 and/or in the back plate 124. In some embodiments, a flange retention fastener 242 can be inserted through a portion of the housing 102 and/or back plate 124 into the connection post 240. The flange retention fastener 242 can inhibit or prevent the flange 234 from disconnecting from the housing 102 and/or from the back plate 124.

The facepack 106 can be mated with the housing 102 by fitting the mating tips 214 of the hinge pins 212 with the recesses 236 of the flanges 234. As described above, a user of the communications interface system 100 can deflect one or more of the hinge pins 212 to the retracted position by applying a force against the protrusion 220 in a direction opposite the biasing direction of the spring 228. The user can then position the hinge pins 212 in alignment with the recesses 236. Transition of the hinge pins 212 to the extended position (e.g., by releasing the user-applied force on the protrusions 220) when the hinge pins 212 are aligned with the recesses 236 can permit the mating tips 214 of the hinge pins to mate with the recesses 236. In some cases, the user can insert the mating tip 214 of one of the hinge pins 212 into a recess 236 while the hinge pin 212 is in the extended position. The user can transition the other hinge pin 212 to the retracted position and then align the other hinge pin with the unmated recess 236.

Figure 23:
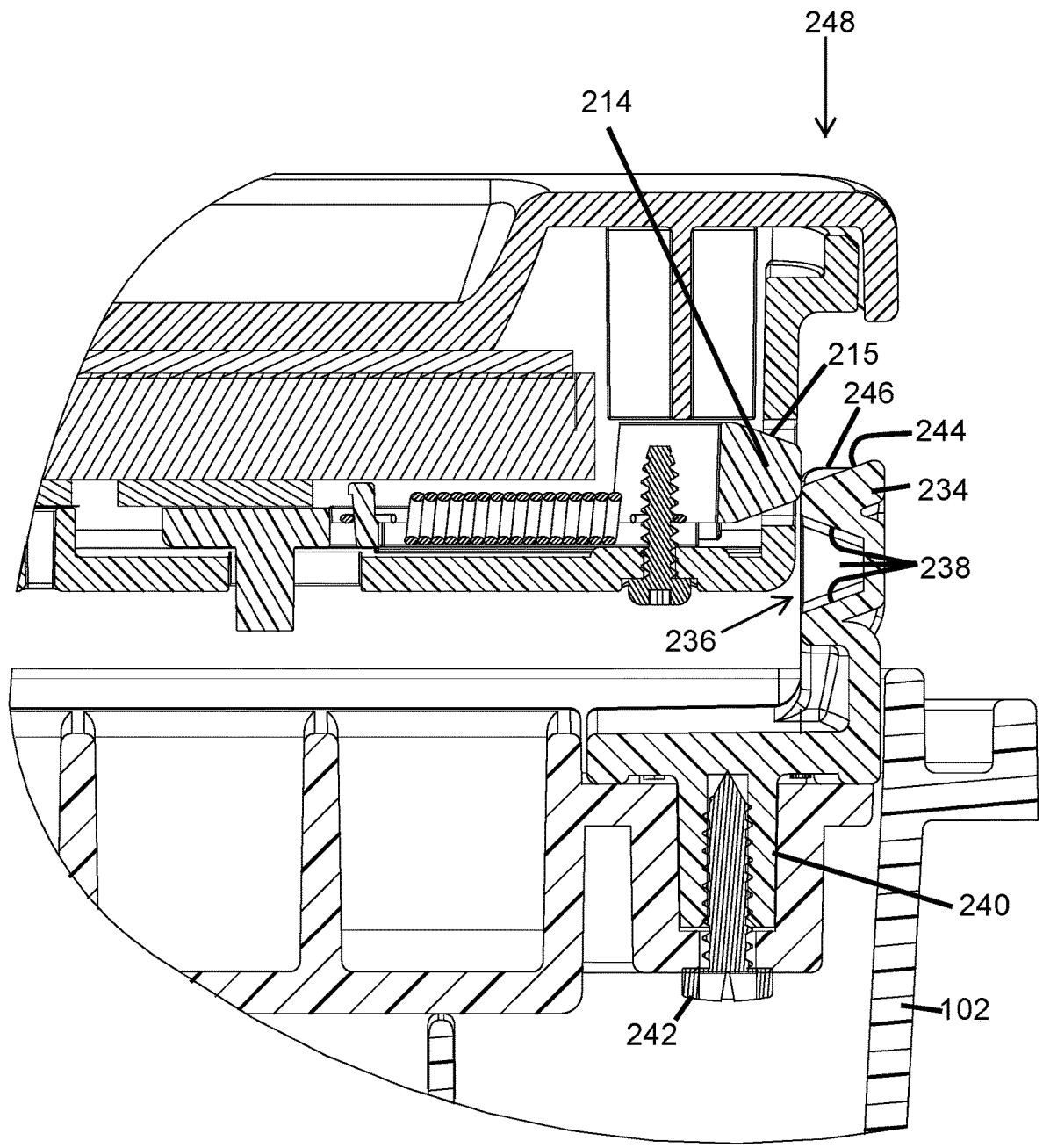
FIG. 23 is a close-up cross-sectional view of the system of FIG. 1, taken within the window 22 of FIG. 21, wherein the hinge pin is partially mated with the flange.
Figure 24:
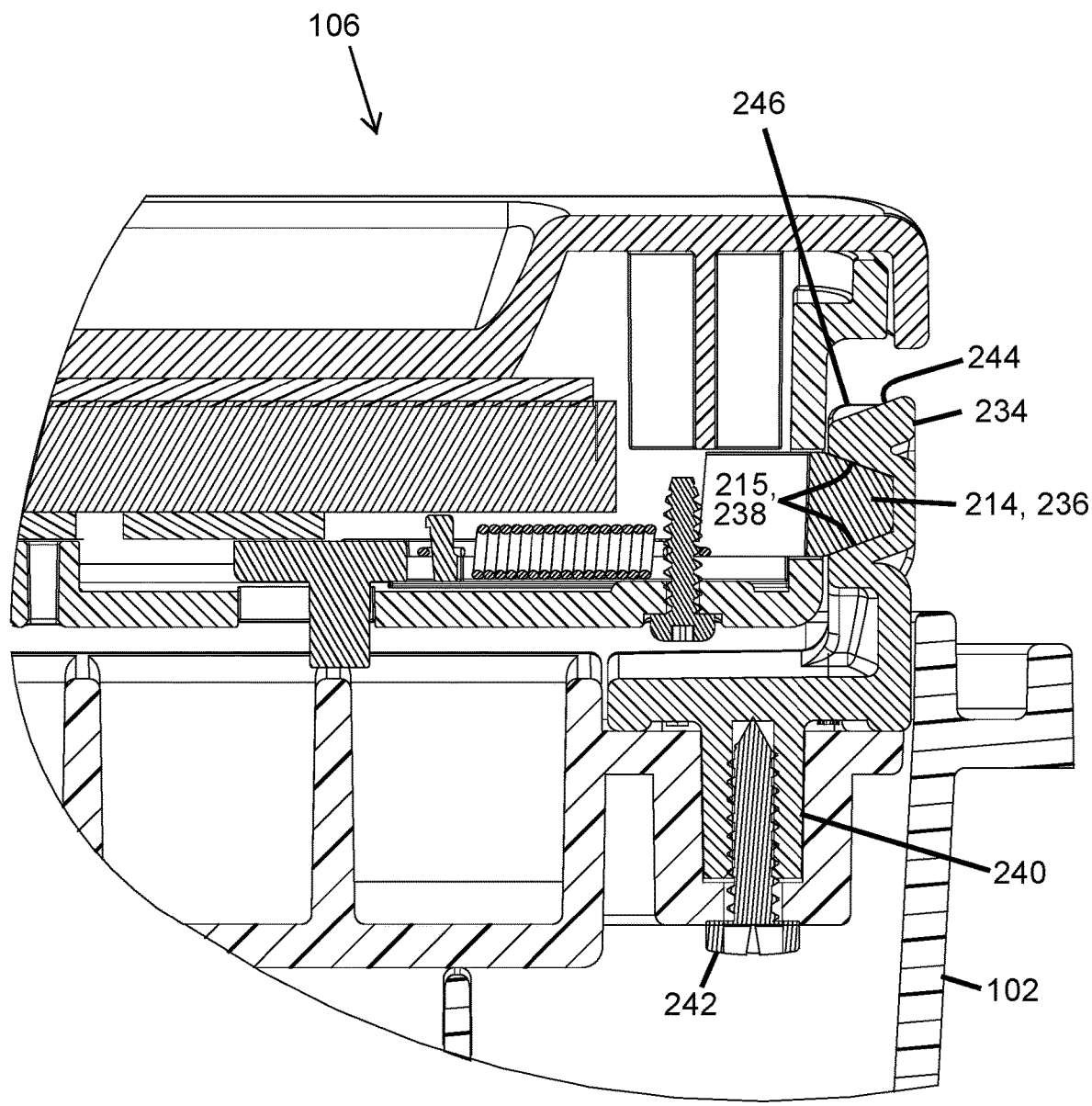
FIG. 24 is a close-up cross-sectional view of the system of FIG. 1, taken within the window 22 of FIG. 21, wherein the hinge pin is fully mated with the flange.

As illustrated in FIGS. 21-24, the mating tips 214 of one or more of the hinge pins 212 can be fitted with the recesses 236 of the flanges 234 without applying force on the protrusions 220. For example, one of the mating tip surfaces 215 of each of the hinge pins 212 can be moved into contact with the sloped guidance surfaces 244 of the flanges 234. A coupling force 248 upon the facepack 206 toward the flanges 234 can be translated into a retracting force (e.g., a force in the direction opposite the biasing force of the spring 228) via the angled interaction between the mating tip surface 215 of the hinge pin 212 and the sloped guidance surfaces 244. As seen in FIG. 23, the mating tip 214 can be deflected toward an interior of the facepack housing 202 as the facepack 106 is moved toward the housing 102. Further movement of the facepack 106 toward the housing 102 can align the hinge pins 212 with the recesses 236 and permit the mating tips 214 to mate with the recesses 236, as illustrated in FIG. 24.

Figure 25:
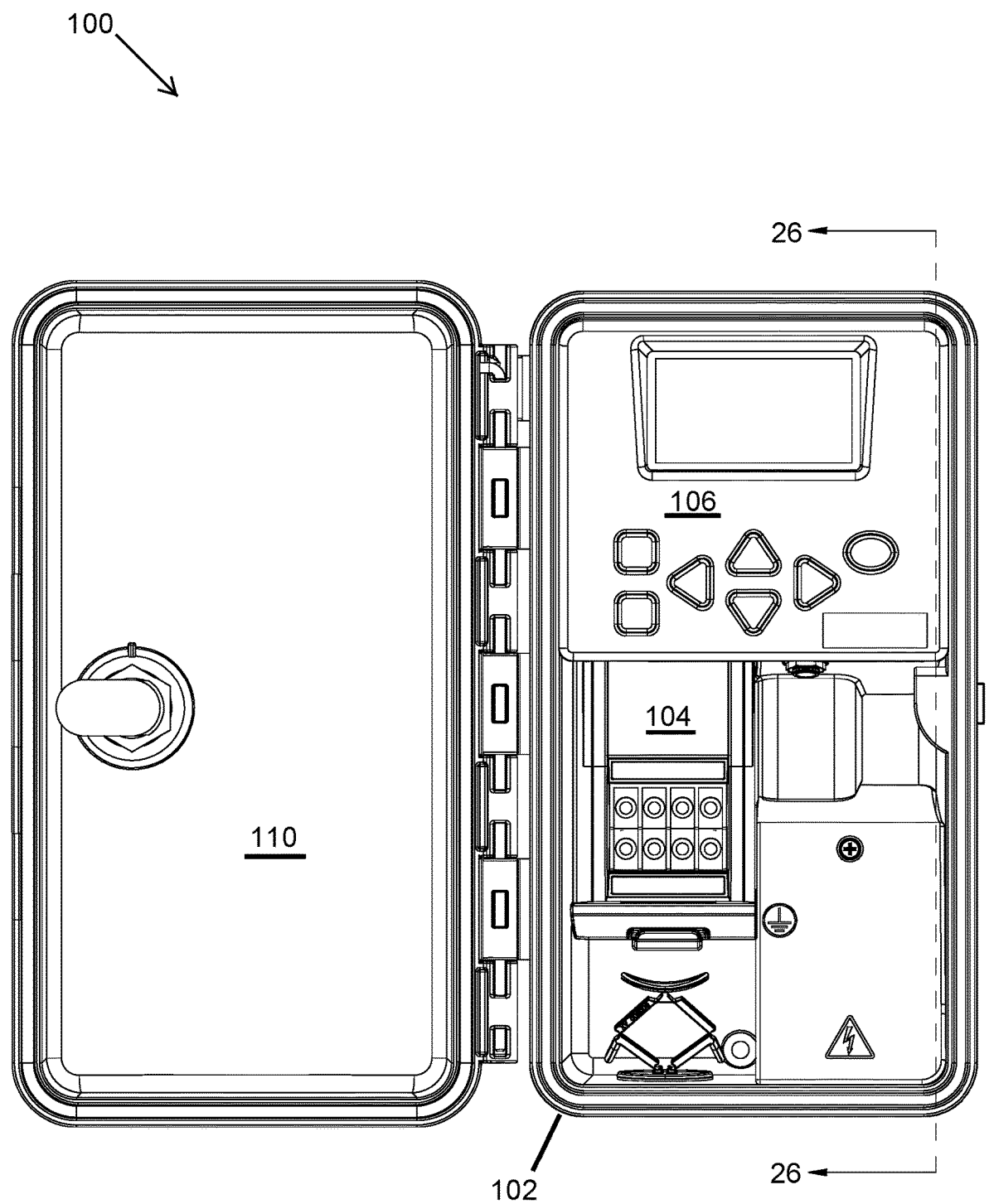
FIG. 25 is a top plan view of the system of FIG. 1.
Figure 26:
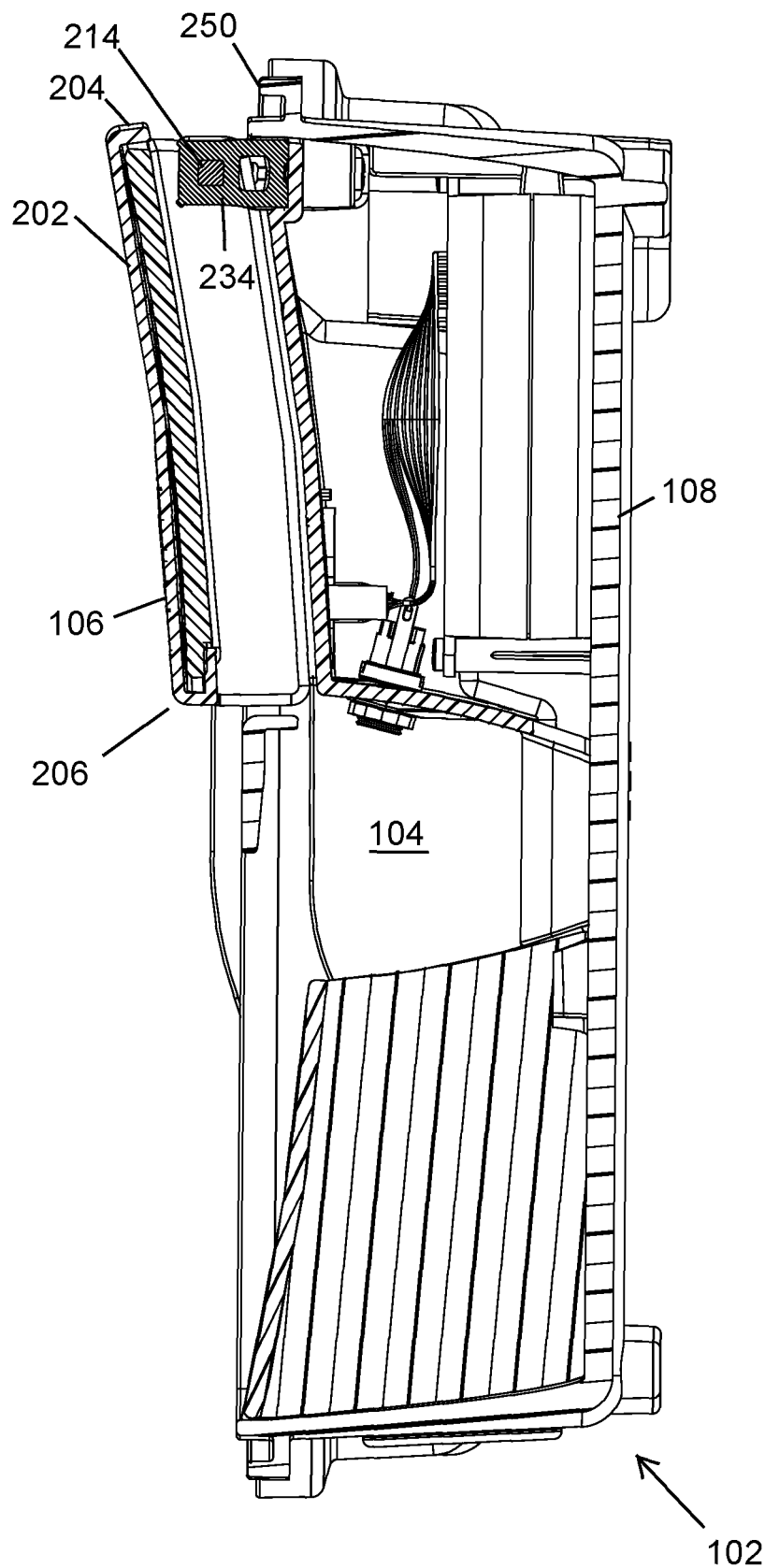
FIG. 26 is a cross-sectional view of the system of FIG. 1, taken along the cut plane 26-26 of FIG. 25.

In some cases, the facepack 106 is rotatable about the hinge pins 212 between two or more stable positions when the facepack 106 is mated with the housing 102. For example, as illustrated in FIGS. 24-26, the facepack 106 can mate with the housing 102 in a first stable position wherein the mating tip surfaces 244 are flush with the tapered mating surfaces 238 of the recesses 236. In the first stable position, the facepack housing 202 can be positioned substantially parallel to the base 108 of the housing 102 (e.g., the facepack housing 202 can lie substantially flat with respect to the base 108). In some embodiments, the facepack 106 can inhibit or prevent inadvertent removal of one or more of the communications modules 104 from the housing 102. For example, the facepack 106 can overlay at least a portion of one or more of the communications modules 104 when the facepack 106 is in the first stable position. In some embodiments, an electrical connector 225 on the back side 224 of the facepack housing 202 is connected to a facepack electrical connector 227 of the housing 102 when the facepack 106 is in the first stable position.

Figure 27:
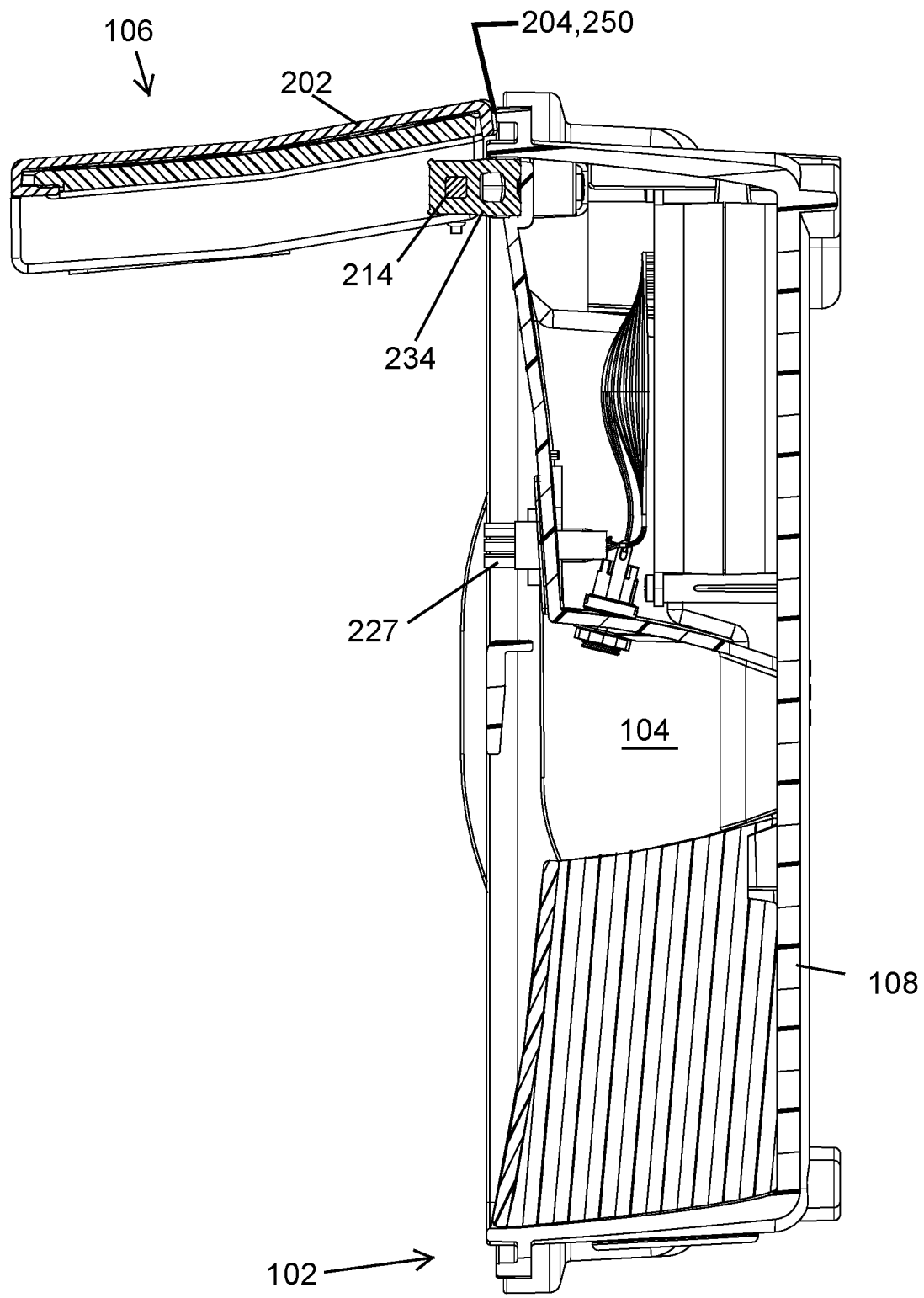
FIG. 27 is a cross-sectional view of the system of FIG. 1, taken along the cut plane 26-26 of FIG. 25, wherein the facepack is in a first rotated position.

The facepack 106 can be rotated about the hinge pins 212 (e.g., away from the housing 102) to a second stable position, as illustrated in FIG. 27. In some cases, the facepack 106 can be mated to the housing 102 in the second stable position. The facepack 106 can be electrically disconnected from the housing 102 when the facepack 106 is rotated away from the first stable position. The facepack housing 202 can extend substantially perpendicularly from the housing base 108 of the housing 102 when the facepack 106 is in the second stable position. In some cases, the mating tip surfaces 244 are flush with the tapered mating surfaces 238 of the recesses 236 when the facepack 106 is in the second stable position. In some embodiments, the biasing force provided by the spring 228 is sufficient to maintain the facepack 106 in the second stable position via interaction between the mating tip surfaces 244 and the tapered mating surfaces 238. In some embodiments, one or more of the communications modules 104a-c can be inserted into or removed from the housing 102 when the facepack 106 is in the second stable position without removing facepack 106 from the housing 102 (e.g., without disconnecting the facepack 106 from the housing 102).

In some embodiments, the hinge pins 212 can be deflected toward the facepack housing 202 when the facepack 106 is rotated outside of the one or more stable positions. For example, rotation of the facepack 106 about the hinge pins 212 away from a stable position can move the edges 217 of the mating tip surfaces 215 into contact with the tapered mating surfaces 238 of the recesses 236. Moving the edges 217 into contact with the tapered mating surfaces 238 deflects the mating tip 214 toward the facepack housing 202. For example, as explained above, the edges 217 are positioned further from the a centerline of the mating tips 214 and are pushed toward a wider portion of the recesses 236, closer to the facepack housing 202, when the edges 217 are brought into contact with the tapered mating surfaces 238 of the recesses 236.

Figure 28:
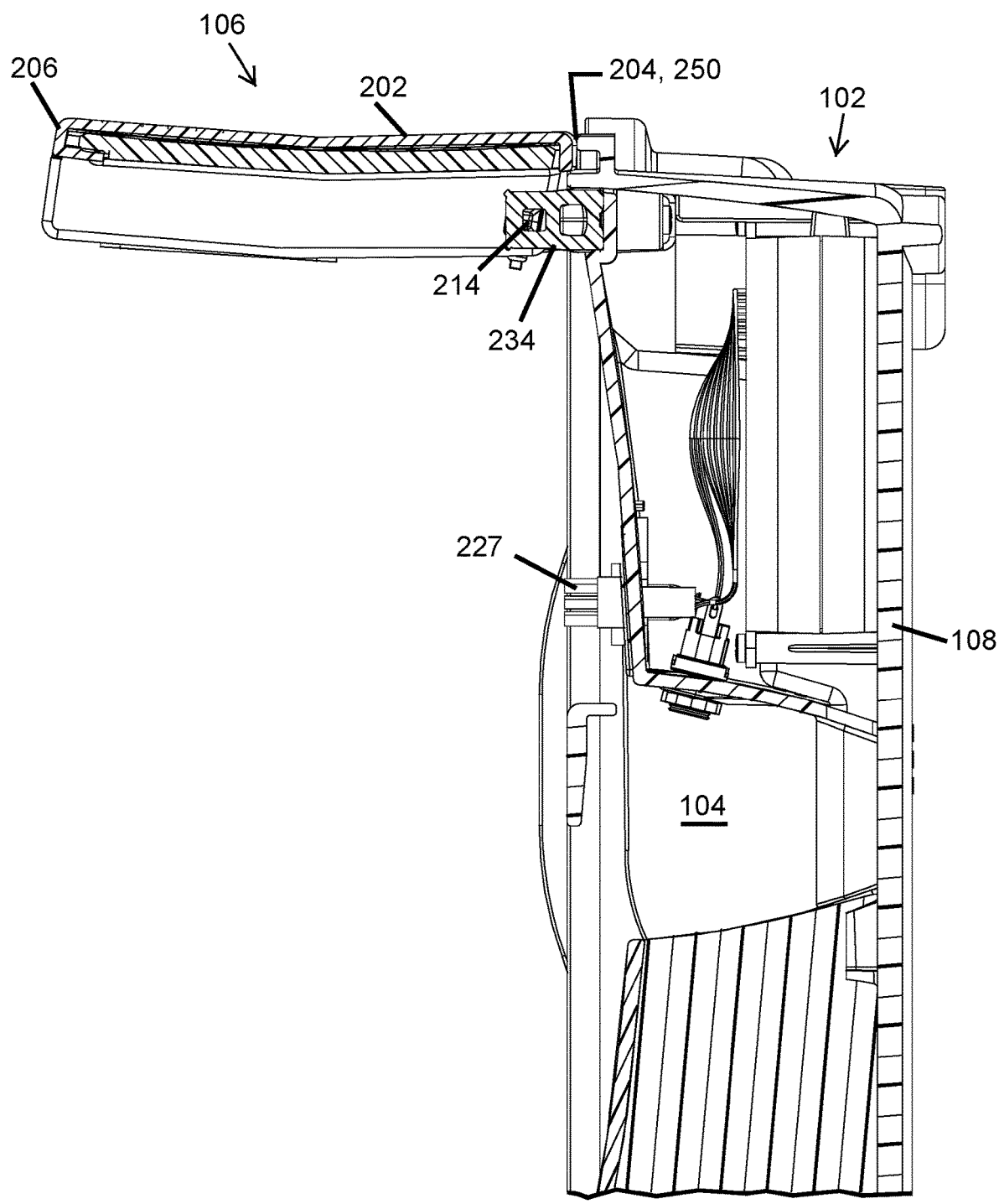
FIG. 28 is a cross-sectional view of the system of FIG. 1, taken along the cut plane 26-26 of FIG. 25, wherein the facepack is in a second rotated position.
Figure 29:
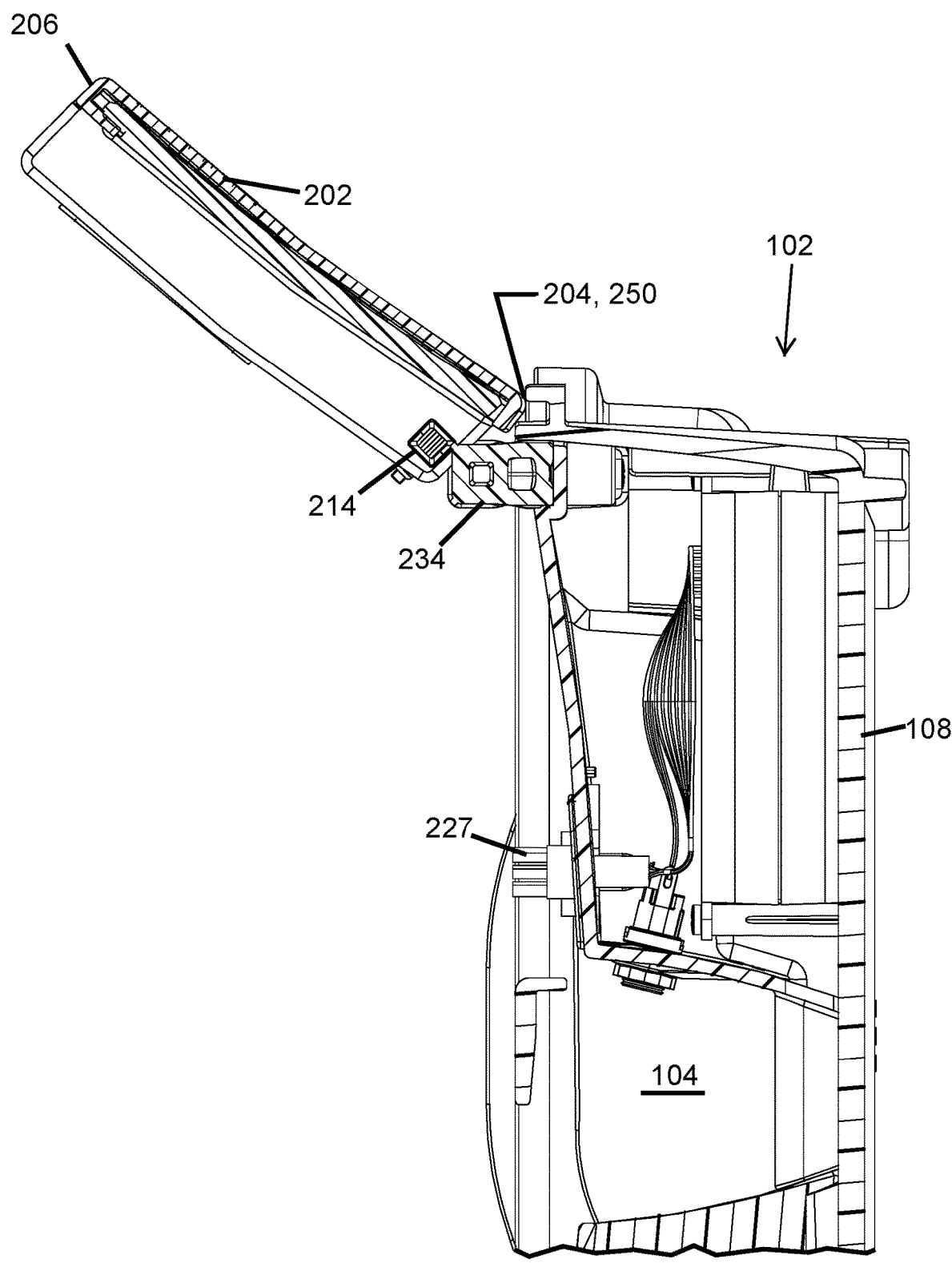
FIG. 29 is a cross-sectional view of the system of FIG. 1, taken along the cut plane 26-26 of FIG. 25, wherein the facepack is decoupled from the flanges.
Figure 30:
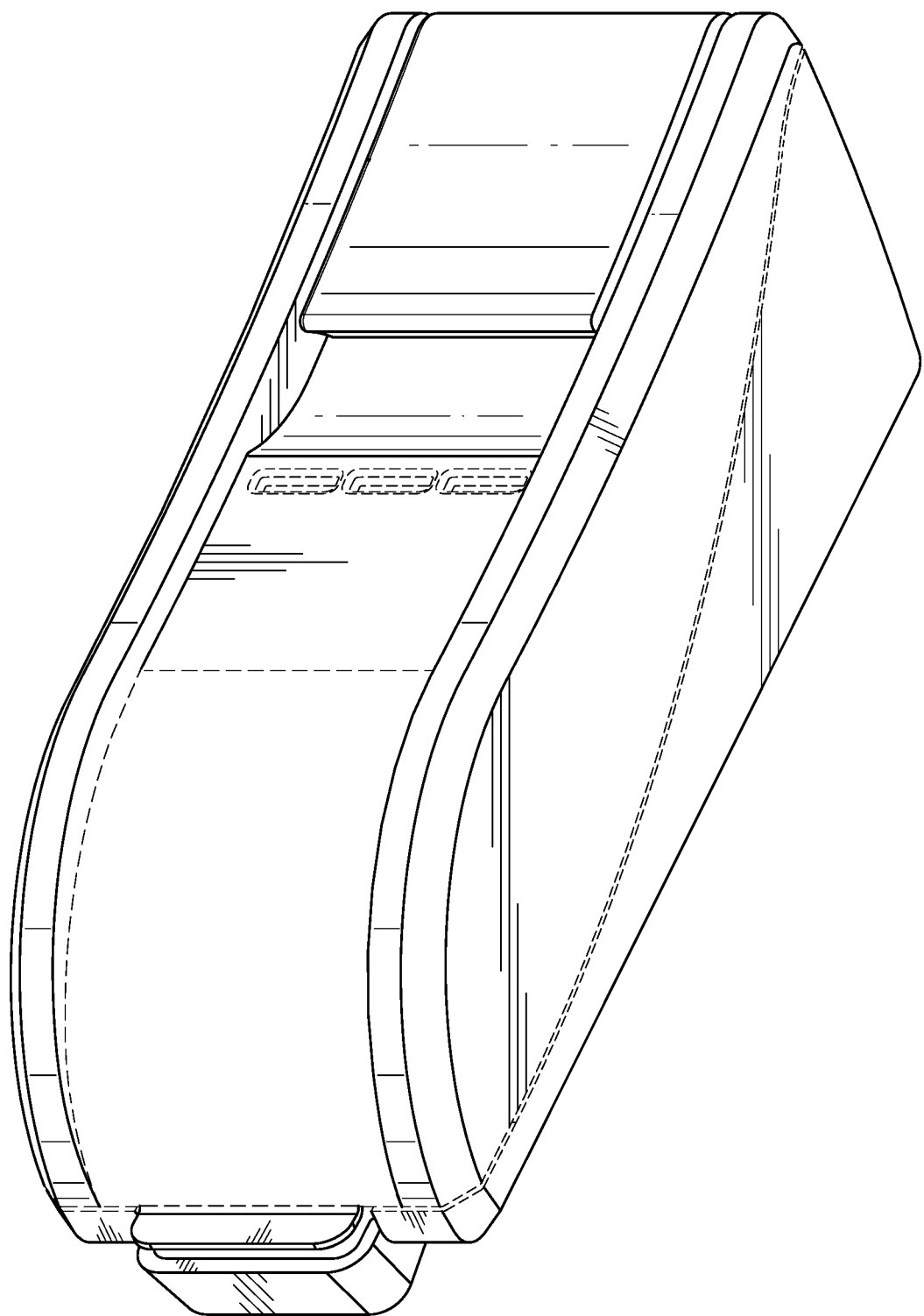
FIG. 30 is a top, front and side perspective view of a communications module embodying a new design.
Figure 31:
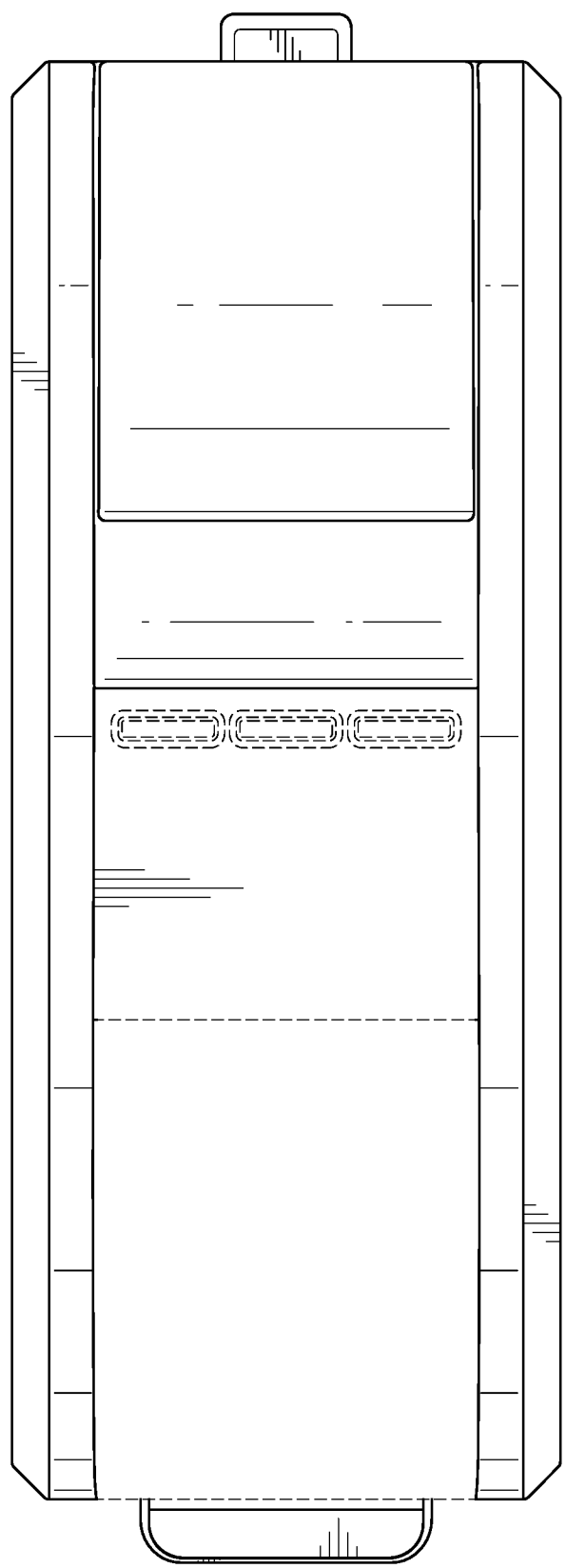
FIG. 31 is a top view of the communications module of FIG. 30.
Figure 32:
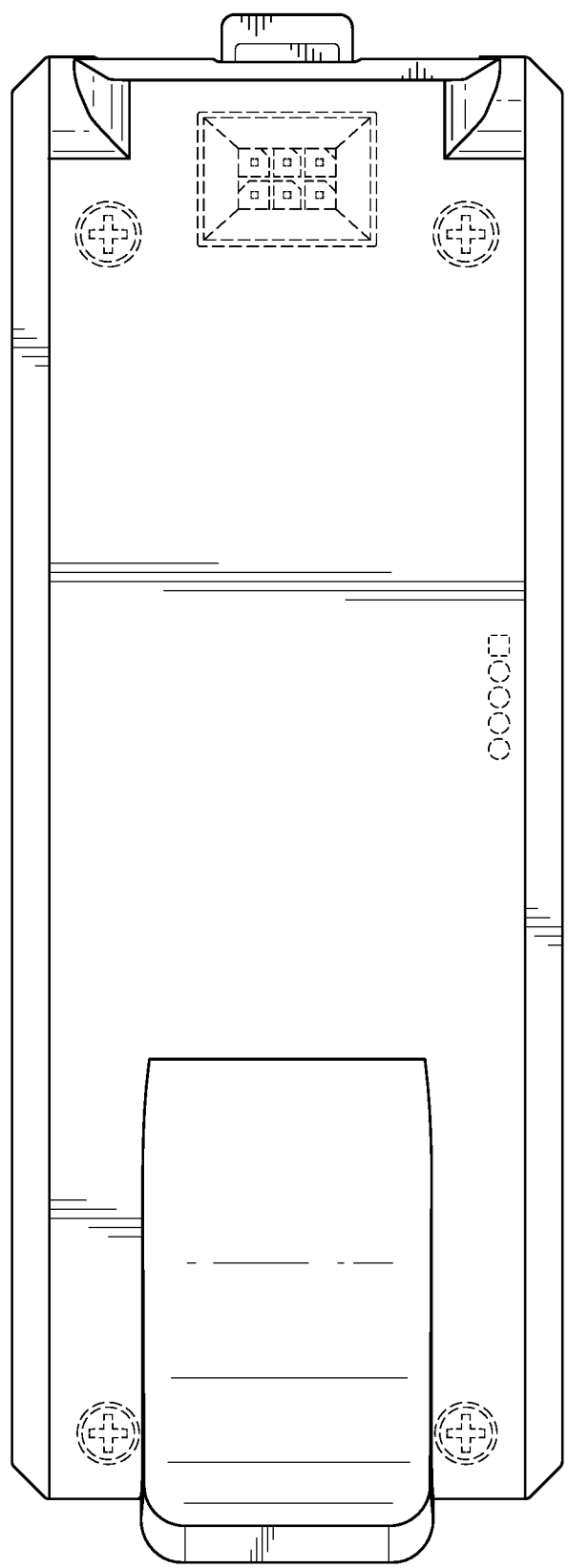
FIG. 32 is a bottom view of the communications module of FIG. 30.
Figure 33:
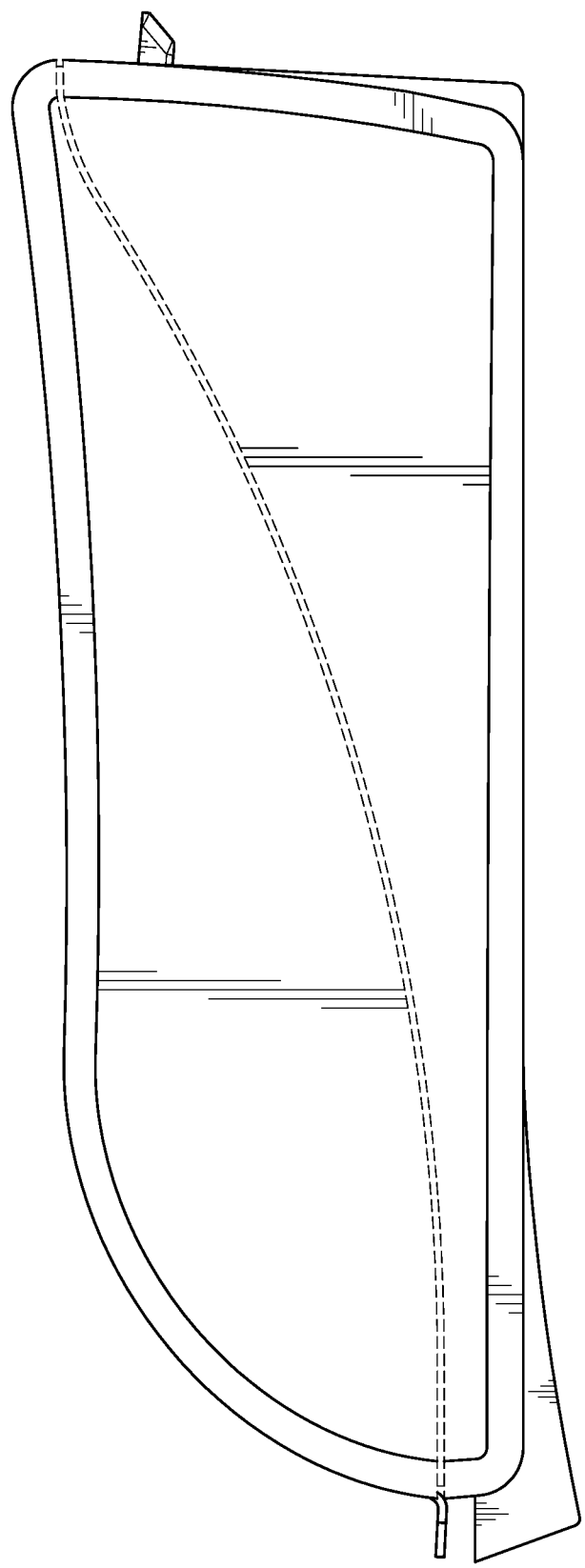
FIG. 33 is a first side view of the communications module of FIG. 30, the second side being a mirror image.
Figure 34:
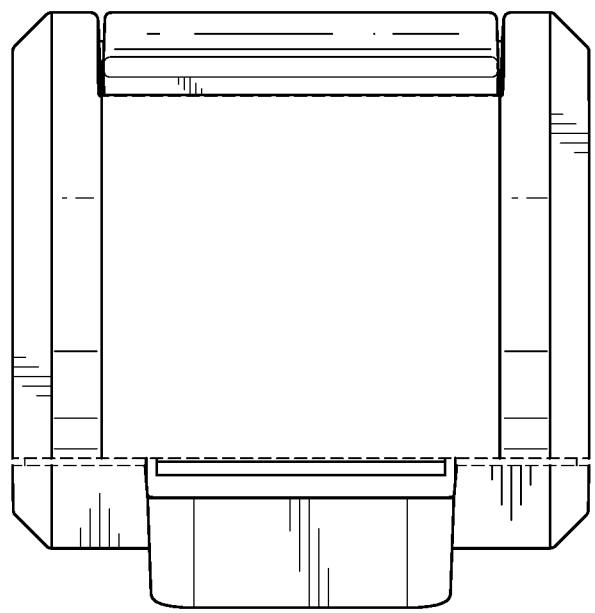
FIG. 34 is a front view of the communications module of FIG. 30.
Figure 35:
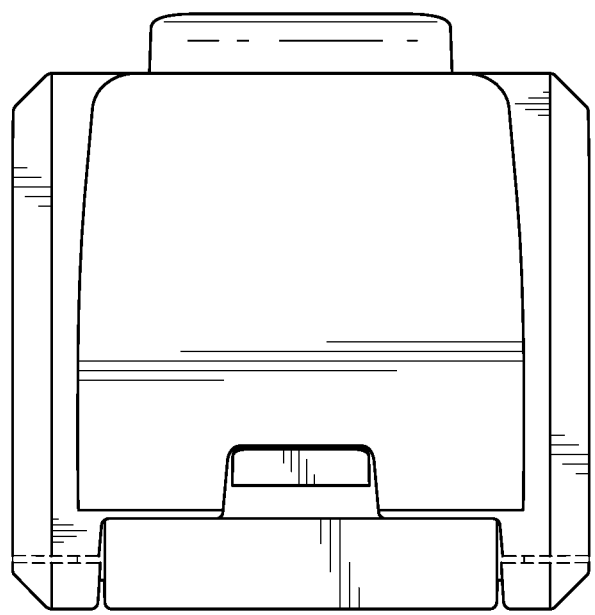
FIG. 35 is a back view of the communications module of FIG. 30.
Figure 36:
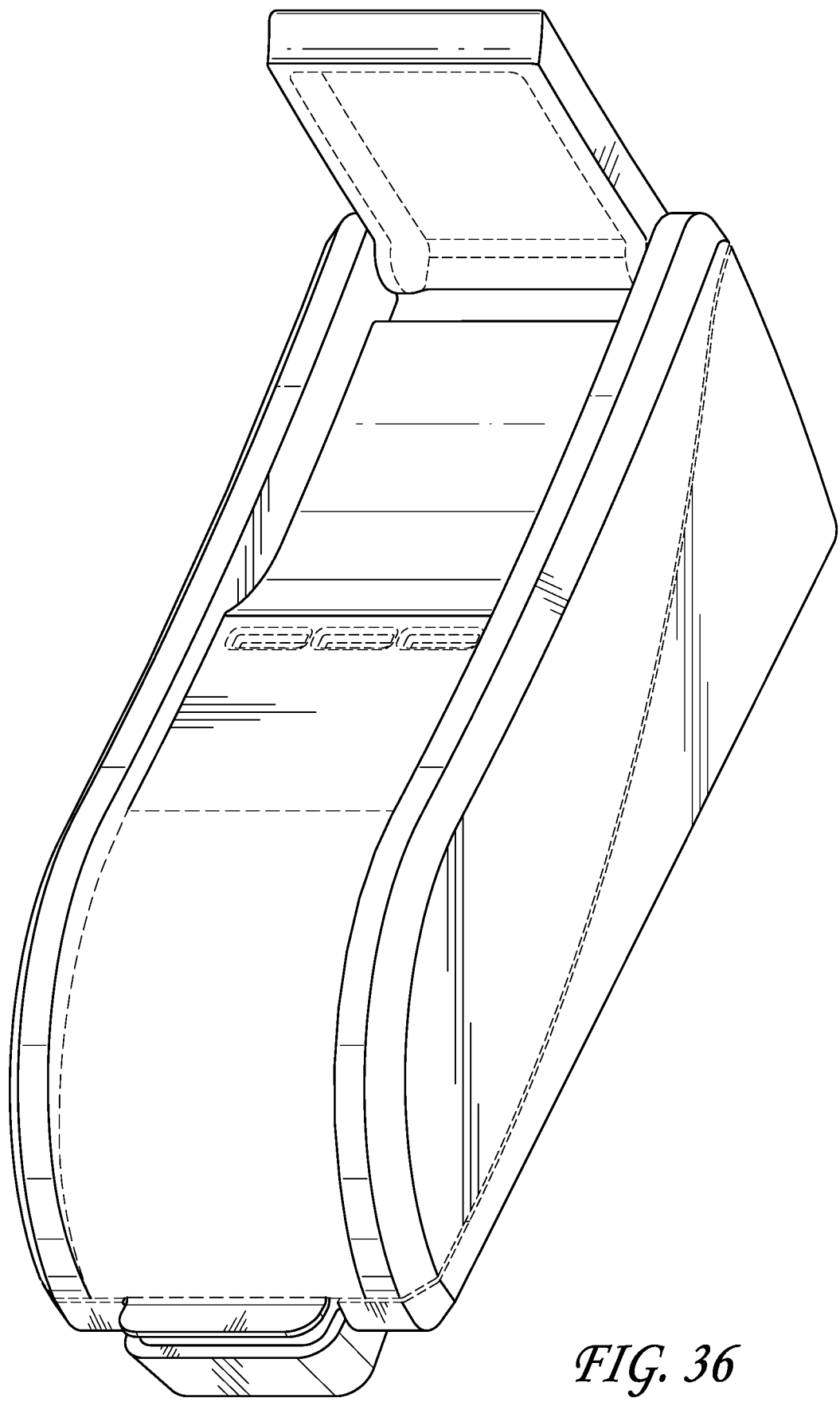
FIG. 36 is a top, front and side perspective view of the communications module of FIG. 30 with a lever in a raised position.
Figure 37:
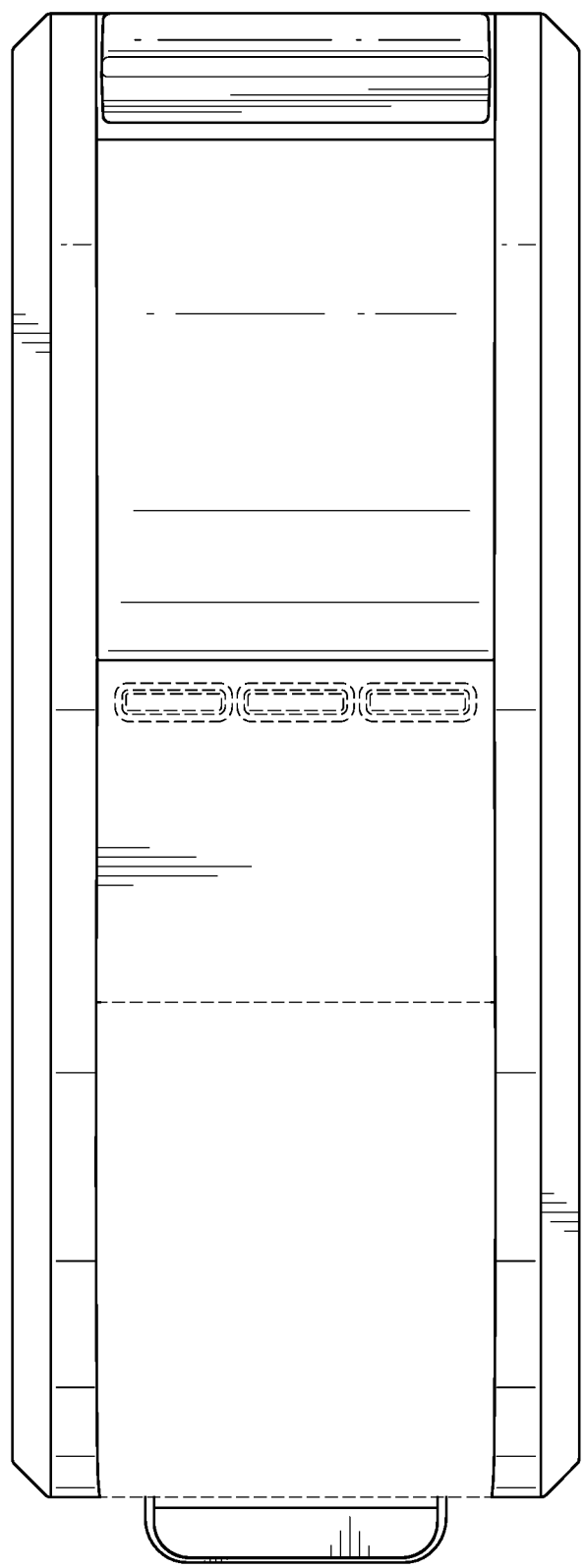
FIG. 37 is a top view of the communications module of FIG. 36.
Figure 38:
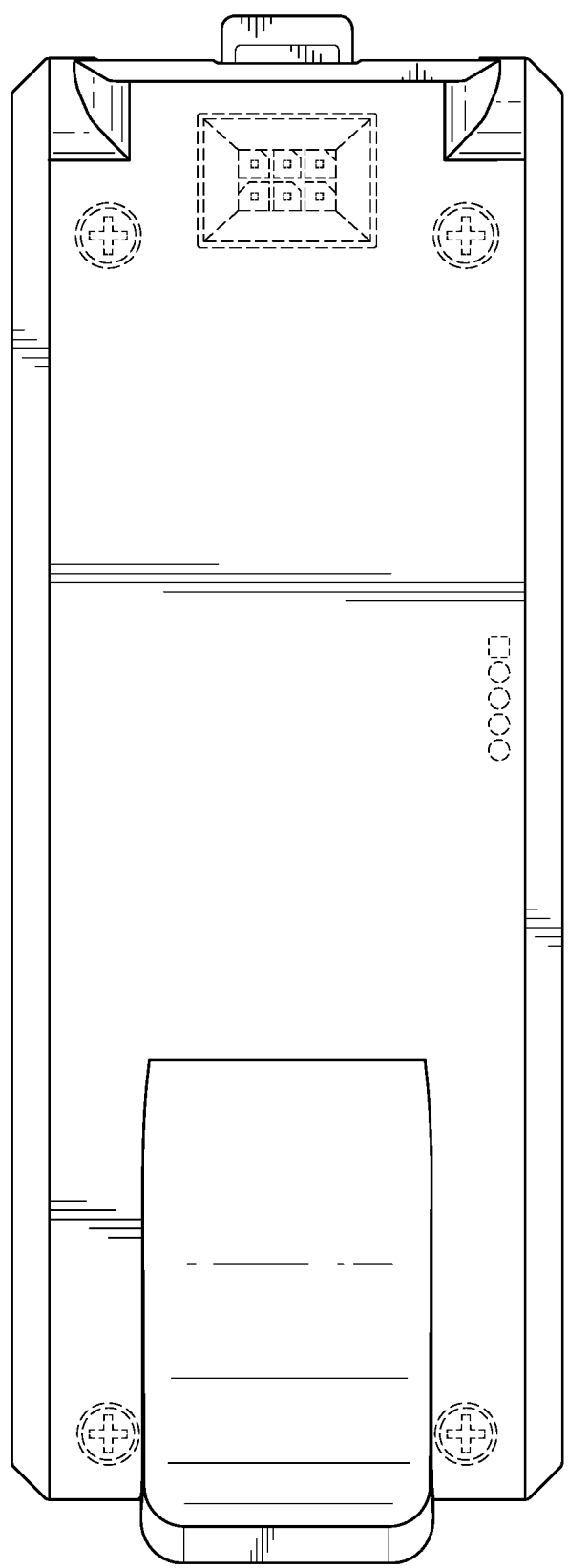
FIG. 38 is a bottom view of the communications module of FIG. 36.
Figure 39:
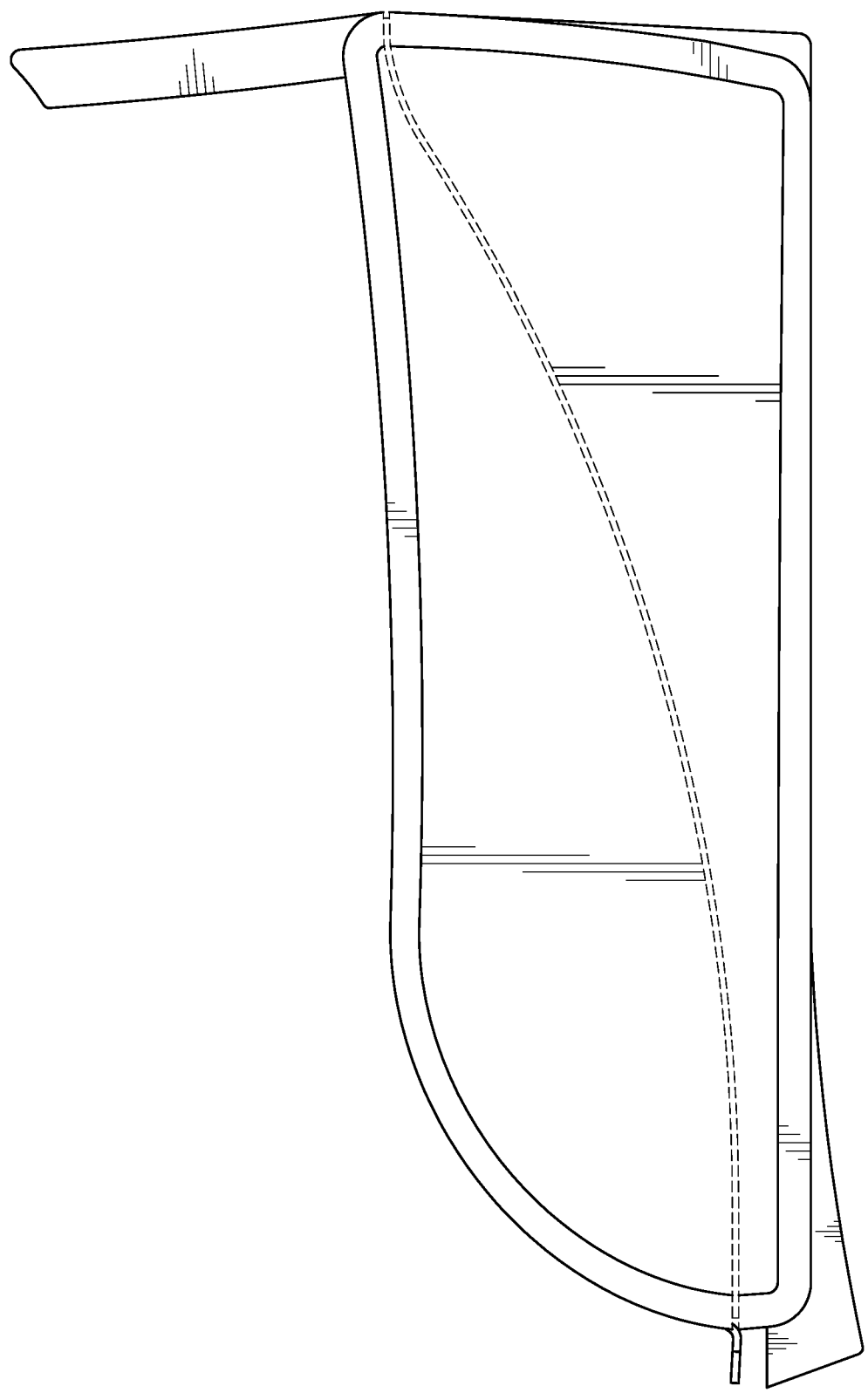
FIG. 39 is a first side view of the communications module of FIG. 36, the second side being a mirror image.
Figure 40:
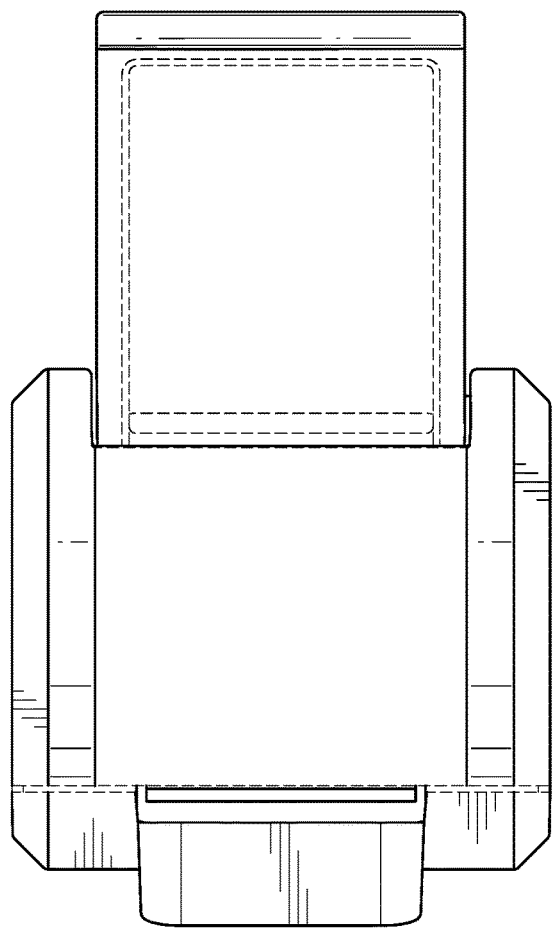
FIG. 40 is a front view of the communications module of FIG. 36.
Figure 41:
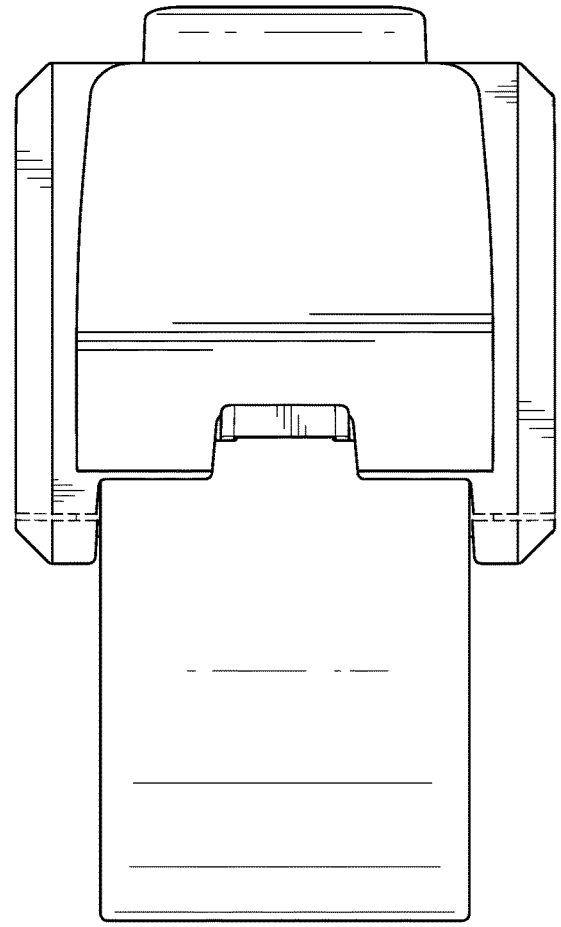
FIG. 41 is a back view of the communications module of FIG. 36.
Figure 42:
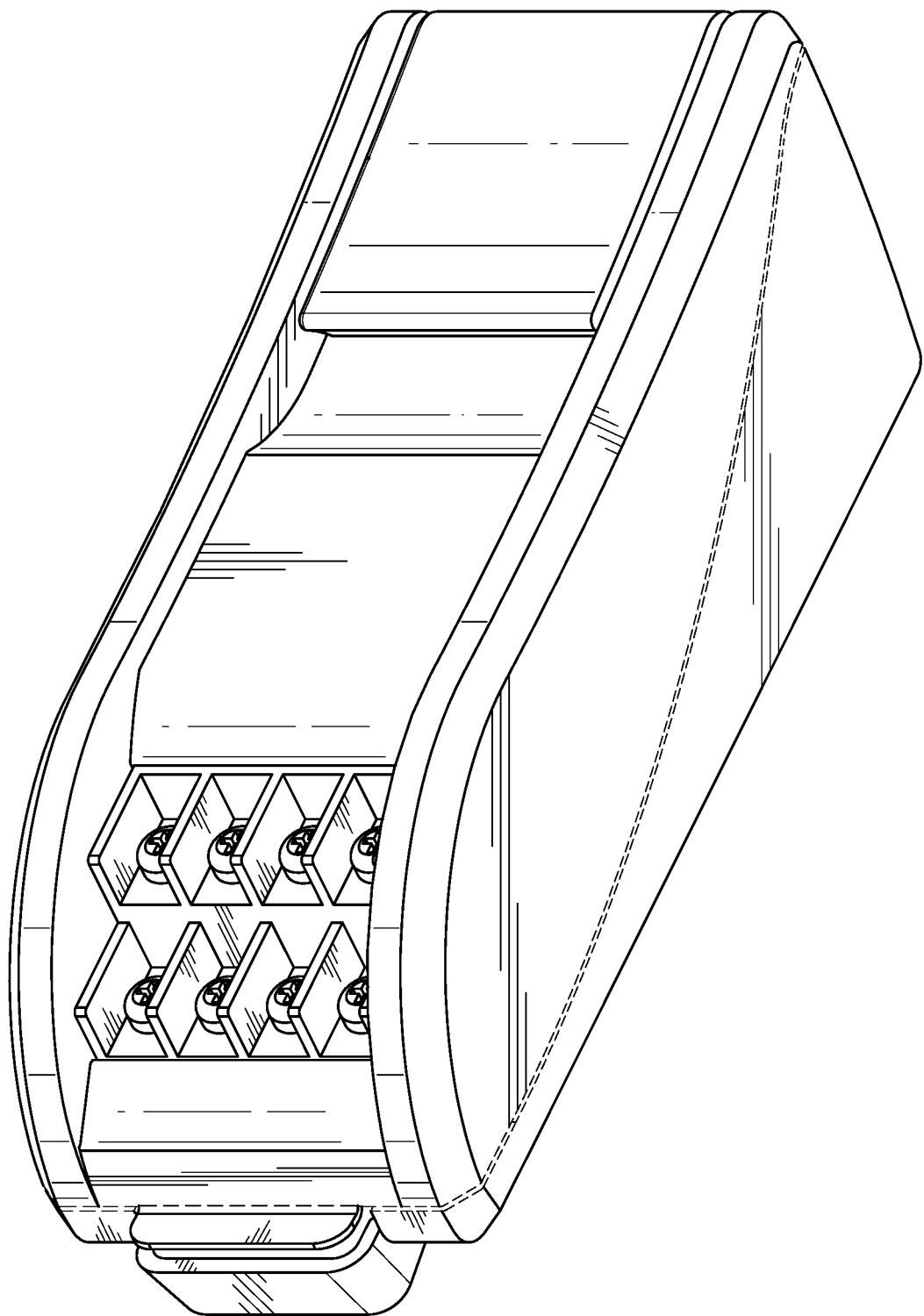
FIG. 42 is a top, front and side perspective view of a communications module embodying a new design, the bottom, back, and side views being the same as those of the communications module of FIG. 30.
Figure 43:
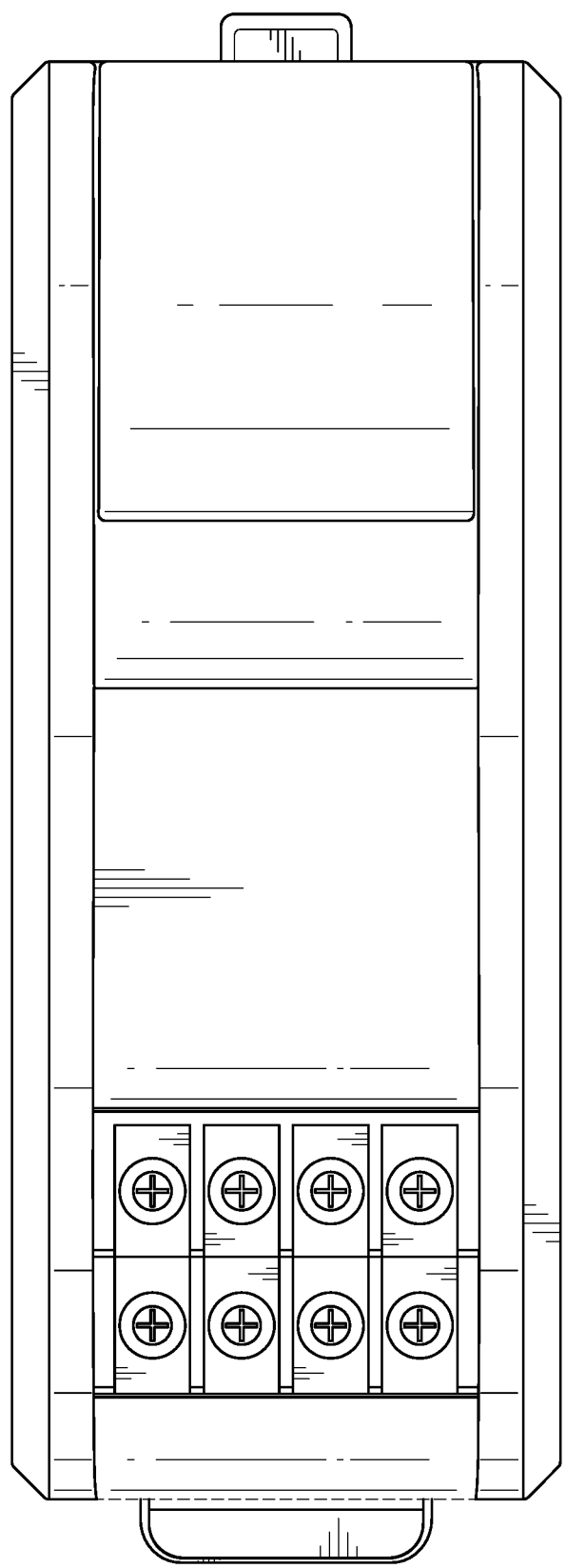
FIG. 43 is a top view of the communications module of FIG. 42.
Figure 44:
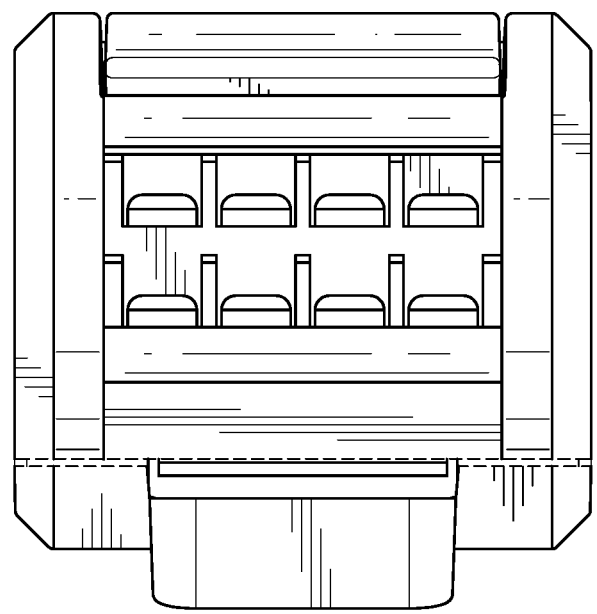
FIG. 44 is a front view of the communications module of FIG. 42.
Figure 45:
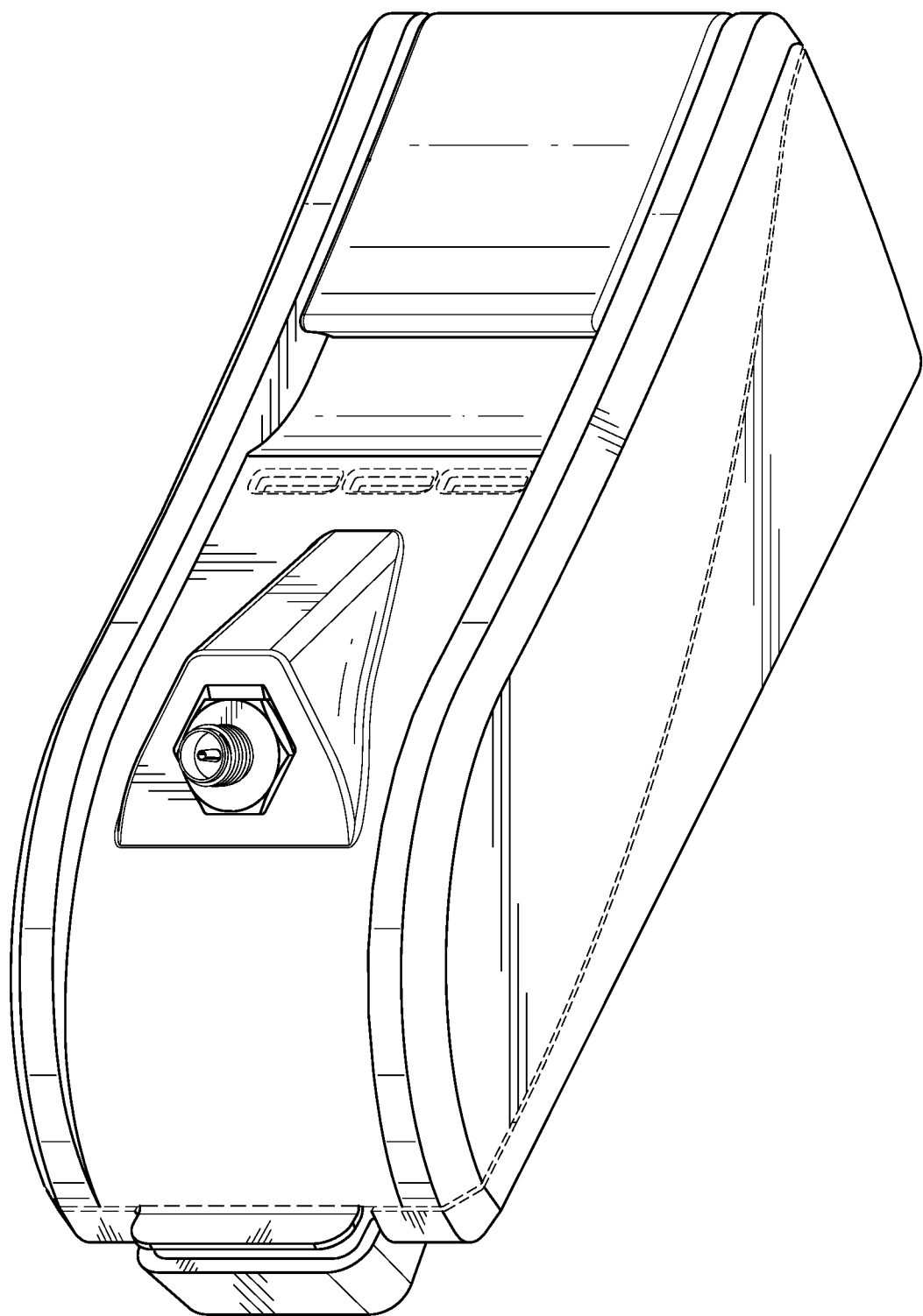
FIG. 45 is a top, front and side perspective view of a communications module embodying a new design, the bottom view being the same as the communications module of FIG. 30.
Figure 46:
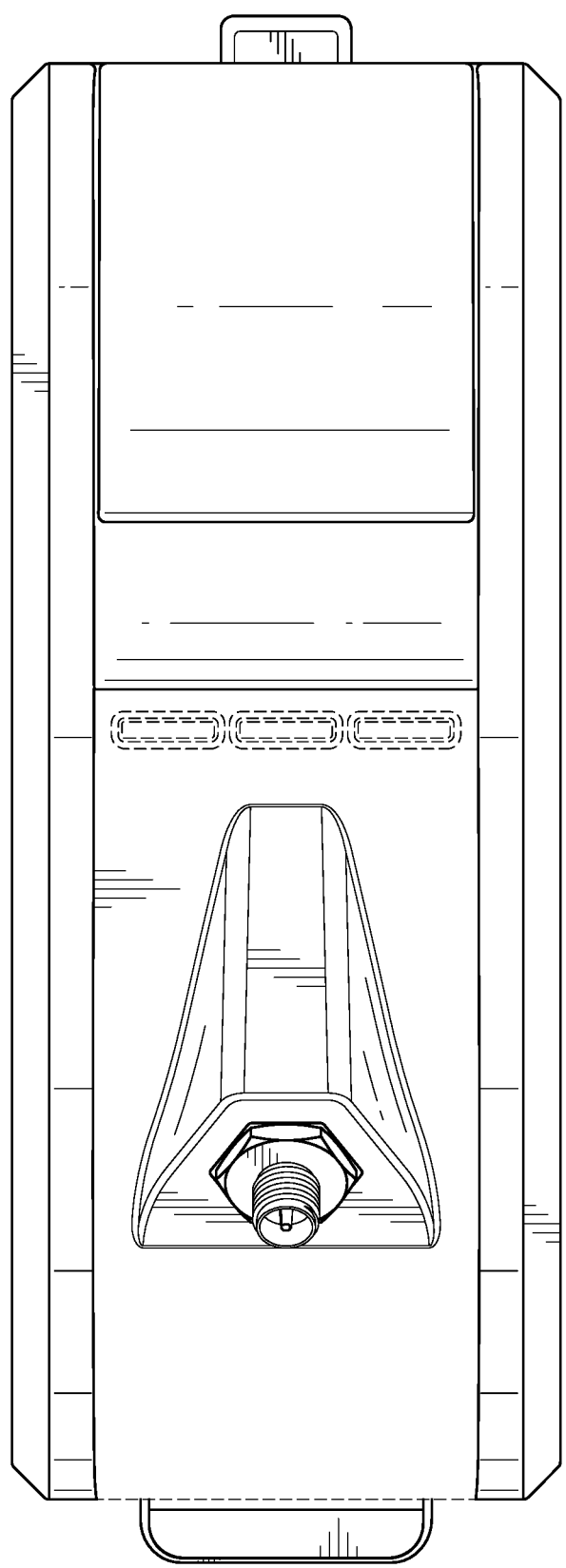
FIG. 46 is a top view of the communications module of FIG. 45.
Figure 47:
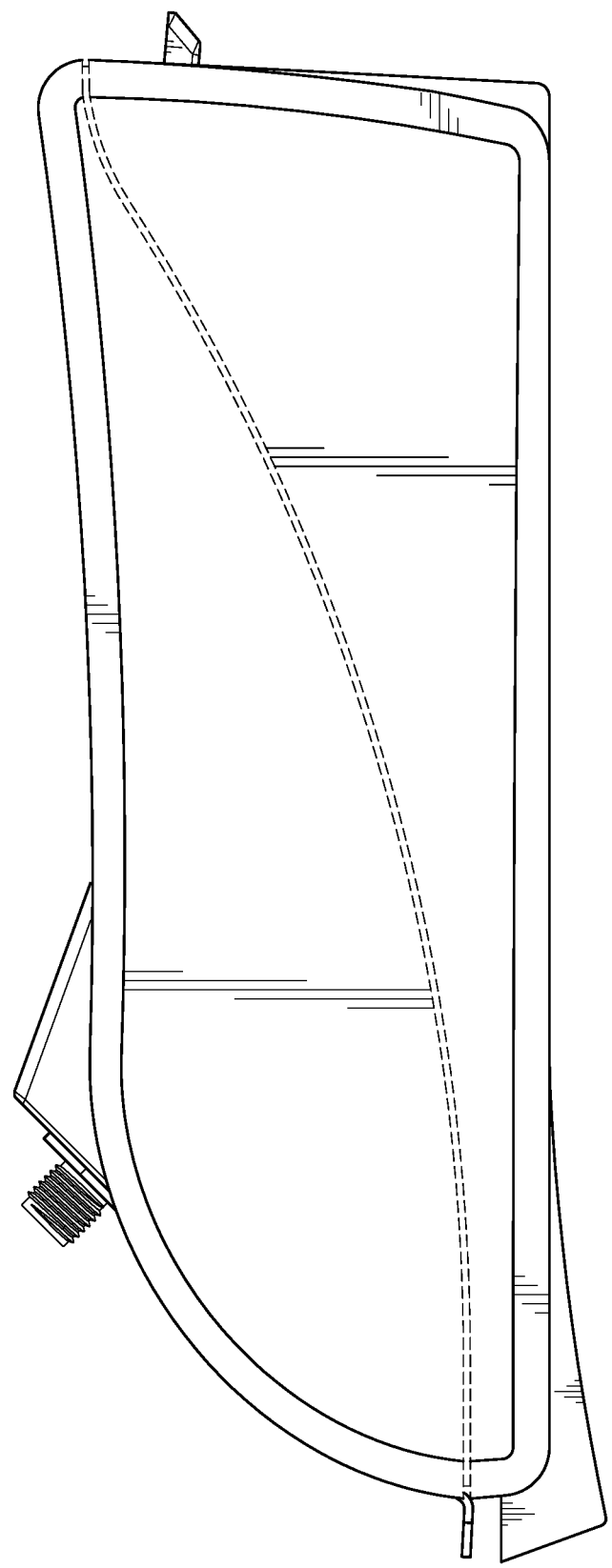
FIG. 47 is a first side view of the communications module of FIG. 45, the second side being a mirror image.
Figure 48:
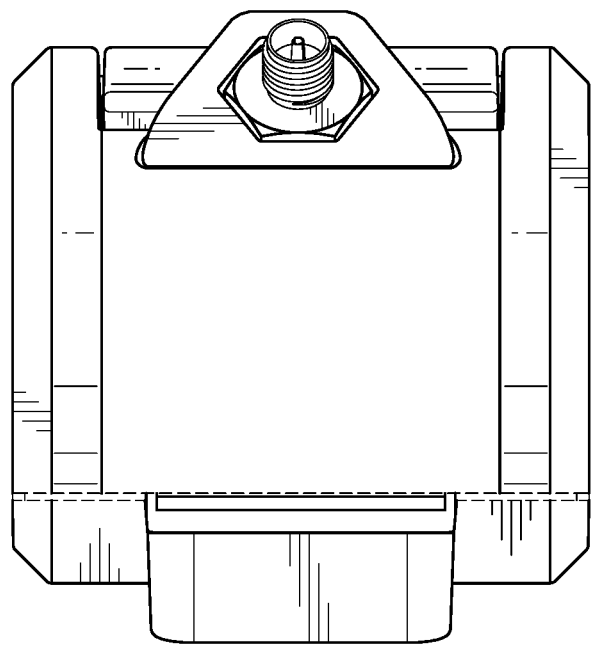
FIG. 48 is a front view of the communications module of FIG. 45.
Figure 49:
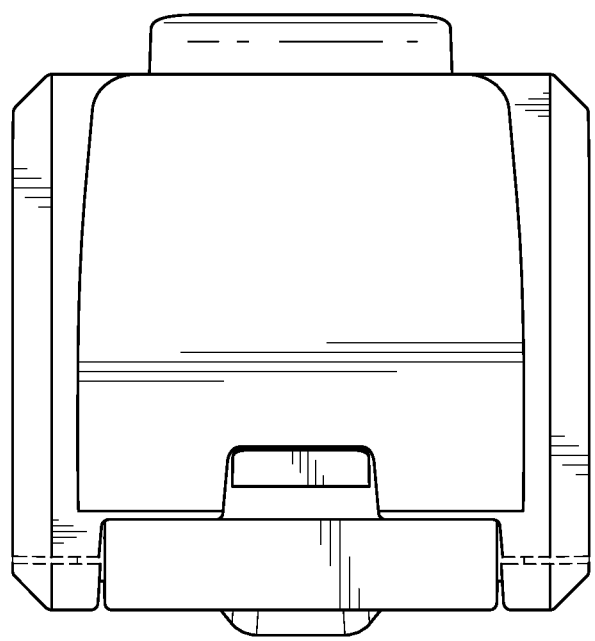
FIG. 49 is a back view of the communications module of FIG. 45.
Figure 50:
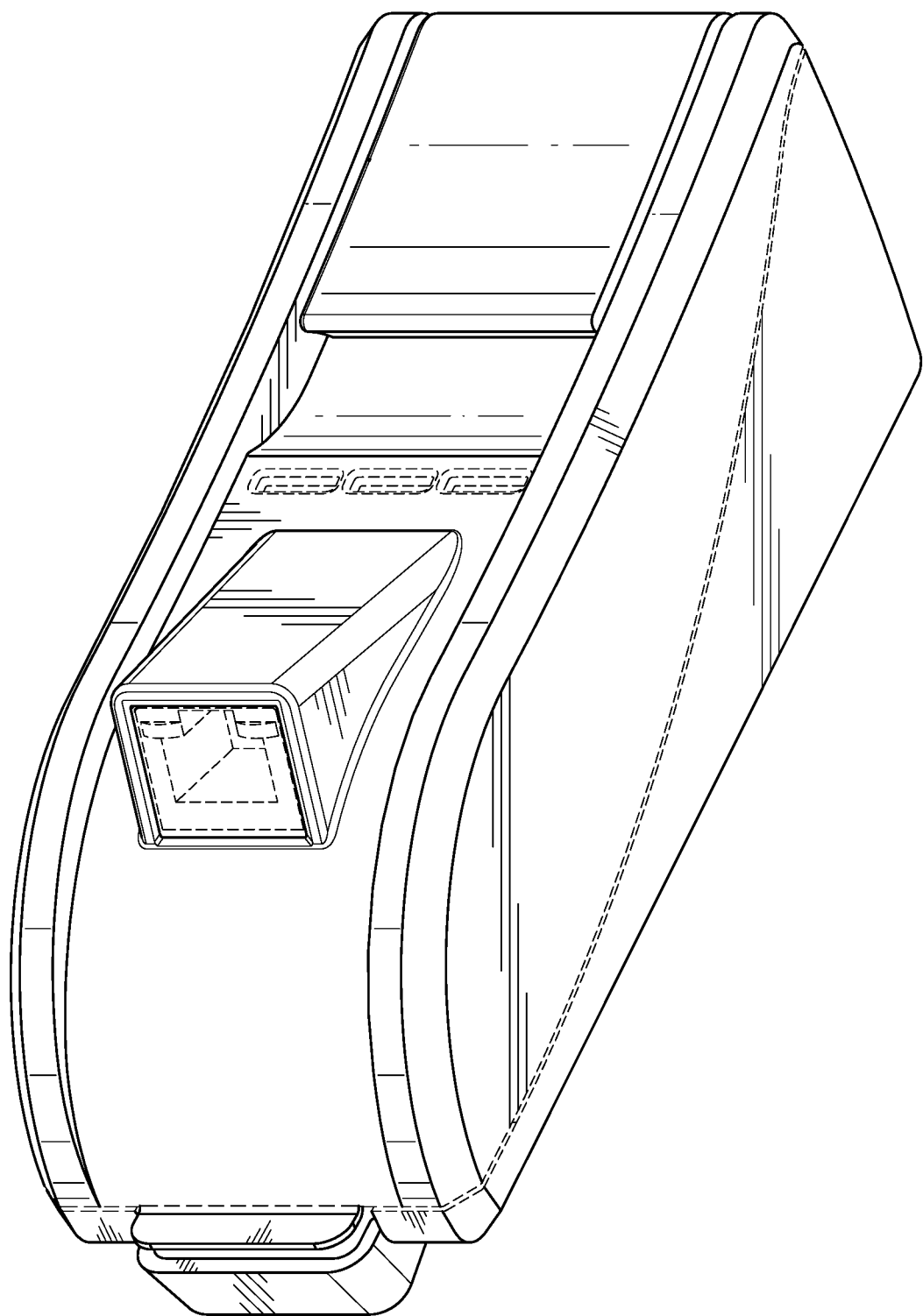
FIG. 50 is a top, front and side perspective view of a communications module embodying a new design, the bottom view being the same as the communications module of FIG. 30.
Figure 51:
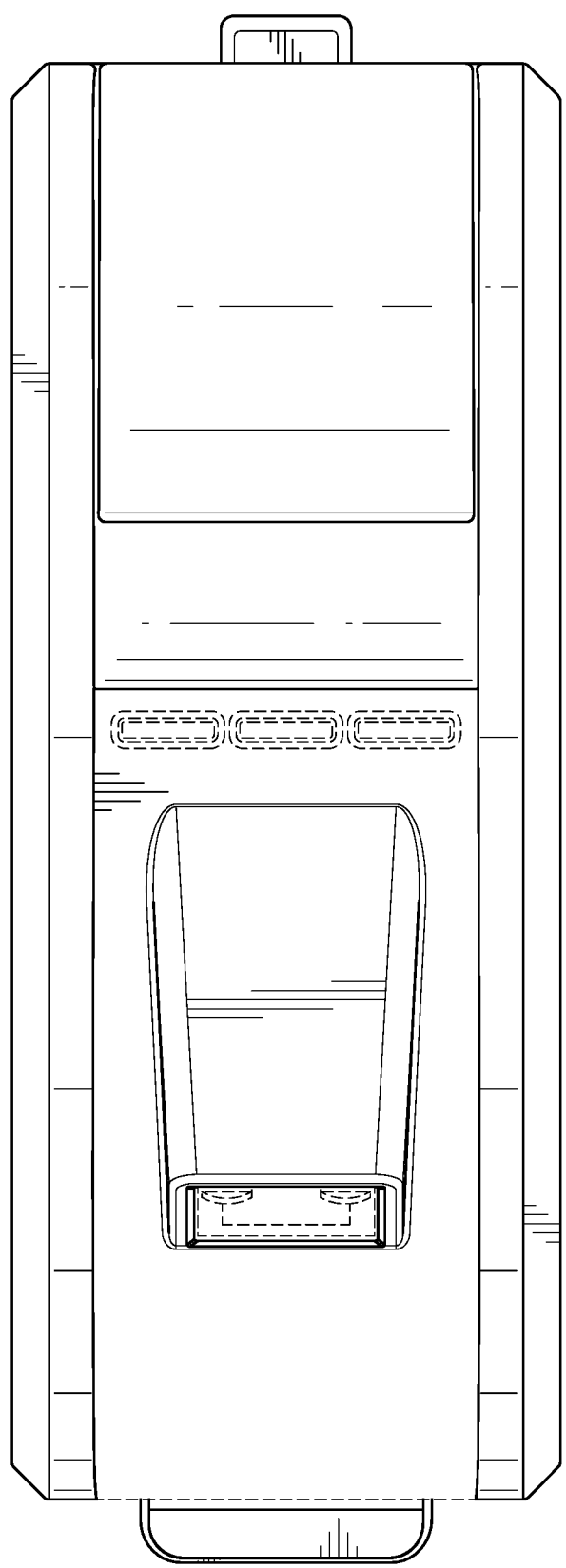
FIG. 51 is a top view of the communications module of FIG. 50.
Figure 52:
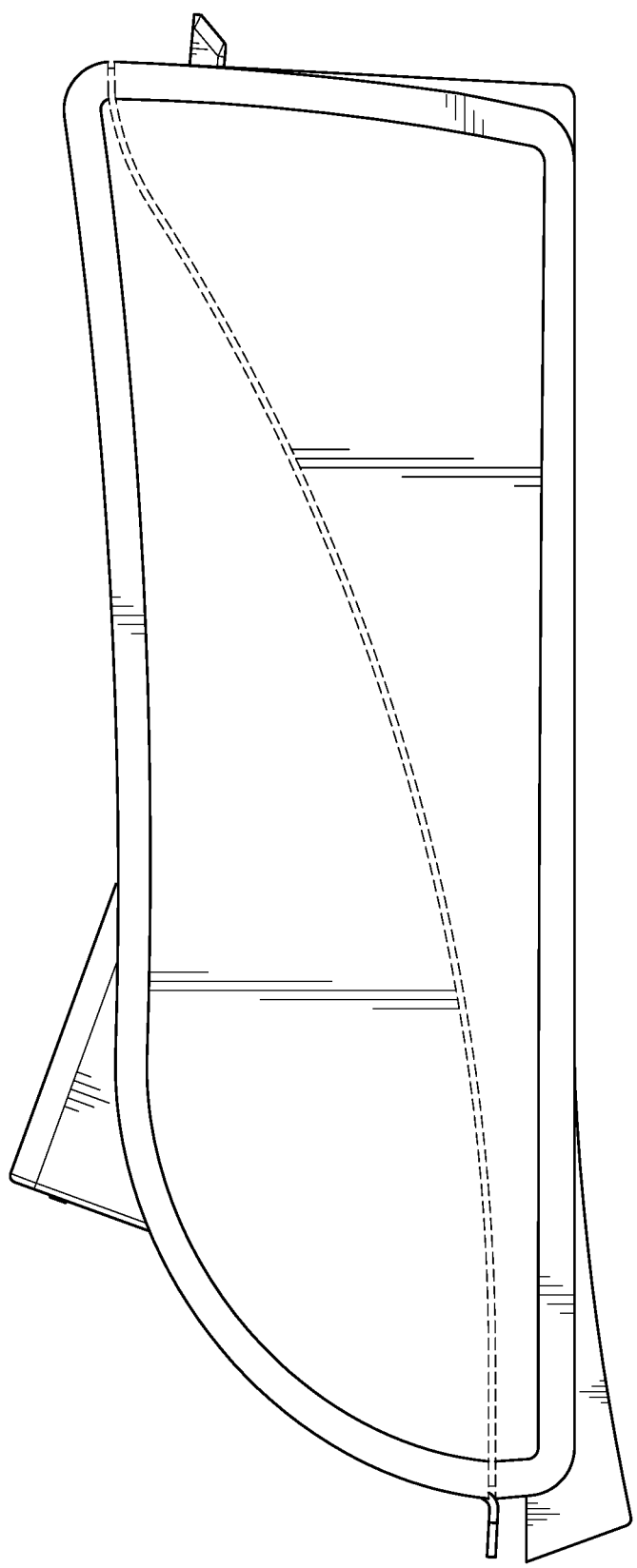
FIG. 52 is a first side view of the communications module of FIG. 50, the second side being a mirror image.
Figure 53:
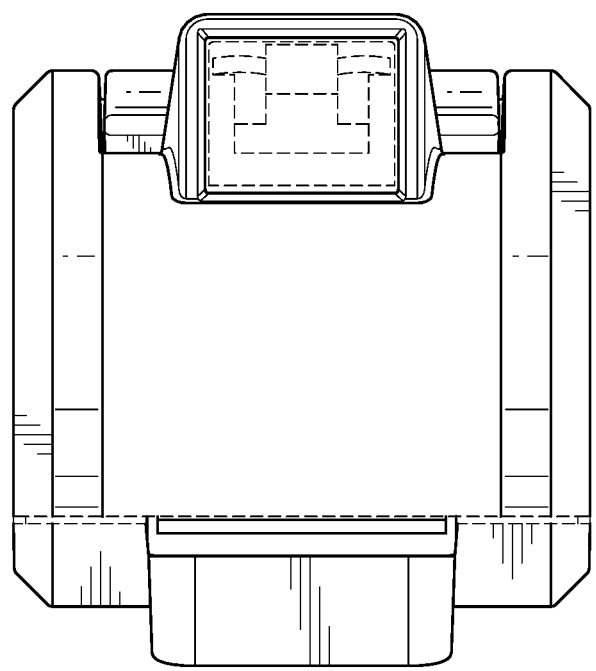
FIG. 53 is a front view of the communications module of FIG. 50.
Figure 54:
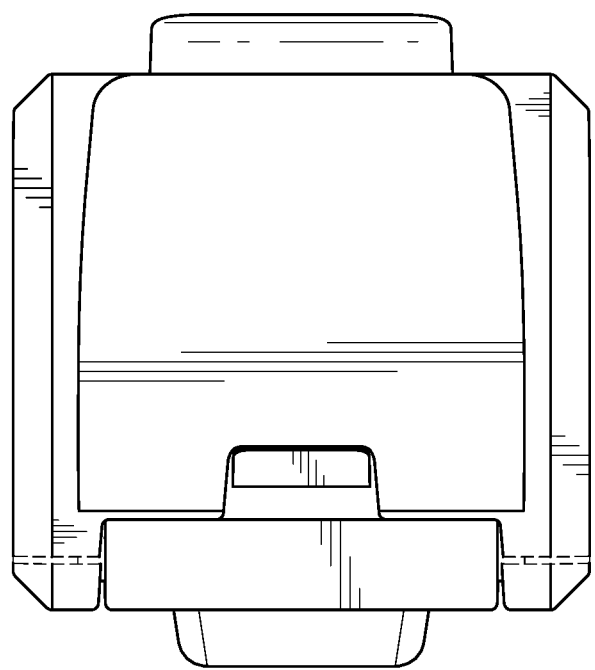
FIG. 54 is a back view of the communications module of FIG. 50.
Figure 55:
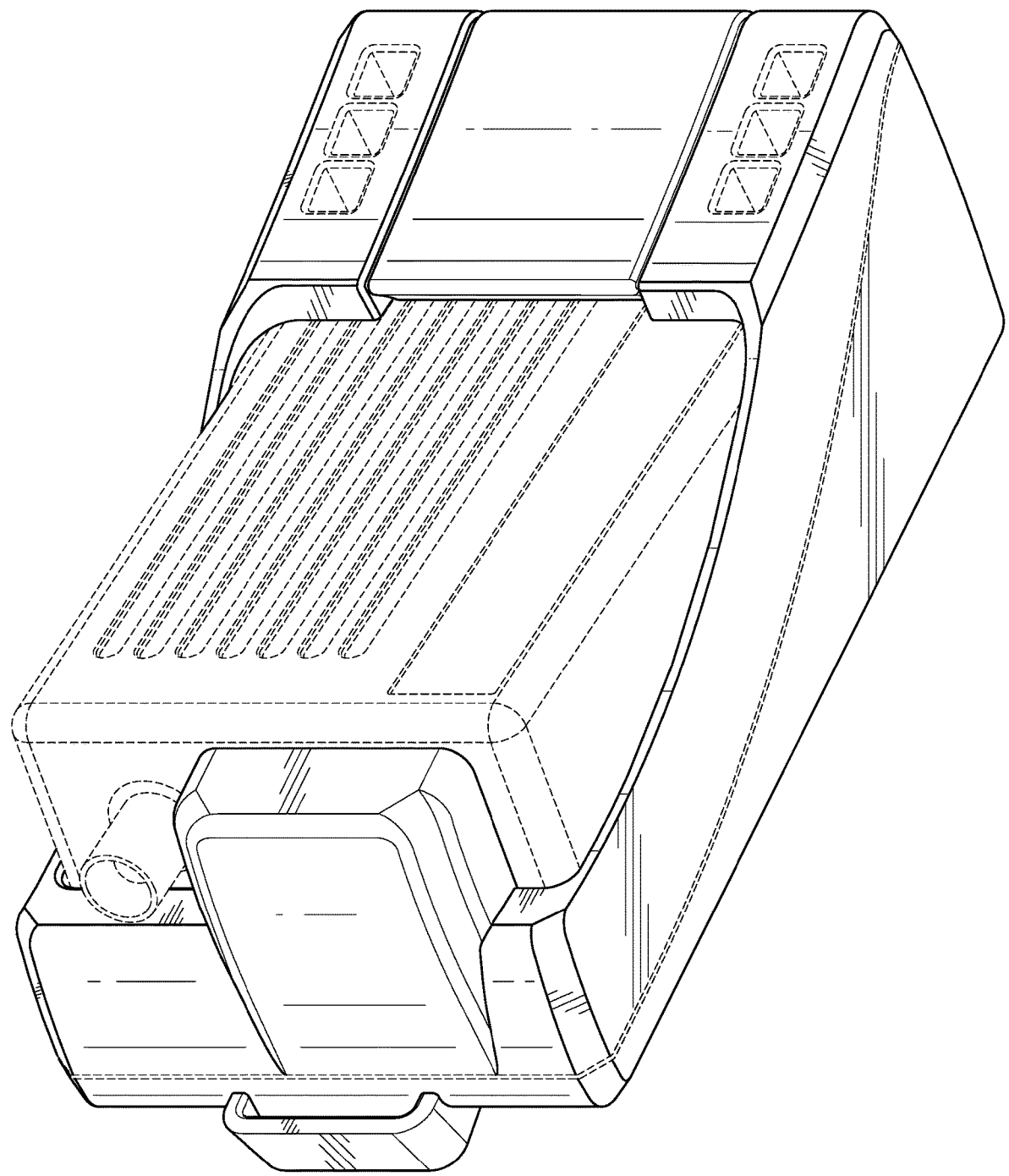
FIG. 55 is a top, front and side perspective view of a communications module embodying a new design.
Figure 56:
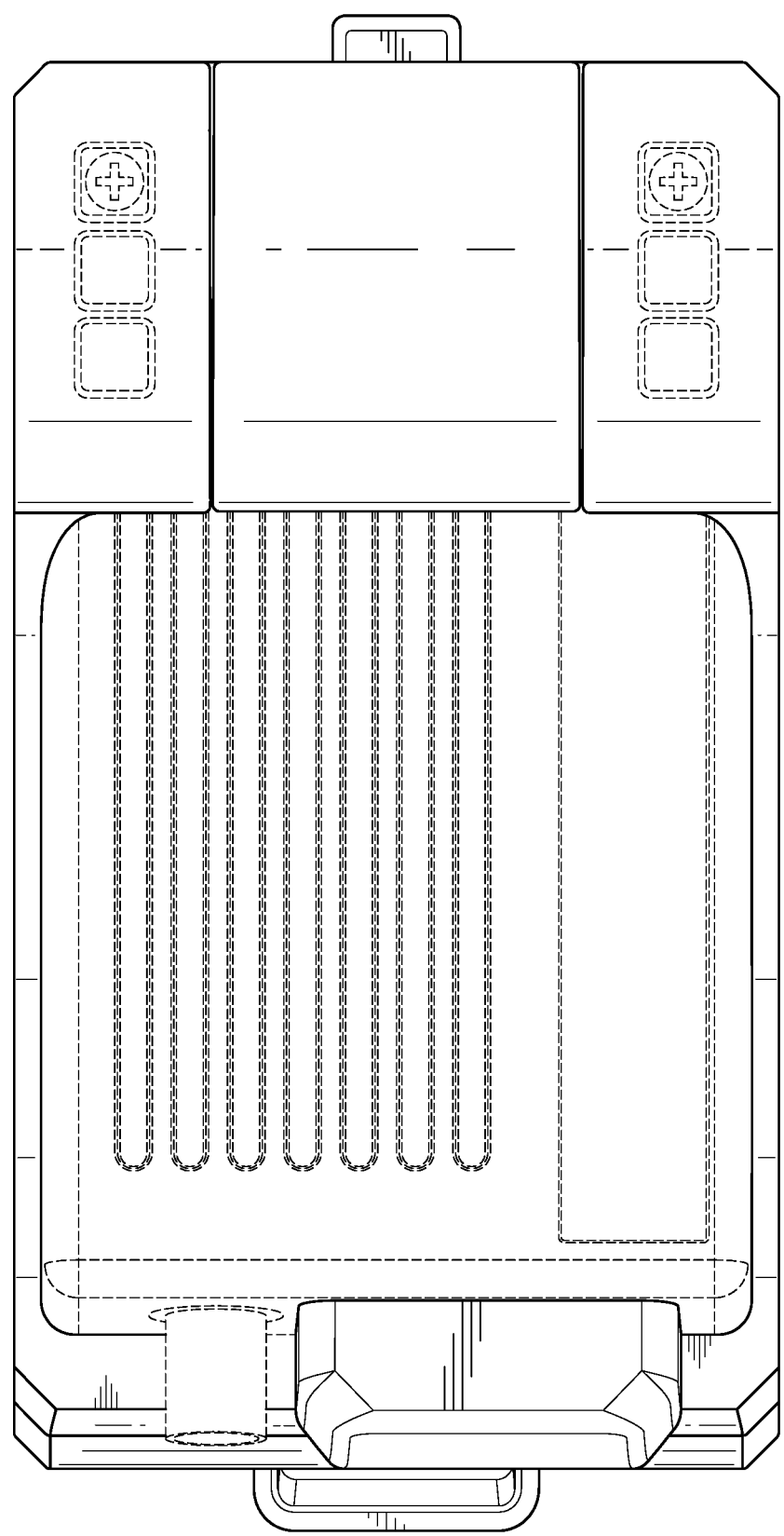
FIG. 56 is a top view of the communications module of FIG. 55.
Figure 57:
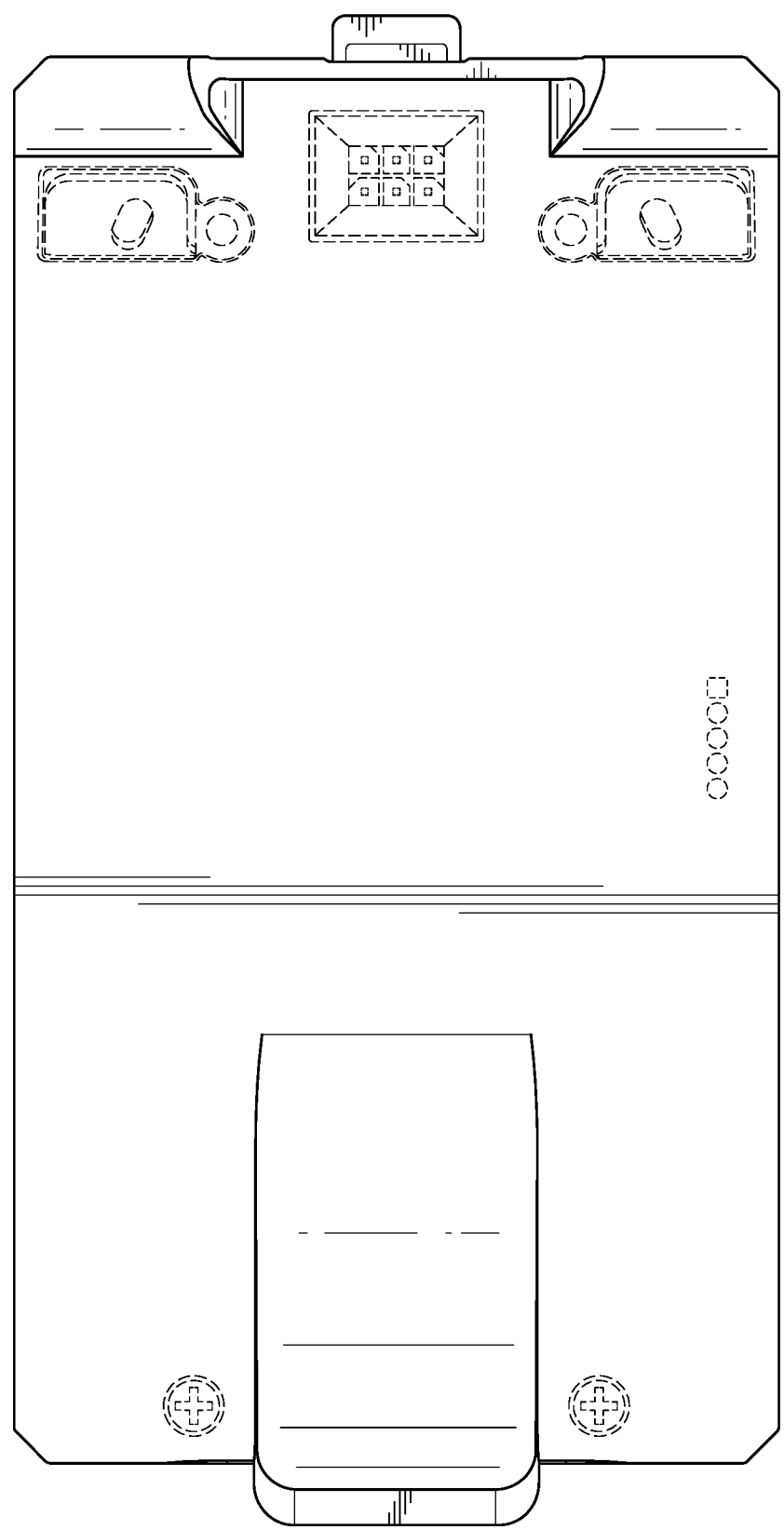
FIG. 57 is a bottom view of the communications module of FIG. 55.
Figure 58:
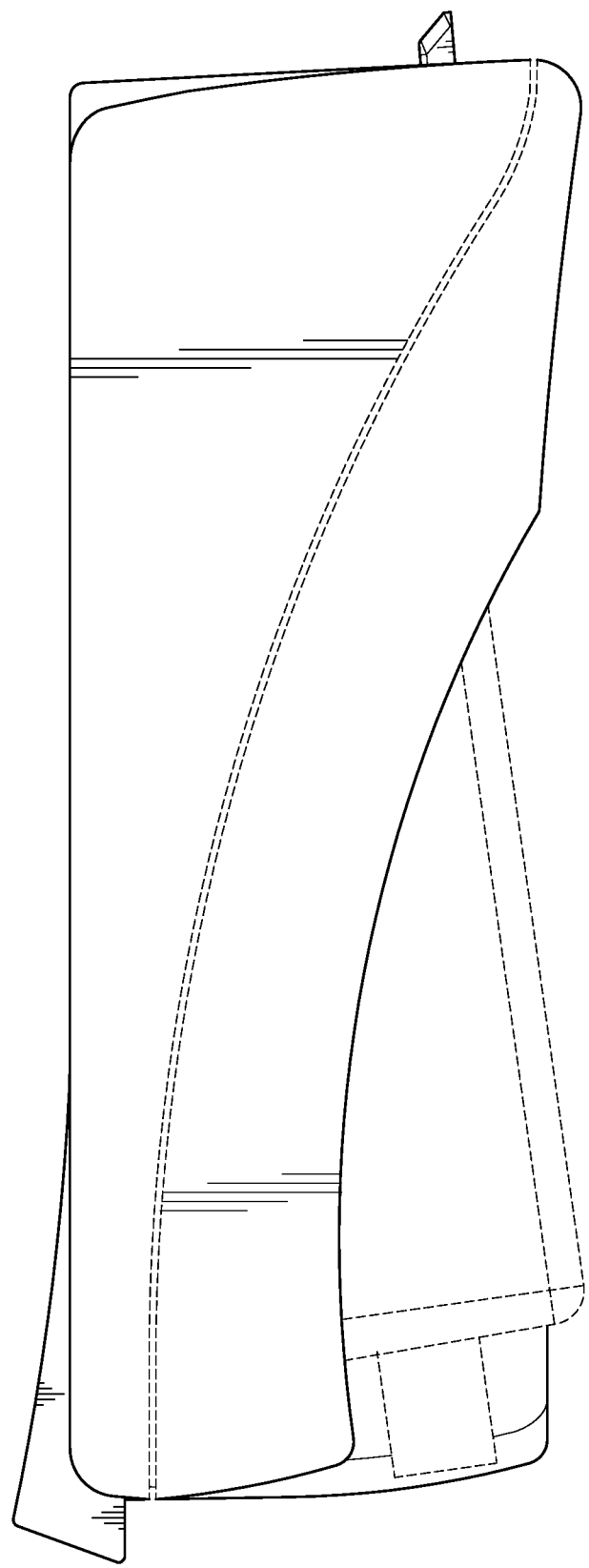
FIG. 58 is a side view of the communications module of FIG. 55.
Figure 59:
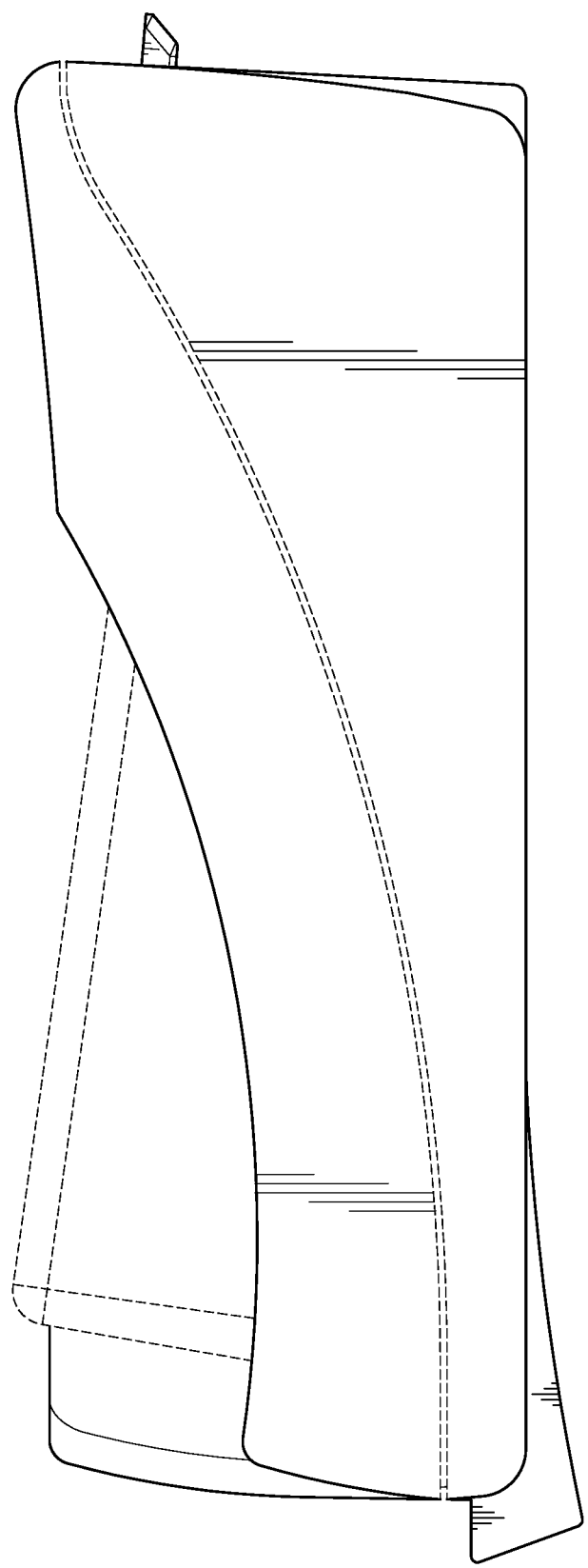
FIG. 59 is a side view of the communications module of FIG. 55 opposite the side view of FIG. 58.
Figure 60:
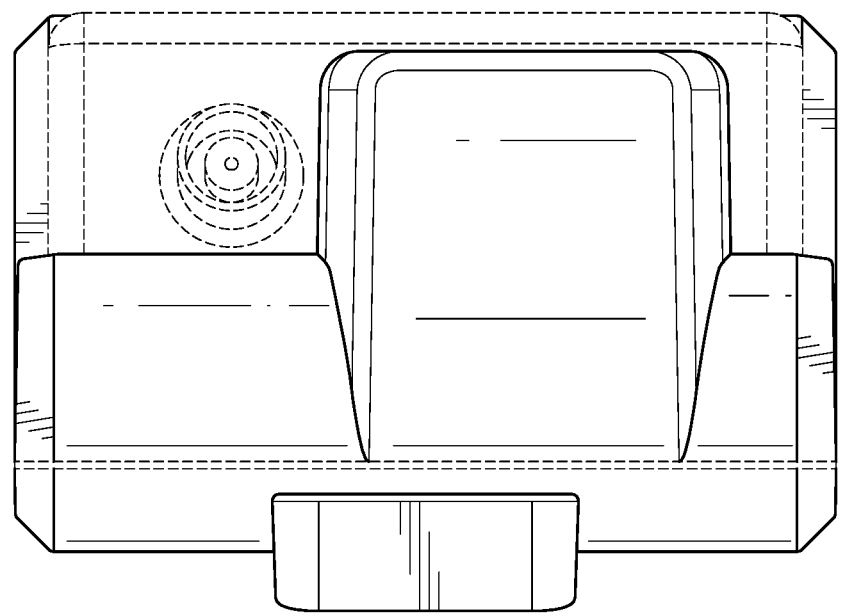
FIG. 60 is a front view of the communications module of FIG. 55.
Figure 61:
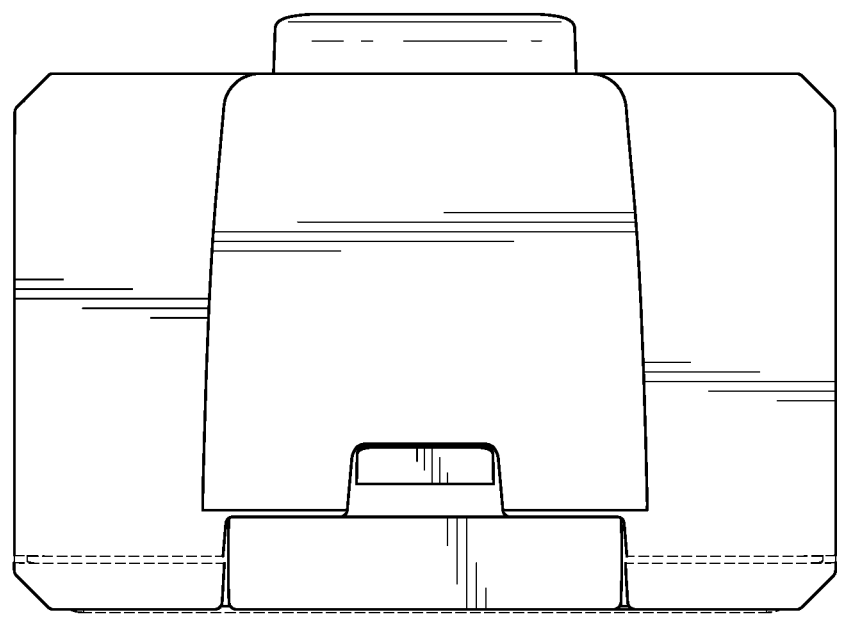
FIG. 61 is a back view of the communications module of FIG. 55.
Figure 62:
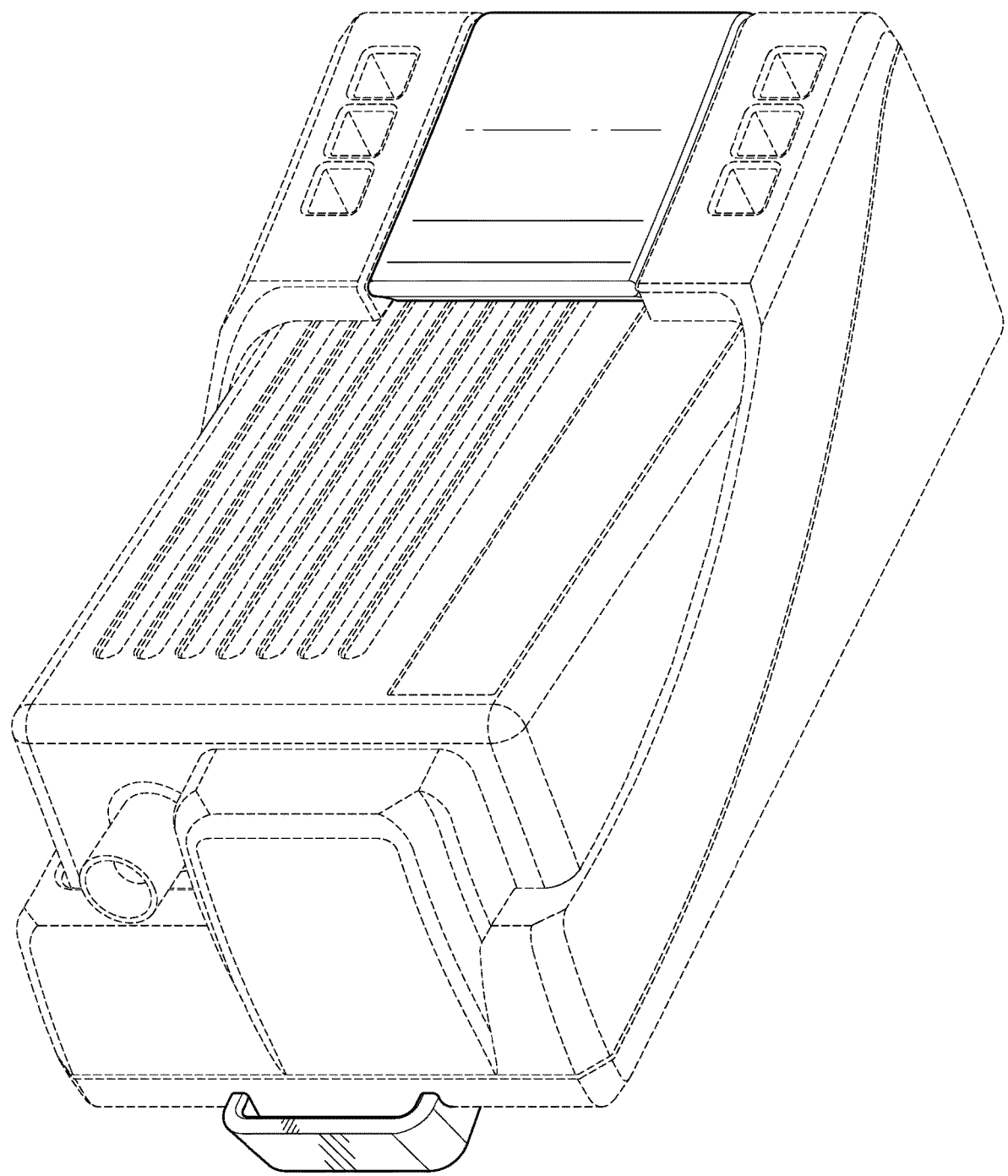
FIG. 62 is a top, front and side perspective view of a communications module embodying a new design.
Figure 63:
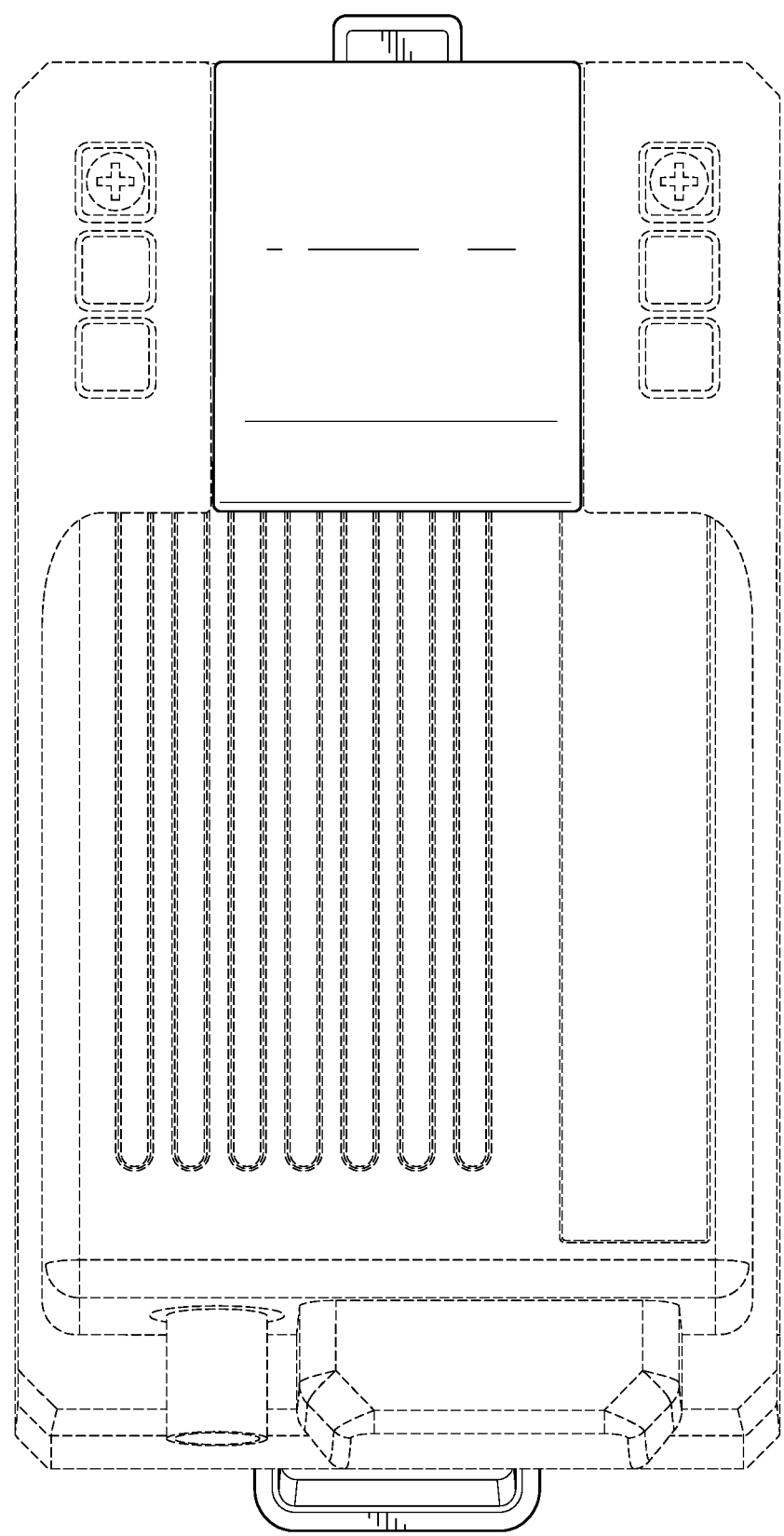
FIG. 63 is a top view of the communications module of FIG. 62.
Figure 64:
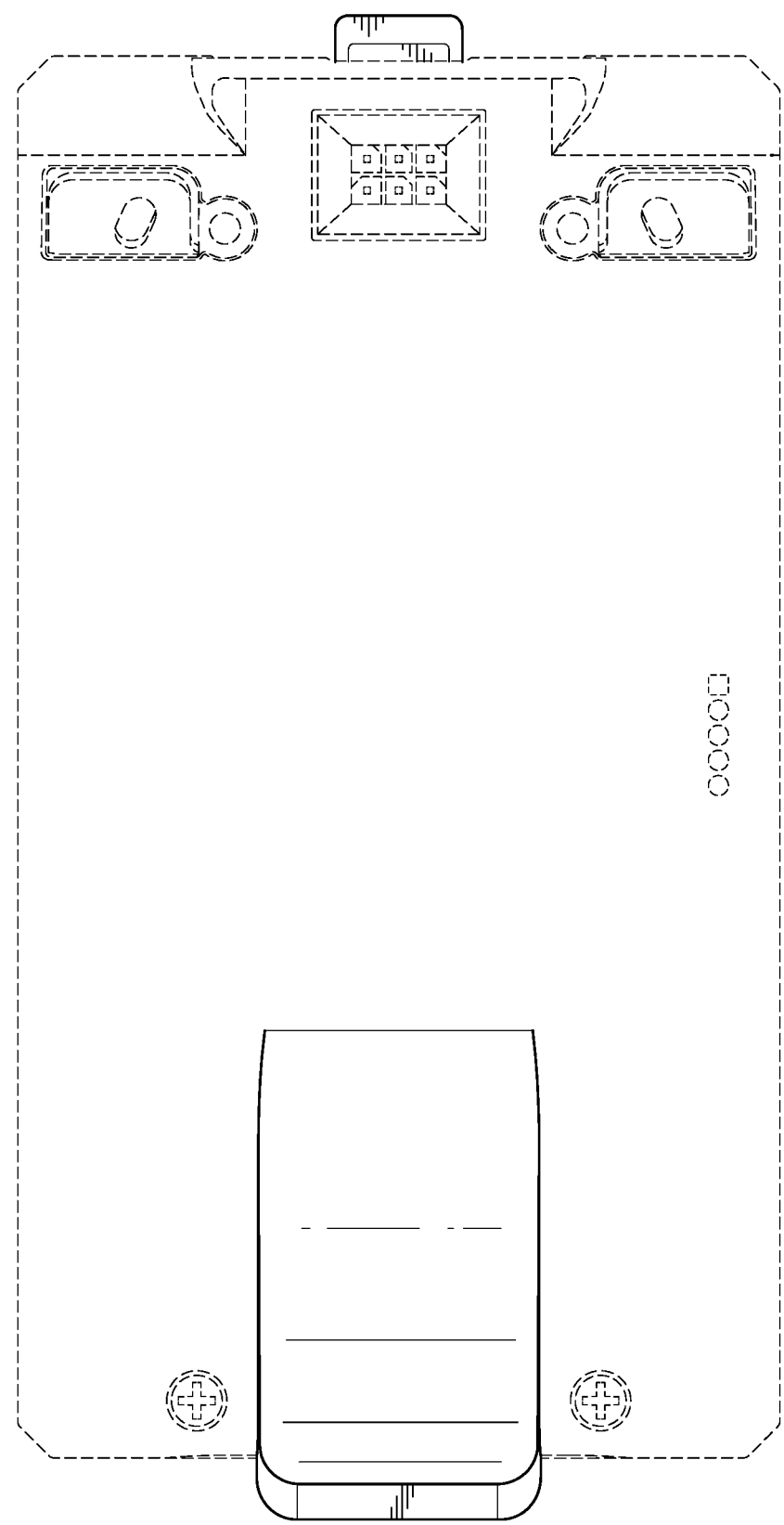
FIG. 64 is a bottom view of the communications module of FIG. 62.
Figure 65:
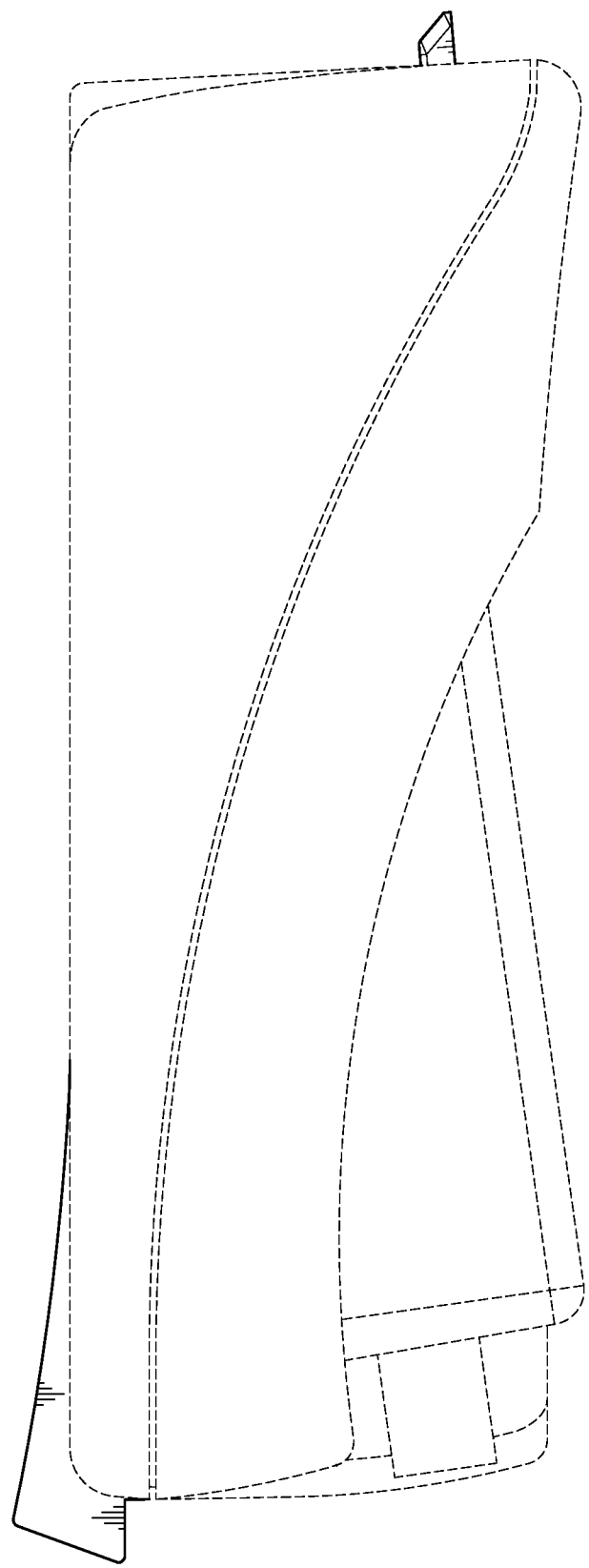
FIG. 65 is a side view of the communications module of FIG. 62.
Figure 66:
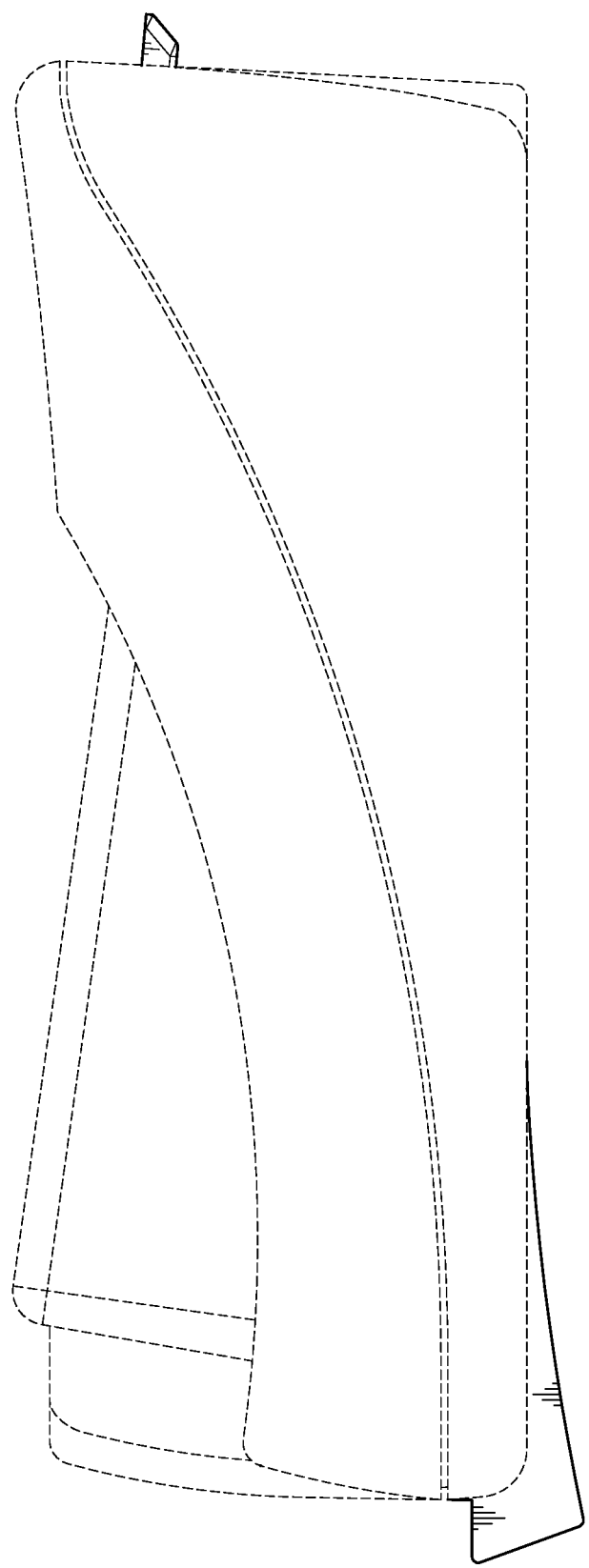
FIG. 66 is a side view of the communications module of FIG. 62 opposite the side view of FIG. 65.
Figure 67:
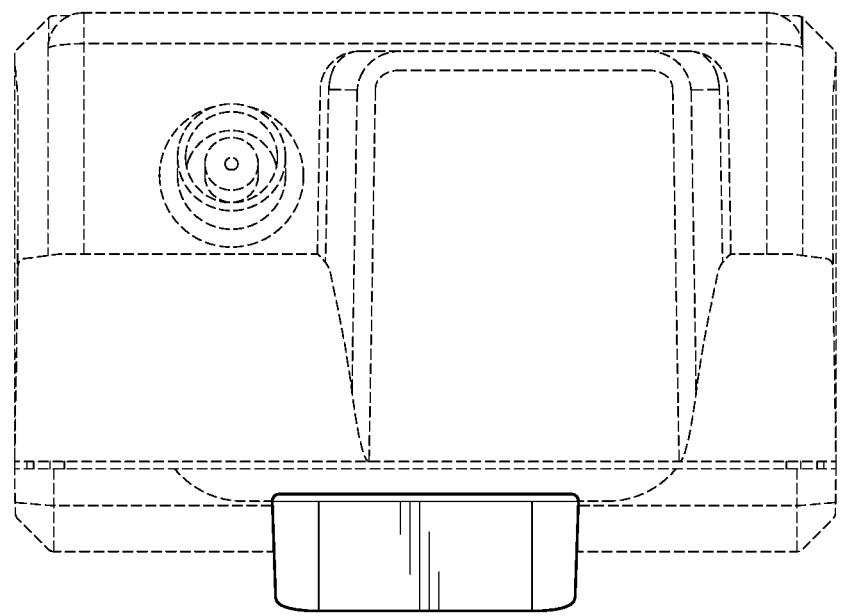
FIG. 67 is a front view of the communications module of FIG. 62.
Figure 68:
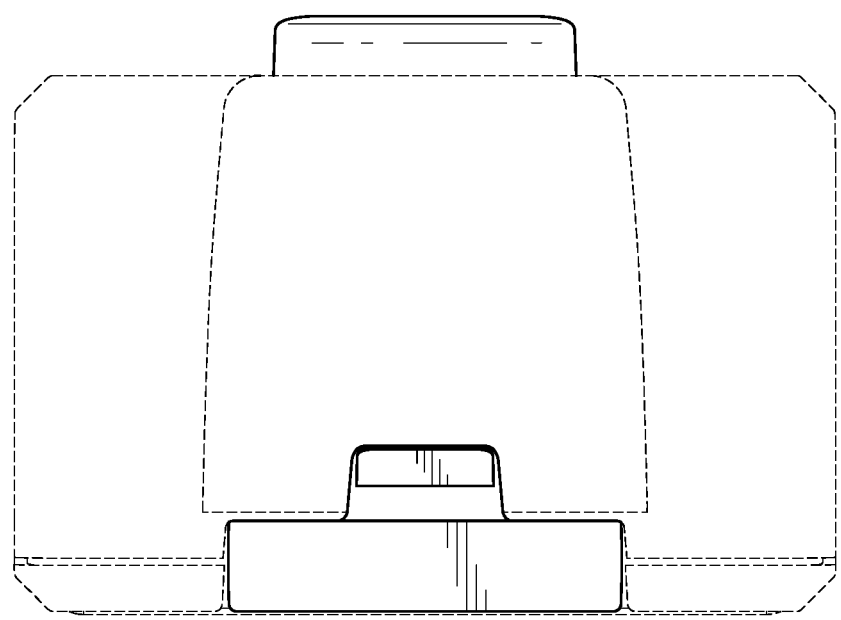
FIG. 68 is a back view of the communications module of FIG. 62.
Figure 69:
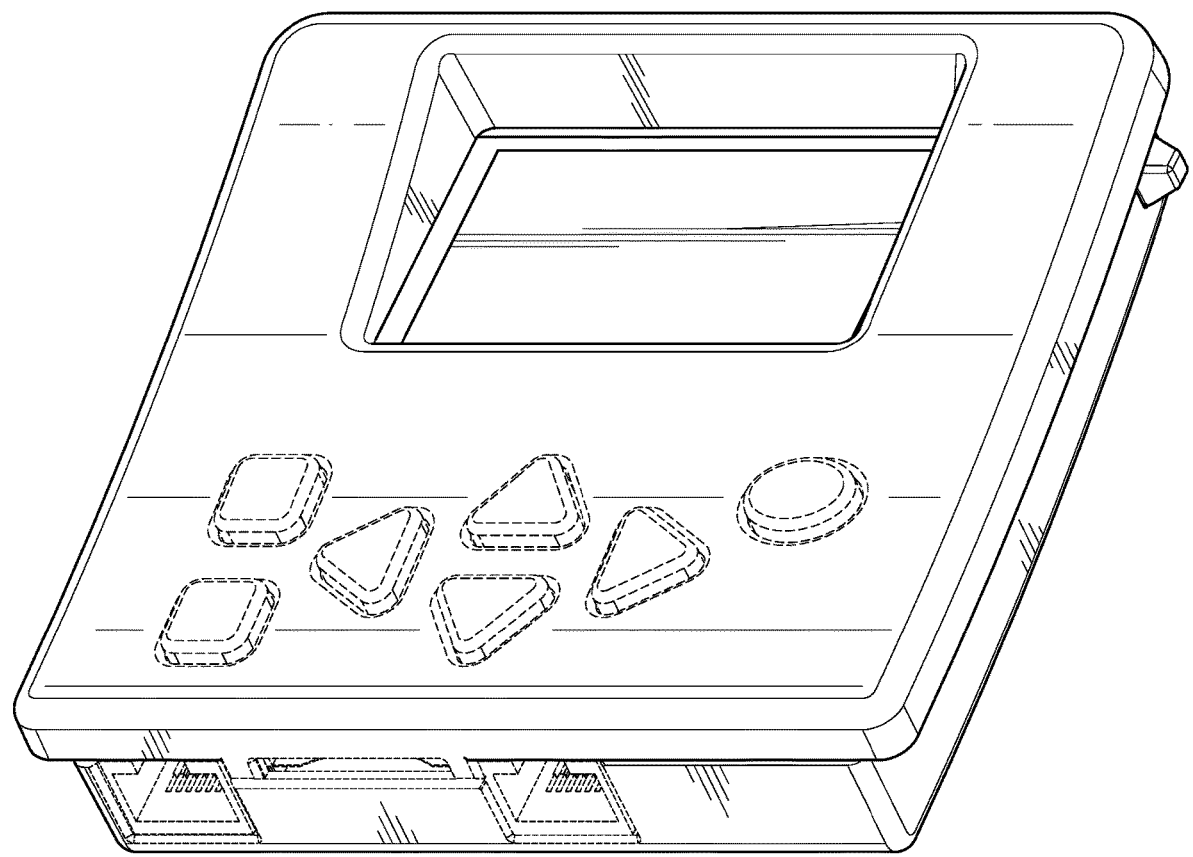
FIG. 69 is a top, front and side perspective view of a facepack embodying a new design.
Figure 70:
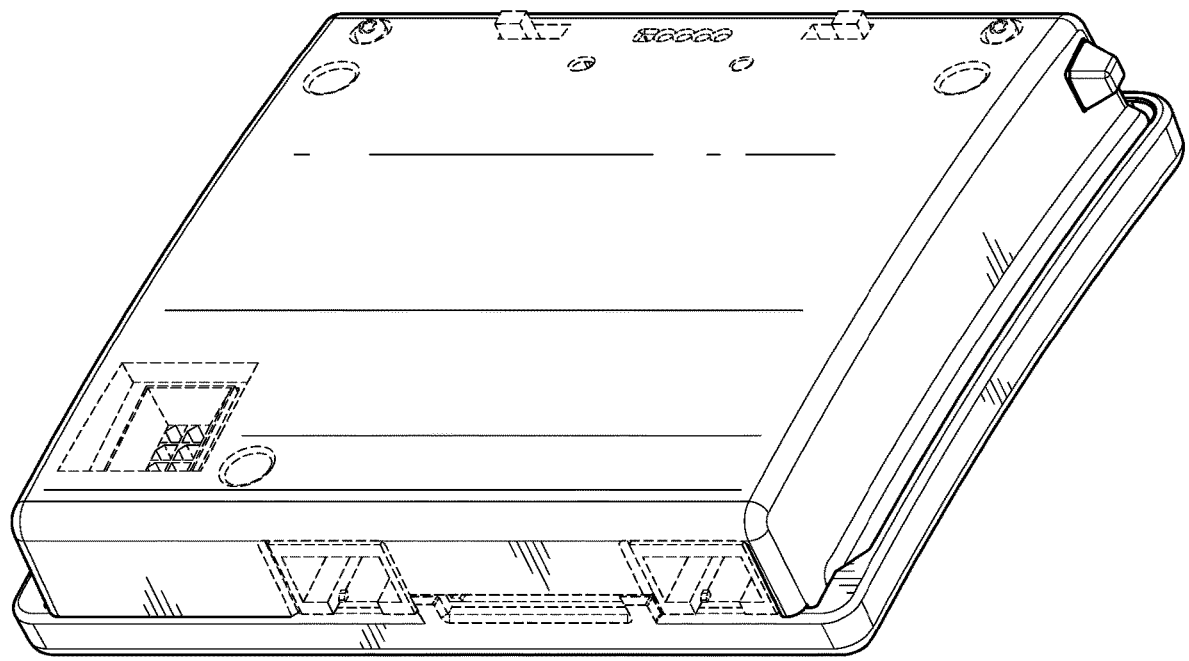
FIG. 70 is a bottom, front and side perspective view of the facepack of FIG. 69.
Figure 71:
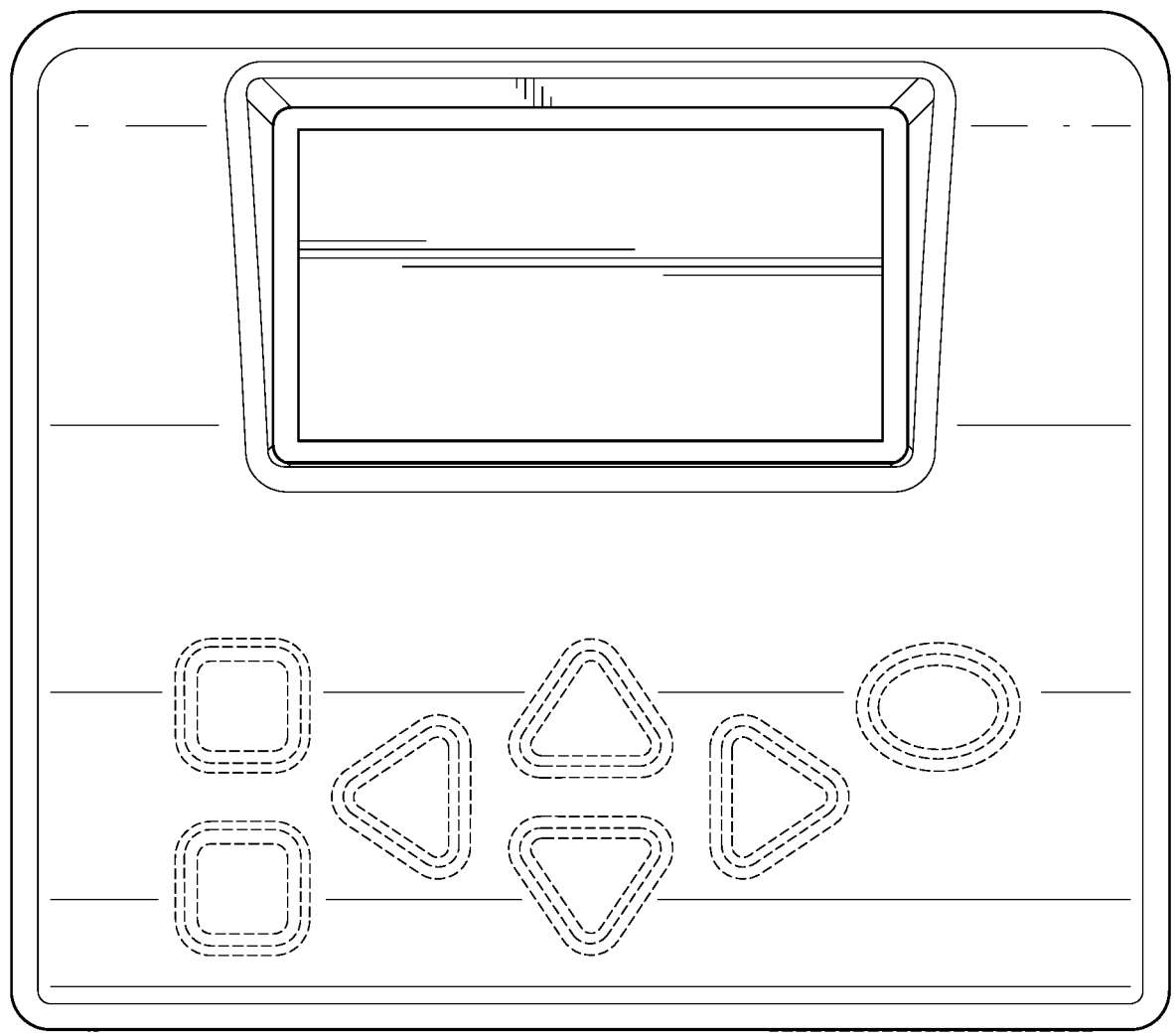
FIG. 71 is a top view of the facepack of FIG. 69.
Figure 72:
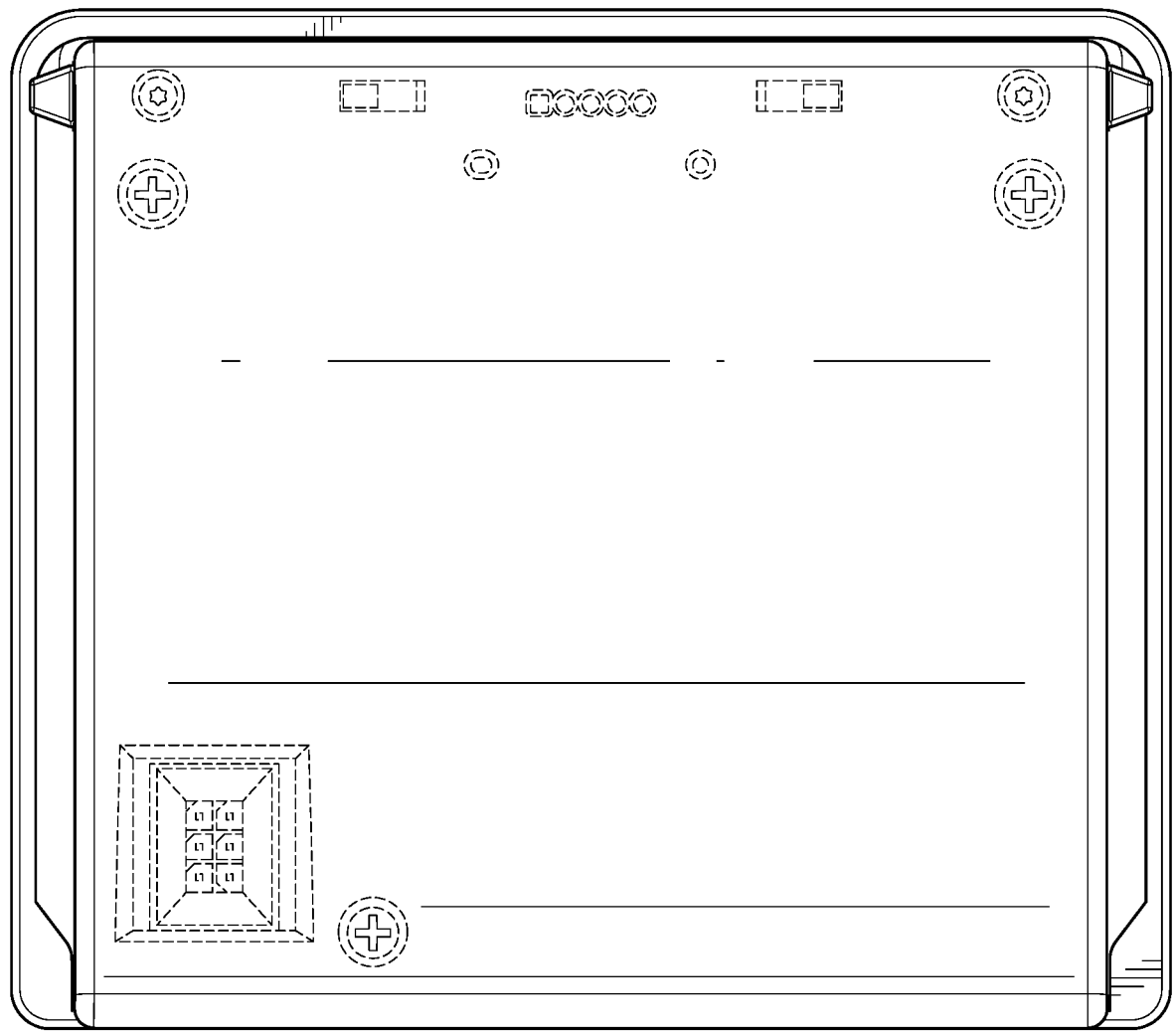
FIG. 72 is a bottom view of the facepack of FIG. 69.
Figure 73:
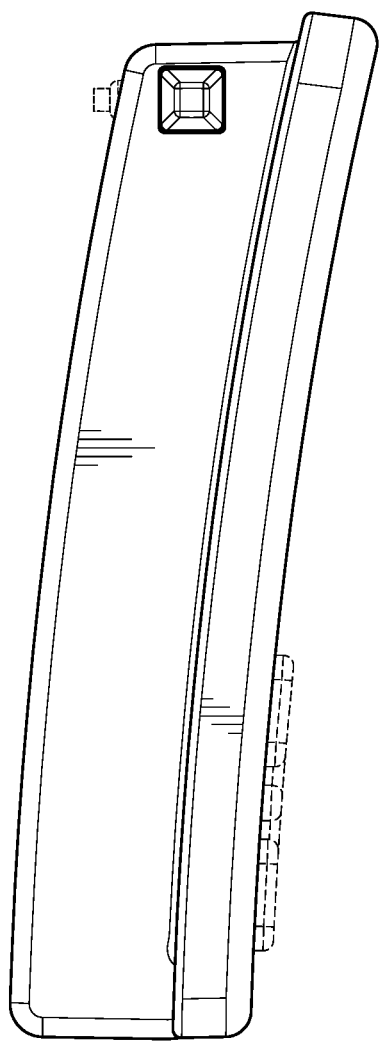
FIG. 73 is a side view of the facepack of FIG. 69.
Figure 74:
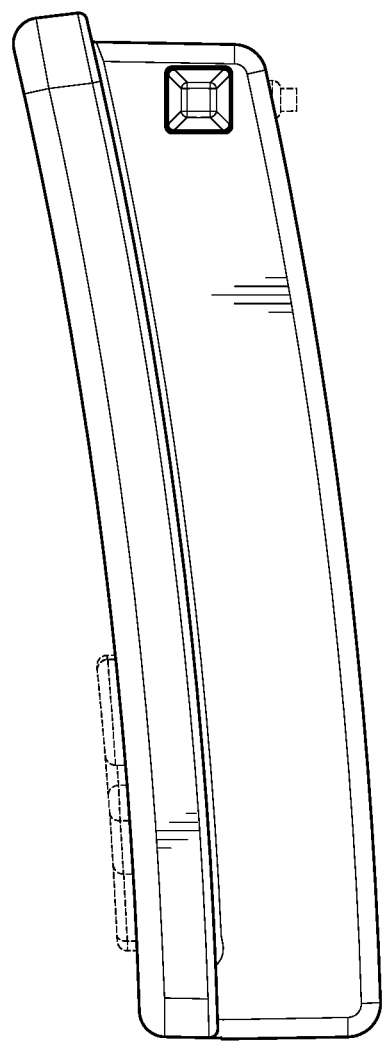
FIG. 74 is a side view of the facepack of FIG. 69 opposite the side view of FIG. 73.
Figure 75:
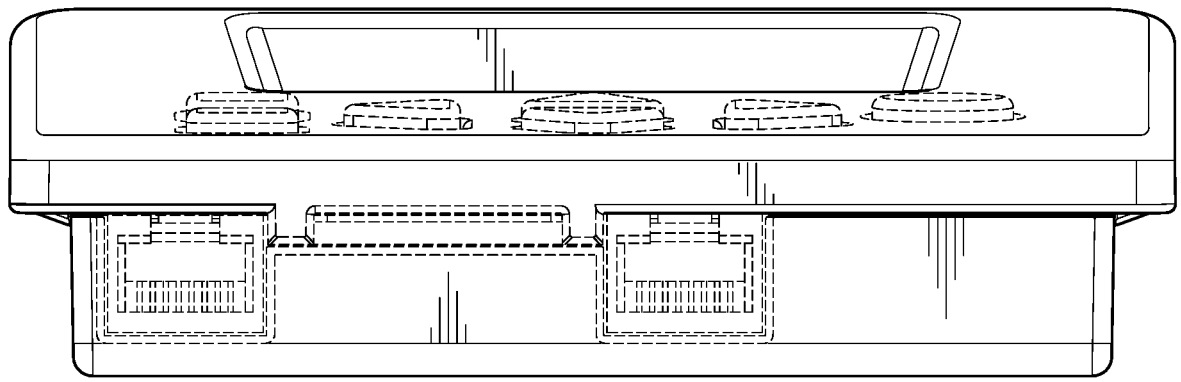
FIG. 75 is a front view of the facepack of FIG. 69.
Figure 76:
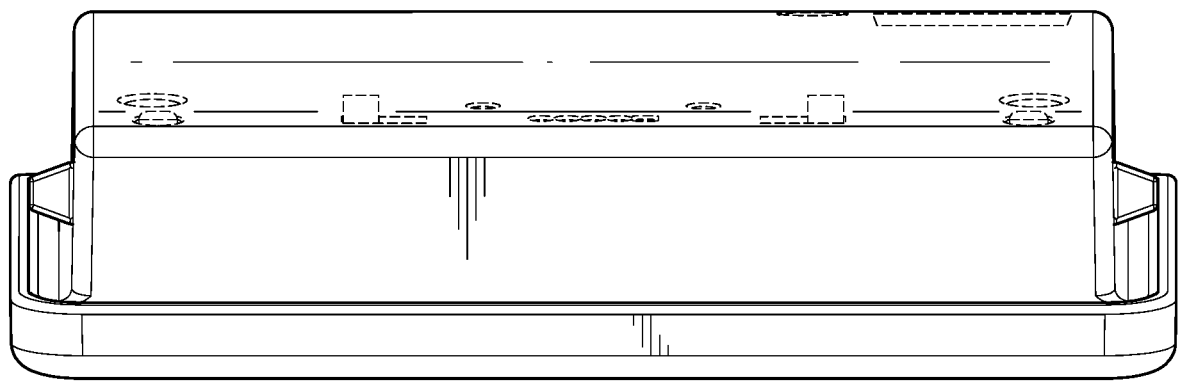
FIG. 76 is a back view of the facepack of FIG. 69.

As illustrated in FIGS. 27-29, rotation of the facepack 106 past the second stable position, with respect to the first stable position, can bring a portion of the first end 204 of the facepack housing 202 into contact with a lip 250 or other structure of the housing 102. In some embodiments, the first end 204 of the facepack housing 202 contacts the housing 202 when the facepack 106 is in the second stable position. Still further rotation of the facepack 106 after the first end 204 of the facepack housing 202 contacts the housing 102 can pull the mating tips 214 in a direction perpendicular to the axis of rotation of the hinge pins 212. Interaction between the edges 217/mating tip surfaces 215 and the tapered mating surfaces 238 can translate at least a portion of the pulling force applied to the mating tips 214 into a force parallel to the axis of rotation of the hinge pins 212 toward the facepack housing 202. Such force translation can transition the hinge pins 212 to the retracted position. Transition of the hinge pins 212 to the retracted position can facilitate removal of the hinge pins 212 from the flanges 234, as illustrated in FIG. 29. Additionally or alternatively, a user of the communications interface system 100 can transition one or more of the hinge pins 212 to the retracted position via applying force on the protrusions 220, as described above.

FIGS. 30-68 illustrate various embodiments of communications modules having various wired and/or wireless communications units among other differences. Various attributes of the communications modules are shown in broken lines to illustrate that they may or may not be present and that their position, orientation, shape, style, number, etc. can be different according to the different embodiments. For example, FIGS. 55-61 show a UHF module with a partially exposed radio in broken lines. The radio is shown in broken lines to indicate that the style of radio may differ. It will be understood that any number of different styles, sizes, etc. of radio can be received into the UHF module. As another example, FIGS. 62-68 show almost the entire communications module in broken lines. The protrusion, latch mechanism, and lever are shown in solid lines. It will be understood that any number of different communications modules, or other devices can be received into the housings 102 disclosed herein using these features. Thus, these features can be used on other devices with different shapes and purposes. At the same time, it will be understood that devices are not limited to the disclosed shapes and relationships to be able to connect to the housings 102 disclosed herein.

The terms "approximately", "about", "generally" and "substantially" as used herein represent an amount close to the stated amount that still performs a desired function or achieves a desired result. For example, the terms "approximately", "about", "generally," and "substantially" may refer to an amount that is within less than 10% of the stated amount.

Although these inventions have been disclosed in the context of certain preferred embodiments and examples, it will be understood by those skilled in the art that the present inventions extend beyond the specifically disclosed embodiments to other alternative embodiments and/or uses of the inventions and obvious modifications and equivalents thereof. In addition, while a number of variations of the inventions have been shown and described in detail, other modifications, which are within the scope of these inventions, will be readily apparent to those of skill in the art based upon this disclosure. For example, the housing 102 may not include a lid 110. In some such cases, the facepack 106 can cover all or most of the base 108 of the housing 102. In some cases, the cross-section of the mating tips 214 is symmetric about a centerline of the mating tips 214 and, in some cases, the cross-section of the mating tips 214 is asymmetric about the centerline of the mating tips 214.

In some embodiments, one or more of the communications modules 104 includes one or more hinge pins which are similar to or the same as the hinge pins 212 described above. For example, a communications module 104 can include a pair of hinge pins on opposite sides of the communications module 104 at or near the first end 128 of the module housing 126 and/or at or near the second end 130 of the module housing 126. The housing 102 and/or back plate 124 can include recesses similar or the same as the recesses 236 described above and configured to releasably receive the hinge pins of the communications module 104.

In some cases, one or more of the facepacks 106 includes a release system similar to or the same as the latch mechanism 136 described above. In some embodiments, one or more of the facepacks 106 includes a coupling indicator similar to or the same as the coupling indicator 180 described above. The coupling indicator of the facepack 106 can be configured to indicate electrical and/or mechanical coupling between the facepack 106 and the housing 102/back plate 124. In some cases, a coupling indicator as described above can be used with other removable modules in addition to or as an alternative to the facepack 106 and/or the communications module 104. In some embodiments, the facepack 106 includes a grounding rod and/or grounding plate (e.g., similar to or the same as the grounding plate 168 described above) configured to conductively mate with a grounding portion.

It is also contemplated that various combinations or sub-combinations of the specific features and aspects of the embodiments may be made and still fall within the scope of the inventions. Accordingly, it should be understood that various features and aspects of the disclosed embodiments can be combined with or substituted for one another in order to form varying modes of the disclosed inventions. Thus, it is intended that the scope of the present inventions herein disclosed should not be limited by the particular disclosed embodiments described above, but should be determined only by a fair reading of the claims that follow.

Similarly, this method of disclosure, is not to be interpreted as reflecting an intention that any claim require more features than are expressly recited in that claim. Rather, as the following claims reflect, inventive aspects lie in a combination of fewer than all features of any single foregoing disclosed embodiment. Thus, the claims following the Detailed Description are hereby expressly incorporated into this Detailed Description, with each claim standing on its own as a separate embodiment.

What is claimed is:

1. A landscape control system comprising:
   a housing;
   a removable module sized and shaped to be disposed in the housing, the removable module having a first end, a second end, a latch mechanism, and a grounding member, the latch mechanism being capable of transitioning between a locking configuration and a released configuration;
   a first retaining structure disposed in the housing and capable of releasably mating with the first end of the removable module;
   a second retaining structure disposed in the housing and spaced from the first retaining structure, the second retaining structure being capable of releasably mating with the latch mechanism after the first retaining structure is mated with the first end of the removable module; and
   a grounding rod positioned in the housing to contact the grounding member of the removable module at least when the first end of the removable module is mated with the first retaining structure of the housing.

2. The landscape control system of claim 1, wherein the removable module further comprises a release lever capable of transitioning the latch mechanism between the locking configuration and the released configuration.

3. The landscape control system of claim 2, wherein the release lever comprises a cam configured to transition the latch mechanism to the released configuration.

4. The landscape control system of claim 2, wherein rotation of the release lever moves the second end of the removable module away from the housing.

5. The landscape control system of claim 4, wherein the first end of the removable module is capable of staying mated with the first retaining structure when the release lever moves the second end of the removable module away from the housing.

6. The landscape control system of claim 1, wherein transitioning the latch mechanism to the released configuration when the latch mechanism is mated with the second retaining structure unmates the latch mechanism from the second retaining structure.

7. The landscape control system of claim 1, wherein at least a portion of the latch mechanism extends from a surface of the removable module when the latch mechanism is in the locking configuration.

8. The landscape control system of claim 1, further comprising an electrical connector in the housing and capable of releasably mating with an electrical connector on the removable module.

9. The landscape control system of claim 8, wherein the grounding rod is further positioned to contact the grounding member of the removable module at least when the first end of the removable module is mated with the first retaining structure of the housing and the electrical connector in the housing is unmated with the electrical connector on the removable module.

10. The landscape control system of claim 1, wherein the grounding rod is further positioned to contact the grounding member of the removable module at least when the first end of the removable module is mated with the first retaining structure of the housing and the latch mechanism of the removable module is unmated from the second retaining structure.

11. The landscape control system of claim 1, wherein the grounding member is a grounding plate.

12. The landscape control system of claim 1, wherein the removable module further comprises a circuit connected to the grounding member.

13. A landscape control system comprising:
   an outer housing;
   a backplate mounted to the outer housing;
   a removable module having:
      a housing having a first end and a second end;
      a latch mechanism, the latch mechanism being capable of transitioning between a locking configuration and a released configuration; and
      a grounding member;
   a first retaining structure disposed in the outer housing and capable of releasably mating with the first end of the removable module;
   a second retaining structure disposed in the outer housing and capable of releasably mating with the latch mechanism; and
   a grounding member positioned in the outer housing to contact the grounding member of the removable module at least when the first end of the housing is mated with the first retaining structure of the outer housing.

14. The landscape control system of claim 13, wherein the second retaining structure is capable of releasably mating with the latch mechanism after the first retaining structure is already mated with the first end of the housing.

15. The landscape control system of claim 13, wherein the removable module further comprises a release lever capable of transitioning the latch mechanism between the locking configuration and the released configuration.

16. The landscape control system of claim 15, wherein the release lever comprises a cam configured to transition the latch mechanism to the released configuration.

17. The landscape control system of claim 15, wherein rotation of the release lever moves the second end of the housing away from the outer housing.

18. The landscape control system of claim 17, wherein the first end of the housing is capable of staying mated with the first retaining structure when the release lever moves the second end of the housing away from the outer housing.

19. The landscape control system of claim 13, wherein the latch mechanism is biased to the locking configuration.

20. The landscape control system of claim 13, wherein transitioning the latch mechanism to the released configuration when the latch mechanism is mated with the second retaining structure unmates the latch mechanism from the second retaining structure.

21. The landscape control system of claim 13, wherein at least one of the first retaining structure and the second retaining structure comprises an aperture in the outer housing.

22. The landscape control system of claim 13, further comprising an electrical connector in the backplate and capable of releasably mating with an electrical connector on the removable module.

23. The landscape control system of claim 22, wherein the grounding member of the outer housing is further positioned to contact the grounding member of the removable module at least when the first end of the housing is mated with the first retaining structure of the outer housing and the electrical connector in the backplate is unmated with the electrical connector on the removable module.

24. The landscape control system of claim 13, wherein the grounding member of the outer housing is further positioned to contact the grounding member of the removable module at least when the first end of the housing is mated with the first retaining structure of the outer housing and the latch mechanism of the removable module is unmated from the second retaining structure.

25. The landscape control system of claim 13, wherein the housing further comprising a communication unit.

26. The landscape control system of claim 13, wherein the removable module is configured to send data.

27. The landscape control system of claim 13, wherein the removable module further comprises a circuit.

28. The landscape control system of claim 27, wherein the removable module further comprises a grounding plate connected to the circuit.

29. The landscape control system of claim 13, wherein the grounding member positioned in the outer housing is a grounding rod.

30. A landscape control system comprising:
- an outer housing;
- a module sized and shaped to be disposed in the outer housing, the module having a first end, a second end, a latch mechanism, and a grounding member, the latch mechanism being configured to transition between a locking configuration and a released configuration;
- a first retaining structure disposed in the outer housing and capable of releasably mating with the first end of the module when the module is in an intermediate coupling position;
- a second retaining structure spaced from the first retaining structure in the outer housing and capable of releasably mating with the latch mechanism when the module is rotated from the intermediate coupling position in a direction towards the outer housing; and
- a grounding member positioned in the outer housing to contact the grounding member of the module at least when the first end of the module is mated with the first retaining structure of the outer housing and the module is in the intermediate coupling position.

31. The landscape control system of claim 30, wherein the module further comprises a release lever capable of transitioning the latch mechanism between the locking configuration and the released configuration and moving the second end of the module away from the outer housing.

32. The landscape control system of claim 30, wherein the outer housing further comprises an electrical connector capable of releasably mating with an electrical connector on the module, and wherein the grounding member of the outer housing is spaced from the electrical connector of the outer housing and further positioned to contact the grounding member of the module at least when the first end of the module is mated with the first retaining structure of the outer housing and the latch mechanism of the module is unmated from the second retaining structure.

33. The landscape control system of claim 30, wherein the grounding member positioned in the outer housing is a grounding rod.

* * * * *